United States Patent
Pritisanac et al.

(10) Patent No.: US 10,866,295 B2
(45) Date of Patent: Dec. 15, 2020

(54) METHOD FOR PROCESSING NUCLEAR MAGNETIC RESONANCE (NMR) SPECTROSCOPIC DATA

(71) Applicant: Oxford University Innovation Limited, Oxford (GB)

(72) Inventors: Iva Pritisanac, Oxford (GB); Matteo Thomas Degiacomi, Oxford (GB); Andrew James Baldwin, Oxford (GB)

(73) Assignee: Oxford University Innovation Limited, Oxford (GB)

( * ) Notice: Subject to any disclaimer, the term of this patent is extended or adjusted under 35 U.S.C. 154(b) by 23 days.

(21) Appl. No.: 16/302,838

(22) PCT Filed: May 17, 2017

(86) PCT No.: PCT/GB2017/051381
§ 371 (c)(1),
(2) Date: Nov. 19, 2018

(87) PCT Pub. No.: WO2017/199030
PCT Pub. Date: Nov. 23, 2017

(65) Prior Publication Data
US 2020/0124689 A1    Apr. 23, 2020

(30) Foreign Application Priority Data

May 20, 2016    (GB) .................................. 1608969.0

(51) Int. Cl.
*G01R 33/46*    (2006.01)
*G01N 24/08*    (2006.01)

(52) U.S. Cl.
CPC ....... *G01R 33/4625* (2013.01); *G01N 24/087* (2013.01); *G01R 33/4608* (2013.01)

(58) Field of Classification Search
CPC ............ G01R 33/4625; G01R 33/4608; G01N 24/087
See application file for complete search history.

(56) References Cited

U.S. PATENT DOCUMENTS

| | | | |
|---|---|---|---|
| 6,133,736 A | 10/2000 | Pervushin et al. | |
| 2004/0082075 A1 | 4/2004 | Powers | |
| 2019/0391093 A1* | 12/2019 | Achlioptas | ........... G01N 24/087 |

OTHER PUBLICATIONS

Kuhn, Harold W., "Chapter 2—The Hungarian Method for the Assignment Problem", 50 Years of Integer Programming, M. Junger et al., 1958-2008, Springer-Verlag Berlin Heidelberg, 2010, pp. 29-47.

McGregor, James J., "Backtrack Search Algorithms and the Maximal Common Subgraph Problem", Software-Practice and Experience, vol. 12, 1982, pp. 23-34.

(Continued)

*Primary Examiner* — Rishi R Patel
(74) *Attorney, Agent, or Firm* — McDonnell Boehnen Hulbert & Berghoff LLP

(57) ABSTRACT

The invention provides methods for processing nuclear magnetic resonance (NMR) spectroscopic data to assign resonance peaks in an NMR spectrum of a molecule to atomic nuclei in said molecule, based on graph-theoretical principles. In particular, the methods of the invention may be employed in the assignment of data obtained from methyl-TROSY spectroscopy of proteins.

31 Claims, 16 Drawing Sheets

(56) References Cited

OTHER PUBLICATIONS

Cordella, Luigi P. et al., "A (Sub)Graph Isomorphism Algorithm for Matching Large Graphs", IEEE Transactions on Pattern Analysis and Machine Intelligence, vol. 26, No. 10, Oct. 2004, pp. 1367-1372.
Great Britain Search Report, Great Britain Application No. GB1608969.0, dated Nov. 4, 2016, 4 pages.
Hsu, Cheng-Hsien et al., "An Improved Algorithm for Protein Structural Comparison Based on Graph Theoretical Approach", Chaing Mai J. Sci., vol. 38, 2011, pp. 71-81.
PCT Search Report and Written Opinion, PCT International Application No. PCT/GB2017/051381, dated Aug. 2, 2017, 14 pages.
Pritisanac, Iva et al., "Automatic Assignment of Methyl-NMR Spectra of Supramolecular Machines Using Graph Theory", Journal of the America Chemical Society, vol. 139, 2017, pp. 9523-9533.
Van Geerestein-Ujah, Elizabeth C. et al, "Use of Graph Theory for Secondary Structure Recognition and Sequential Assignment in Heteronuclear (13C, 15N), NMR Spectra: Application to HU Protein from Bacillus Stearothermophilus", Biopolymers, vol. 39, No. 5, Nov. 1996, pp. 691-707.
Kanelis, Voula et al., "Multidimensional NMR Methods for Protein Structure Determination", Life, vol. 52, 2001, pp. 291-302.
Kamisetty, Hetunandan et al., "An Efficient Randomized Algorithm for Contact-Based NMR Backbone Resonance Assignment", Bioinformatics, vol. 22, No. 2, 2006, pp. 172-180.
Xiong, Fei et al., "Contact Replacement for NMR Resonance Assignment", Bioinformatics, vol. 24, 2008, pp. i205-i213.
Carletti, Vincenzo et al. "Graph-Based Representations in Pattern Recognition", Springer (2015), ISBN 978-3-319-18224-7 at pp. 168-177.
Chao, Fa-An et al. "FLAMEnG0 2.0: An Enhanced Fuzzy Logic Algorithm for Structure-Based Assignment of Methyl Group Resonances" Journal of Magnetic Resonance (2014); doi: http://dx.doi.org/10.1016/j.jmr.2014.04.012.
Cordella, Luigi P. et al. "A (Sub)Graph Isomorphism Algorithm for Matching Large Graphs" IEEE Transactions on Pattern Analysis and Machine Intelligence (2004) vol. 26(10), pp. 1367-1372.
Xu, Yingqi et al. "MAP-XSII: an improved program for the automatic assignment of methyl resonances in large proteins" J Biomol NMR (2013) vol. 55, pp. 179-187.
McGregor, James J. "Backtrack Search Algorithms and the Maximal Common Subgraph Problem" Software-Practice and Experience (1982) vol. 12, pp. 23-34.
Kuhn, Harold W. "The Hungarian Method for the Assignment Problem", Chapter 2 of 50 years of Integer Programming 1958-2008, Springer-Verlag, Berlin/Heidelberg, 2010, eds. M Jünger et al, pp. 83-97.

* cited by examiner

METHOD FOR PROCESSING NUCLEAR MAGNETIC RESONANCE (NMR) SPECTROSCOPIC DATA

CROSS REFERENCE TO RELATED APPLICATIONS

The present application claims priority as a U.S. national stage entry of PCT application serial no. PCT/GB2017/051381, filed 17 May 2017, which claims priority to UK patent application serial no. GB 1608969.0 filed 20 May 2016. The full disclosures of PCT/GB2017/051381 and GB 1608969.0 are incorporated herein by reference.

BACKGROUND

There is a need, particularly in the pharmaceutical and agrochemical industries, to know about the structure and function of biomolecules such as proteins. Particularly in the case of drug design, it is highly desirable to know whereabouts the drug binds to the biomolecule. This information is also highly valuable, for example, for the design of new drugs. For many proteins, a desirable method to obtain this information is to use nuclear magnetic resonance (NMR) spectroscopy techniques. NMR spectroscopy allows determination of which atoms are present in a molecule and how they are assembled together into an overall molecular structure. NMR measurements are typically performed on molecules which are in solution. This means that the conditions of measurement are a better approximation of conditions inside a biological cell than other experimental techniques, such as X-ray crystallography measurements, where measurement is performed on a biomolecule in the solid state. Consequently, if the structure of a biomolecule can be determined from an NMR measurement, this is likely to give a more accurate impression of the structure which the molecule will adopt in vivo compared to a solid-state structure. Because NMR is carried out in solution, it also allows measurement of dynamic features such as protein folding and denaturation and allows the study of transient structures such as folding intermediates, transition states and conformational changes.

In an NMR experiment, a spectrum is obtained showing features called "peaks" which are signals originating from individual atoms within the molecule under study and from interactions between those atoms. Initially, it is not known which features in the spectrum related to which specific parts of the structure in the molecule. There is a need to "assign" the spectral features, i.e. to relate individual spectral features to specific atoms and interactions. This allows the structure of the molecule to be understood and therefore allows further analysis to be carried out, such as determining drug binding sites.

Studying large biomolecules using NMR, and correctly assigning the spectral features, poses an immense challenge. The large numbers of atoms in a biomolecule give rise to a vast number of spectral features. The larger the molecule, the more features are likely to arise and therefore assigning spectral features becomes extremely time-consuming and laborious, while the ability to assign any given spectral feature confidently can also decrease (i.e. if there are multiple possible explanations for any given peak). Typically, NMR can only therefore be used to determine the structures of relatively small biomolecules and proteins (those smaller than approximately 30 kDa).

In order to try and improve the applicability to NMR to biomolecular structural determination, including for larger proteins, various methods have been developed. One popular method known as "divide and conquer" involves fragmenting a large protein into smaller fragments and measuring the structures of these individually to try to build up a picture of the whole protein. Another method involves targeted site-directed mutagenesis (SDM), in which variants of a protein are created that are slightly altered in their chemical composition and the spectra of the different variants are compared to see if changes in the spectral features occur between different variants, which helps to explain the origin of various peaks. However, such methods are still extremely laborious and expensive as they require extensive lab work and extensive data processing and analysis. In addition, fragments of proteins, or mutant versions of proteins, often have very different structures to the original whole protein and therefore the information obtained via such methods may not necessarily reflect the true structure of the protein.

Algorithmic methods have more recently been developed, such as "FLAMEnGO2.0" and MAP-XSII, which are described in further detail below. Such methods are aimed at automating the assignment of protein NMR peaks where the data has been obtained from large proteins. However, such methods suffer from a number of shortcomings. The "search space"—i.e. the number of possible assignments that have to be investigated to see how well they create a "fit" between the data and a plausible structure—is very high and therefore a number of approximations and short-cuts are typically built into these algorithms in order to make the data manageable. However, this has the drawback that the resulting assignments may in fact be suboptimal or erroneous, as explained in more detail below.

It is therefore desirable to find a method of assigning NMR peaks which provides a robust analysis of NMR data even from large proteins, without the need for extensive laboratory experimentation or creation of fragments/mutants, and which will indicate any potential ambiguities or uncertainties in the peak assignments so that it can be known whether or not the assignment produced is the optimal assignment and so that any further experimental work can be precisely targeted. The present invention provides such a method, which is widely applicable. As will become apparent from the detailed discussion and the illustrative Examples herein, the methods of the invention are widely applicable and have been demonstrated to work with high accuracy on a range of proteins. Methods according to the invention have moreover been employed to determine structures of drug bound forms of a protein, demonstrating their utility in practice.

Two-dimensional (2D), three-dimensional (3D) and four-dimensional (4D) nuclear magnetic resonance (NMR) techniques, and their 2D, 3D and 4D electron paramagnetic resonance (EPR, or equivalently electron spin resonance (ESR)) equivalents, are powerful tools for studying the structures of macromolecules such as proteins. Solution-state magnetic resonance is the only experimental method capable of simultaneously probing both the structure and dynamics of biomolecules at atomic resolution. For example, by studying changes in the NMR or EPR spectrum of a biomolecule in the presence of a ligand it is in principle possible to identify whether the biomolecule binds to the ligand and to identify the binding site (e.g. an active site) and/or conformational changes in the biomolecule induced by the presence of the ligand. Both solution-state and solid-state NMR can also be employed to study protein folding, denaturation, folding intermediates and transition states, or other characteristics of the conformational and dynamic behaviour of a biomolecule.

Multidimensional solution-state NMR techniques have previously been employed successfully to study small proteins up to approximately 30 kDa in molecular weight, which comprises ca. 30% of the human genome. The vast majority of human protein targets are far in excess of this threshold, as are the majority of the functionally relevant higher order assemblies, that cannot be studied using conventional NMR methodology. This is due to the fast decay of coherences due to rapid spin relaxation and limited resolution caused by overlapping resonances in crowded NMR spectra of large systems. These limitations have been removed through the combination of advanced nuclear spin labelling strategies and optimised pulse sequences. Of particular note, NMR studies using $^{13}$C-labelled methyl groups ($^{13}$CH$_3$) in the side chains of otherwise deuterated proteins now allow for routine and detailed structural and dynamic studies of protein complexes up to 1 MDa in molecular weight using methyl-TROSY (Methyl Transverse Relaxation Optimised Spectroscopy) protocols. A two-spin TROSY pulse sequence is described in U.S. Pat. No. 6,133,736 to Pervushin et al. Such pulse sequences are traditionally used for the study of $^{15}$N/$^{1}$H systems and (despite the similarity in nomenclature) should not be confused with methyl-TROSY pulse sequences such as those referred to herein, which relate to four-spin systems and are based on the HMQC pulse sequence.

A particular challenge in any multidimensional magnetic resonance technique is to relate the observed spectral peaks, and in particular, cross-peaks, to specific loci within the molecule (for example, in methyl-TROSY techniques, linking specific $^{1}$H-$^{13}$C coherences in a heteronuclear multiple quantum coherence (HMQC) spectrum to specific methyl groups within the molecule). This is known as spectral (or resonance) assignment and is a prerequisite for interpretation of NMR data in functional studies. For smaller proteins of molecular weight about 40-50 kDa and below, backbone and aliphatic resonances (such as $^{13}$C resonances) are assigned using approaches that correlate the backbone and side-chain peak positions. However, the spectral linewidths of non-methyl side-chain nuclei and backbone nuclei become increasingly broad in high molecular weight molecules (above about 50 kDa), for which these correlation methods have limited applicability, and significant spectral overlap can also be seen in some smaller proteins (even below 40 kDa) if the dispersion of resonances is narrow, i.e. if their chemical shift values are close together. Therefore, spectral peaks in such biomolecules are usually assigned either by transferring the assignments obtained from smaller protein fragments to spectra of the intact protein an approach known as 'divide and conquer', or by monitoring spectral changes after targeted site-directed mutagenesis (SDM), in which specific sites such as particular amino acid residues are selectively altered. Both the "divide and conquer" approach and the SDM approach are laborious, time consuming and expensive, requiring extensive lab work to create useful fragments or mutants, requiring expensive isotopic labelling of those fragments or mutants, requiring a number of multidimensional NMR spectra to be acquired (usually at least 4 and typically 6-8, which is slow), and requiring extensive data processing and analysis to be carried out on the spectra of such fragments or mutants, which may be radically different to the spectrum of the unaltered molecule. Moreover, they require that the isolated domains or introduced mutations do not lead to major structural rearrangements, such that assignments acquired from divide and conquer or SDM can faithfully be transferred to the intact protein. These factors pose major obstacles to the wider adoption and user-friendliness of multidimensional magnetic resonance techniques such as methyl-TROSY.

As an alternative assignment method, a high-resolution crystal structure of the protein under study can be combined with NMR distance restraints, such as nuclear Overhauser effects (NOEs) (e.g. inter-methyl NOEs) and/or paramagnetic relaxation enhancements (PREs) for solution state NMR or dipolar correlations detected using solid-state NMR, to automate the assignment of resonances in large systems. However, the structure of a biomolecule in solution normally differs from any crystal structure which has been determined by solid-state X-ray crystallography. Moreover, a molecule in solution is mobile, with molecular conformations and interatomic distances constantly fluctuating and with the molecule tumbling in the solvent. The NMR spectrum may therefore be inconsistent with expectations from a crystal structure that reflects the structure of the molecule in a solid phase. Prediction of the observed resonance frequency positions or chemical shifts based upon knowledge of a crystal structure alone is highly approximate and error-prone at present. Assignment of experimental protein NMR data on the basis of an experimental crystal structure is thus an extremely challenging, and hitherto unsolved, problem.

Automating the assignment of protein backbone resonances in biomolecular NMR has been explored for decades, and these efforts have resulted in numerous automated backbone assignment protocols. In contrast, few automated assignment methods exist for side-chain resonances. For example, for the assignment of methyl-TROSY spectra, only two dedicated structure-based methods currently exist (FLAMEnGO2.0 (as described in Chao et al., Journal of Magnetic Resonance, 2014, vol. 245, pp. 17-23) and MAP-XSII (as described in Xu et al., J. Biomol. NMR, 2013, vol. 55(2), pp. 179-187)). Both of these methods link experimentally determined NOEs, as well as other NMR restraints, to a reference structure. The challenge for these structure-based approaches is the high-dimensionality of assignment search space, which they address by using approximate Metropolis Monte Carlo optimization algorithms. The optimization of such methods includes a continuous scoring function containing a number of terms that require optimal weights. As such, these approaches cannot guarantee finding a true (global) optimum of the matching (assignment) problem. Even if they could, the approximate score would not necessarily be accurate, and so both methods (FLAMEnGO and MAP-XSII) result in erroneous assignments, which can prevent users from drawing confident biochemical conclusions from their results.

The present inventors have now found that methods as described herein, based on graph-matching algorithms, are capable of combining structural models and experimental multidimensional magnetic resonance data to accurately identify confident peak assignments (those where a single best option exists for assignment of a particular resonance) as well as ambiguous peak assignments (those where two or more options of equal plausibility exist for a particular resonance). The methods describe herein compare a structural model with experimentally-derived distance restraints, which is fundamentally different from typical approaches such as those described above which rely on the approximate optimisation of a parameterised continuous scoring function. Instead, the methods of the invention provide the user with the exact set of solutions that contain both confident and ambiguous assignments where there are multiple ways to interpret the experimental data.

A method according to the invention has been tested against an extensive benchmark of 8 NMR datasets with known, cross-validated methyl assignments. In this test, the method according to the invention confidently assigned as many as 95% of resonances with provided 100% accuracy. The methods of the invention therefore remove a significant obstacle to the assignment of multidimensional magnetic resonance spectral data as well as reducing or eliminating entirely the need to carry out expensive, laborious and time-consuming studies with "divide and conquer" or SDM techniques. The methods of the invention provide a remarkable increase in accuracy relative to other peak assignment techniques which are in common use, which is highly desirable.

The present invention provides methods for processing NMR spectroscopic data which are able to robustly analyse data despite experimental artefacts, incomplete detection of resonances (e.g. due to relaxation/line-broadening phenomena or weak-intensity peaks), the presence of impurities, and other sources of error. The methods described herein can effectively strip out all of these sources of error where other known peak-assignment algorithms may be misled to an incorrect conclusion. Further, the present invention provides the complete set of all plausible "best" assignments of data (in terms of explaining the maximum number of inter-residue correlations obtained from either solution or solid state NMR measurements in the context of the available structure).

When given a list of experimental through-space proximity correlations and a structural model, the methods of the invention will provide an exact answer to peak assignment (e.g. methyl assignment, if the through-space proximity correlations are inter-methyl correlations such as those obtained from solution-state NMR measurements of nuclear Overhauser interactions (NOEs) between methyl groups) and require no additional user specified parameters. The exactness of the method and the correctness of the generated assignments allow the methods of the invention to remove a significant bottleneck for the routine application NMR experiments such as methyl-TROSY experiments in the study of high molecular weight molecular machines.

In practice, it cannot be known a priori which through-space proximity correlations will be present or absent in a dataset of a given protein. In the case of solution-state NOE measurements (such as measurement of inter-methyl NOEs), larger molecules and slower tumbling will lead to an increase in cross relaxation rates and enhanced NOEs. However, reduced signal to noise, spin diffusion, chemical exchange and, in some cases, different local mobility in different parts of the molecule could all reduce the expected NOE intensity, thereby ultimately preventing otherwise expected NOEs from being observed. These features pose challenges to any method reliant on NOE restraints to automatically assign methyl-TROSY spectra. To address these challenges, the methods of the invention use graph theory to interpret experimental through-space proximity correlation measurements in the context of an available protein structure. From a graph theory point of view, if the available protein structure is representative of protein in solution and the distance threshold for the observation was correctly determined, a comparison of the sparse magnetic resonance data graph (whose vertices are the observed resonance and edges the experimental through-space proximity correlations) to the structure graph (whose vertices are atomic co-ordinates and the edges are distances below a threshold) can be solved by determining all possible maximum common edge subgraphs (MCES). This provides a set of exact assignments that explain all through-space proximity correlations. This result will comprise both 'confident' assignments where there is only one possible option, and 'ambiguous' assignments, where the observed resonance is restrained to be one of a set, reflecting the incomplete nature of the experimental data supplied to the algorithm. Solving for all maximal common edge subgraphs will result in a set of assignment solutions that all maximize the NOE restraints, but do not explain all of the NOEs. Due to the problem of potential errors in data, it is in most cases not advisable to force all NOEs to be assigned.

For illustrative purposes, the techniques described herein are explained with particular reference to solution-state NMR but are also in principle applicable to solid-state NMR techniques, as illustrated in certain of the Examples. Although the methods described herein are explained for illustrative purposes with particular reference to $^{13}C$-$^{1}H$ J-coupling interactions and $^{1}H$-$^{1}H$ nuclear Overhauser effect interactions, and particularly with regard to the Methyl-TROSY technique, the methods of the invention are also in principle applicable to other NMR techniques and/or NMR techniques involving other NMR-active nuclei that possess a non-zero spin, provided that these techniques involve the use of through-space proximity correlation data, (inter-residue interactions). Thus, the methods of the invention are in principle applicable wherever NMR data containing experimentally-derived distance restraints can be compared with a structural model, as the underlying mathematical theory is in principle applicable regardless of the precise experimental origin of such data. Applications of particular interest include NMR data containing correlations arising from $^{13}C$-$^{13}C$ NOEs detected in the solution-state or methyl-amide correlations detected using recoupled experiments such as Dipolar Recoupled Enhanced Amplitude Modulated (DREAM) experiments performed using solid-state NMR.

Definitions

The present invention employs a graph-theoretical approach to the assignment problem. The following definitions are therefore employed throughout the embodiments of the invention described herein.

In mathematical terms, a graph is an ordered pair, $G=(V, E)$, which consists of two finite sets: the set V which has elements called vertices (also called "nodes" in some literature), and the set E with elements called edges (also called "arcs" or "lines" in some literature). As used herein, the terms "vertex" and "node" are employed interchangeably and with the same meaning as one another. As used herein, the terms "edge" and "arc" are also employed interchangeably and with the same meaning as one another.

In the methods described herein, a set of two vertices is associated to each edge and so the vertices are endpoints of an edge.

Two vertices with a common edge are defined as being "adjacent". Similarly, two edges with a common vertex are also defined as being "adjacent". The adjacency relationships in a graph are defined by an incidence function, $\psi_G$ that, in the case of an undirected graph (a graph with no direction on its edges), associates an unordered pair of vertices with each edge. Adjacency relations of vertices of a simple graph G are usually presented in an adjacency matrix $A_G$. The adjacency matrix is defined as the symmetric matrix with the identical indexed ordering of V in rows and columns, such that $$A_G[u, v] = \begin{cases} 1 & \text{if } u \text{ and } v \text{ are adjacent} \\ 0 & \text{otherwise} \end{cases}, \text{ where } (u, v) \in V$$

The adjacency matrix is a convenient representation of a graph for computational analysis.

All graphs employed in the methods described herein are "simple graphs". Simple graphs contain neither self-loops (an edge that has a single endpoint) nor multi-edges (a collection of two or more edges with the same endpoints).

For the methods of the invention, a graph may therefore be defined as G=(V, E), where V is the finite set of vertices; and E⊆V×V is the finite set of edges.

In some preferred embodiments of the invention, the computational search space is reduced by labelling certain vertices (for example, to identify different amino acid residue types in a protein by assigning a different label to each type of residue). In such embodiments, a graph may therefore be completely defined as $G=(V,E,\alpha)$, where V is the finite set of vertices;

E⊆V×V, is the finite set of edges; and

α: V→L is a function assigning labels to the vertices (a "labelling function"). The elements of the set L are the types of label, for example isotopically labelled residue types in a protein (e.g. $^{13}C$-labelled methyl side chains in alanine, valine, leucine and/or isoleucine residues).

For simple graphs, graph density (the ratio of the number of edges to the total possible) is defined as:

$$\eta = \frac{2 \times N(E)}{N(V)(N(V) - 1)}$$

where N(E) is the total number of edges of the graph and N(V) is the total number of vertices. If for any given graph η<<1, it is considered sparse, whereas if η~1, it is considered dense.

Given two simple graphs $G_1$ and $G_2$, graph isomorphism from $G_1$ to $G_2$ (which is denoted $G_1 \cong G_2$), exists if there exists a structure preserving bijection from a vertex set of $G_1$ to a vertex set of $G_2$, f: $V(G_1) \rightarrow V(G_2)$. That is, two isomorphic graphs have the same number of edges and vertices and the same adjacency structure.

A subgraph of a graph G is defined as a graph H that has a vertex set V(H), which is a subset of the vertex set of G, and an edge set E(H), which is a subset of the edge set of G with adjacency relationships preserved (as in G).

$H \subseteq G$ if $V(H) \subseteq V(G)$,

E (H)⊆E(G), with $\psi_H$ restriction of $\psi_G$ to E(H).

Given two simple graphs $G_1$ and $G_2$, subgraph isomorphism from $G_1$ to $G_2$ exists if there exists a subgraph H of $G_2$, $H \subseteq G_2$, such that H In other words, subgraph isomorphism exists if $G_1$ can be "found within" $G_2$. Subgraph isomorphism is not necessarily unique. This means that there can exist more than one subgraph of $G_2$ which is each isomorphic with $G_1$.

A common subgraph of two graphs $G_1$ and $G_2$ can be defined as a graph G=(V, E) (or, in cases where a function α as described above is employed, G=(V, E, α)), such that there exists a subgraph isomorphism from G to $G_1$ and from G to $G_2$. That is, there exists at least one subgraph of $G_1$ and at least one subgraph of $G_2$ that are both isomorphic to G, and hence also to one another.

A maximal common edge subgraph (MCES) of two graphs $G_1$ and $G_2$ can be defined as a graph G=(V, E) (or, in cases where a function α as described above is employed, G=(V, E, α)), which is a common subgraph having as many edges as possible while being subgraph isomorphic to both $G_1$ and $G_2$ such that there exists a subgraph isomorphism from G to $G_1$ and from G to $G_2$. That is, there exists no other common subgraph that has more edges. Intuitively, the maximum common edge subgraph of two simple graphs can be seen as their largest overlap in vertices and edges.

The maximal common edge subgraph (MCES), as defined by McGregor (*Software—Practice and Experience*, Vol. 12, pp. 23-34 (1982), the entire contents of which are incorporated herein by reference), is a common subgraph of two graphs that contains the largest possible number of edges. That definition is adopted herein. If the subgraph also contains the largest number of vertices, then it is also a maximum common subgraph. In the methods of the invention, we search for the maximal common edge subgraphs from a set of maximum common subgraphs. The terms "maximum common subgraph" and "maximal common edge subgraph" may therefore be employed interchangeably in the methods of the present invention. This should not be confused with other situations which may arise in other situations in graph theory where the maximal common edge subgraph is not necessarily the maximum common subgraph with regard to vertices.

As with any kind of subgraph isomorphism, a MCES of two graphs is not necessarily unique. Therefore there can exist a number of maximal edge common subgraphs (MCES) for any given two graphs. That is, there can exist two or more common subgraphs which are each maximal in terms of edges, i.e. each such subgraph is a MCES but the two or more MCES's are not identical to one another.

A complete set of common subgraphs of two graphs $G_1$ and $G_2$ will comprise the MCES (or more than one MCES if this is possible). In the methods of the invention we seek the complete set of graphs that comprise MCES for assignment purposes.

DESCRIPTION OF THE INVENTION

In a first aspect the present invention provides a method for processing nuclear magnetic resonance (NMR) spectroscopic data to assign resonance peaks in an NMR spectrum of a molecule to atomic nuclei in said molecule, comprising:

(i) providing a nuclear magnetic resonance dataset $D_1$ comprising a first set of data points ij representing resonance peaks arising from heteronuclear J-couplings between nuclei i and nuclei j, and a second set of data points jj representing through-space proximity correlations between individual nuclei j associated with the first set of data points ij;

(ii) providing a molecular structure dataset $D_2$ comprising data points representing a three-dimensional spatial arrangement of atoms in the molecule;

(iii) defining a magnetic resonance data graph $G_1=(V_1, E_1)$ and a structure graph $G_2=(V_2, E_2)$ wherein:

the set of vertices $V_1$ of $G_1$ comprises individual vertices $V_1^{ij}$ such that each individual vertex $V_1^{ij}$ represents an individual data point ij selected from the first set of data points;

the set of edges $E_1$ of $G_1$ comprises individual edges $E_1^{ij}$ such that each individual edge $E_1^{ij}$ represents a data point jj selected from the second set of data points and wherein each individual edge $E_1^{ij}$ connects two individual vertices $V_1^{ij}$ if nuclei j associated with the data points represented by those two vertices interact via a through-space proximity correlation;

the set of vertices $V_2$ of $G_2$ comprises individual vertices $V_2^i$ such that each individual vertex $V_2^i$ represents an atom in the molecular structure represented by dataset $D_2$, said atom having a nucleus i and said being bound to at least one atom having a nucleus j;

the set of edges $E_2$ of $G_2$ comprises individual edges $E_2^{ii}$ such that each individual edge $E_2^{ii}$ connects two individual vertices $V_2^i$ to one another if the atoms represented by said vertices are within a predetermined distance r relative to one another in the molecular structure represented by dataset $D_2$;

(iv) optionally comparing $G_1$ and $G_2$ to identify subgraph isomorphism from $G_1$ to $G_2$ and generating all possible mappings of edges $E_1^{ij}$/to edges $E_2^{ii}$ and of vertices $V_1^{ij}$ to vertices $V_2^i$ which are consistent with said subgraph isomorphism;

(v) comparing $G_1$ and $G_2$ to identify at least one maximal common edge subgraph (MCES);

(vi) generating all possible mappings of edges $E_1^{ij}$/to edges $E_2^{ii}$ and of vertices $V_1^{ij}$ to vertices $V_2^i$ which are consistent with said at least one MCES;

(vii) for each possible mapping of a vertex $V_1^{ij}$ to a vertex $V_2^{ii}$ obtained in steps (iv) and (vi), generating a peak assignment, wherein generating said peak assignment comprises attributing a resonance represented by said vertex $V_1^{ij}$ to an atom having a nucleus i which is represented by said vertex $V_2^i$;

(viii) generating an output comprising all possible assignments from step (vii) of resonance peaks in the NMR spectrum to atomic nuclei in the molecule.

The through-space proximity correlation may originate in any suitable through-space interaction between nuclei j which gives rise to a detectable influence on the NMR spectrum, such as a paramagnetic relaxation enhancement (PRE) or dipole-dipole interaction, e.g. an interaction giving rise to a nuclear Overhauser effect.

In particularly preferred embodiments of the methods of the invention, the through-space proximity correlations are nuclear Overhauser effect (NOE) interactions and therefore the present invention provides a method for processing NMR spectroscopic data to assign resonance peaks in a nuclear magnetic resonance (NMR) spectrum of a molecule to atomic nuclei in said molecule, comprising:

(i) providing a nuclear magnetic resonance dataset $D_1$ comprising a first set of data points ij representing resonance peaks arising from heteronuclear J-couplings between nuclei i and nuclei j, and a second set of data points jj representing homonuclear nuclear Overhauser effect (NOE) interactions between individual nuclei j associated with the first set of data points ij;

(ii) providing a molecular structure dataset $D_2$ comprising data points representing a three-dimensional spatial arrangement of atoms in the molecule;

(iii) defining a magnetic resonance data graph $G_1=(V_1, E_1)$ and a structure graph $G_2=(V_2, E_2)$ wherein:

the set of vertices $V_1$ of $G_1$ comprises individual vertices $V_1^{ij}$ such that each individual vertex $V_1^{ij}$ represents an individual data point ij selected from the first set of data points;

the set of edges $E_1$ of $G_1$ comprises individual edges $E_1^{jj}$ such that each individual edge $E_1^{jj}$ represents a data point jj selected from the second set of data points and wherein each individual edge $E_1^{jj}$ connects two individual vertices $V_1^{ij}$ if nuclei j associated with the data points represented by those two vertices interact via an NOE;

the set of vertices $V_2$ of $G_2$ comprises individual vertices $V_2^i$ such that each individual vertex $V_2^i$ represents an atom in the molecular structure represented by dataset $D_2$, said atom having a nucleus i and said being bound to at least one atom having a nucleus j;

the set of edges $E_2$ of $G_2$ comprises individual edges $E_2^{ii}$ such that each individual edge $E_2^{ii}$ connects two individual vertices $V_2^i$ to one another if the atoms represented by said vertices are within a predetermined distance r relative to one another in the molecular structure represented by dataset $D_2$;

(iv) optionally, comparing $G_1$ and $G_2$ to identify subgraph isomorphism from $G_1$ to $G_2$ and generating all possible mappings of edges $E_1^{jj}$ to edges $E_2^{ii}$ and of vertices $V_1^{ij}$ to vertices $V_2^i$ which are consistent with said subgraph isomorphism;

(v) comparing $G_1$ and $G_2$ to identify at least one maximal common edge subgraph (MCES);

(vi) generating all possible mappings of edges $E_1^{jj}$ to edges $E_2^{ii}$ and of vertices $V_1^{ij}$ to vertices $V_2^i$ which are consistent with said at least one MCES;

(vii) for each possible mapping of a vertex $V_1^{ij}$ to a vertex $V_2^{ii}$ obtained in steps (iv) and (vi), generating a peak assignment, wherein generating said peak assignment comprises attributing a resonance represented by said vertex $V_1^{ij}$ to an atom having a nucleus i which is represented by said vertex $V_2^i$;

(viii) generating an output comprising all possible assignments from step (vii) of resonance peaks in the NMR spectrum to atomic nuclei in the molecule.

Providing the nuclear magnetic resonance dataset $D_1$ may be achieved by obtaining from a source a magnetic resonance dataset $D_1$. With reference to the non-limiting illustration in FIG. 2, obtaining a nuclear magnetic resonance dataset $D_1$ is illustrated at step 201.

The magnetic resonance dataset $D_1$ may be obtained specifically for the purposes of spectral assignment, and therefore in one embodiment the method of the invention comprises a preliminary step of performing, prior to step (i), a magnetic resonance experiment to obtain nuclear magnetic resonance dataset $D_1$. In an embodiment the magnetic resonance experiment may comprise performing a combination of a HMQC experiment (preferably a $^{13}$C-$^1$H HMQC experiment) to generate the first set of datapoints ij and a NOESY experiment (preferably a $^1$H-$^1$H NOESY experiment) to generate the second set of datapoints jj. Alternatively, the method of the invention may be employed in the analysis of previously-acquired spectra, for example magnetic resonance spectra for which no assignment has previously been made or even for magnetic resonance spectra where an assignment has previously been made using an alternative technique. In the latter case the method of the invention can therefore be employed to check the confidence of any assignment made using alternative assignment techniques.

As described above, obtaining the magnetic resonance dataset $D_1$ from a source may therefore comprise conducting an NMR experiment on a sample (e.g. wherein the sample comprises a molecule of interest). Thus, in an embodiment, step (i) may comprise conducting an NMR experiment on a sample to generate a nuclear magnetic resonance dataset $D_1$. The sample may comprise a molecule of interest. Examples of molecules of interest include peptides, proteins (e.g. enzymes), and oligonucleotides.

Thus, in certain embodiments, the invention provides a method of processing nuclear magnetic resonance (NMR) spectroscopic data, wherein a molecule of interest is subject to NMR and a nuclear magnetic resonance dataset $D_1$ is obtained in the form of an NMR spectrum of the molecule of interest, to assign resonance peaks in the NMR spectrum of the molecule of interest to atomic nuclei in said molecule of interest, comprising:

(i) obtaining said nuclear magnetic resonance dataset $D_1$ comprising a first set of data points ij representing resonance peaks arising from heteronuclear J-couplings between nuclei i and nuclei j, and a second set of data points jj representing through-space proximity correlations between individual nuclei j associated with the first set of data points ij;

(ii) obtaining a molecular structure dataset $D_2$ comprising data points representing a three-dimensional spatial arrangement of atoms in the molecule;

(iii) defining a magnetic resonance data graph $G_1=(V_1, E_1)$ and a structure graph $G_2=(V_2, E_2)$ wherein:

the set of vertices $V_1$ of $G_1$ comprises individual vertices $V_1^{ij}$ such that each individual vertex $V_1^{ij}$ represents an individual data point ij selected from the first set of data points;

the set of edges $E_1$ of $G_1$ comprises individual edges $E_1^{jj}$ such that each individual edge $E_1^{jj}$ represents a data point jj selected from the second set of data points and wherein each individual edge $E_1^{jj}$ connects two individual vertices $V_1^{ij}$ if nuclei j associated with the data points represented by those two vertices interact via a through-space proximity correlation;

the set of vertices $V_2$ of $G_2$ comprises individual vertices $V_2^{ii}$ such that each individual vertex $V_2^{i}$ represents an atom in the molecular structure represented by dataset $D_2$, said atom having a nucleus i and said being bound to at least one atom having a nucleus j;

the set of edges $E_2$ of $G_2$ comprises individual edges $E_2^{ii}$ such that each individual edge $E_2^{ii}$ connects two individual vertices $V_2^{i}$ to one another if the atoms represented by said vertices are within a predetermined distance r relative to one another in the molecular structure represented by dataset $D_2$;

(iv) optionally comparing $G_1$ and $G_2$ to identify subgraph isomorphism from $G_1$ to $G_2$ and generating all possible mappings of edges $E_1^{jj}$ to edges $E_2^{ii}$ and of vertices $V_1^{ij}$ to vertices $V_2^{i}$ which are consistent with said subgraph isomorphism;

(v) comparing $G_1$ and $G_2$ to identify at least one maximal common edge subgraph (MCES);

(vi) generating all possible mappings of edges $E_1^{jj}$ to edges $E_2^{ii}$ and of vertices $V_1^{ij}$ to vertices $V_2^{i}$ which are consistent with said at least one MCES;

(vii) for each possible mapping of a vertex $V_1^{ij}$ to a vertex $V_2^{ii}$ obtained in steps (iv) and (vi), generating a peak assignment, wherein generating said peak assignment comprises attributing a resonance represented by said vertex $V_1^{ij}$ to an atom having a nucleus i which is represented by said vertex $V_2^{i}$;

(viii) generating an output comprising all possible assignments from step (vii) of resonance peaks in the NMR spectrum to atomic nuclei in the molecule.

Alternatively, as described above, obtaining the magnetic resonance dataset $D_1$ from a source may comprise accessing pre-recorded NMR experimental data, e.g. from a database, digital archive, computer storage medium, e-mail attachment or other electronic resource.

The magnetic resonance data graph $G_1$ is defined on the basis of the data points contained in the nuclear magnetic resonance dataset $D_1$. Thus, for the avoidance of all doubt, in step (iii), the set of vertices $V_1$ of $G_1$ comprises individual vertices $V_1^{ij}$ such that each individual vertex $V_1^{ij}$ represents an individual data point ij selected from the first set of data points in dataset $D_1$ and the set of edges $E_1$ of $G_1$ comprises individual edges $E_1^{jj}$ such that each individual edge $E_1^{jj}$ represents a data point jj selected from the second set of data points in dataset $D_1$ and wherein each individual edge $E_1^{jj}$ connects two individual vertices $V_1^{ij}$ if nuclei j associated with the data points in dataset $D_1$ represented by those two vertices interact via a through-space proximity correlation. It also follows, for the avoidance of all doubt, that in step (viii), generating an output comprising all possible assignments from step (vii) of resonance peaks in the NMR spectrum to atomic nuclei in the molecule essentially corresponds to assigning resonance peaks represented in $D_1$ to the nuclei of atoms represented in $D_2$.

In preferred embodiments, the magnetic resonance data graph $G_1$ is a graph $G_1=(V_1, E_1, \alpha_1)$ and wherein the structure graph $G_2$ is a graph $G_2=(V_2, E_2, \alpha_2)$, wherein $\alpha_1$ is a labelling function which labels the vertices $V_1$ and $\alpha_2$ is a labelling function which labels the vertices $V_2$. The functions $\alpha_1$ and $\alpha_2$ may, for example, label the vertices $V_1$ and $V_2$ of their respective graphs according to residue type (for example, to assign labels which identify particular vertices as corresponding to certain types of $^{13}C$-labelled amino acid residue methyl groups as described in further detail below).

The nuclear magnetic resonance spectrum may be a two, three- or four-dimensional NMR spectrum. Suitable NMR techniques include, but are not limited to:

3D or 4D $^{13}C/^{13}C$-edited NOESY (in which the NOE transfer occurs between protons, but recording carbon chemical shifts as 'start' and 'finish' locations of the magnetisation in addition to desired proton frequencies);

3D or 4D $^{13}C/^{15}N$-edited NOESY experiments;

solid state proton detected 3D or 4D methyl-methyl DREAM (dipolar recoupling enhanced by amplitude modulation) experiments; and $^{13}C$-$^{13}C$ PDSD (proton-driven spin diffusion) solid-state NMR experiments.

The nuclear magnetic resonance dataset $D_1$ comprises a first set of datapoints ij representing resonance peaks from heteronuclear J-couplings between nuclei i and nuclei j. The indices i and j can independently represent any NMR-active nucleus provided that nuclei i are a different type of nucleus to nuclei j. $^{13}C$, $^1H$, and $^{15}N$ are among the most commonly-observed nuclei in NMR experiments, particularly protein NMR experiments, and therefore in certain embodiments the indices i and j represent nuclei independently chosen from among $^{13}C$, $^1H$, and $^{15}N$, wherein i and j represent different types of nucleus to one another.

In one embodiment nuclei i are $^1H$ nuclei and nuclei j are $^{13}C$ nuclei such that the first set of datapoints ij represent $^1H$-$^{13}C$ resonances. In one embodiment nuclei i are $^{13}C$ nuclei and nuclei j are $^1H$ nuclei such that the first set of datapoints ij represent $^{13}C$-$^1H$ resonances. In a further embodiment, nuclei i are $^1H$ nuclei and nuclei j are $^{15}N$ nuclei such that the first set of datapoints ij represent $^1H$-$^{15}N$ resonances. In one embodiment nuclei i are $^{15}N$ nuclei and nuclei j are $^1H$ nuclei such that the first set of datapoints ij represent $^{15}N$-$^1H$ resonances.

In particular, $^1H$—X resonances (interchangeably referred to herein as X-$^1H$ resonances) are preferred where X is selected from $^{13}C$ and $^{15}N$. $^1H$-$^{13}C$ (equivalently referred herein as, $^{13}C$-$^1H$ resonances) are especially preferred as a spectrum of such resonances can be used to identify methyl groups. The identification of methyl groups is particularly useful as a probe in the study of protein structures (particularly large protein structures, i.e. structures of proteins with a molecular weight of 50 kDa or above) as a number of amino acids possess methyl side chains, namely: alanine, valine, leucine, isoleucine, threonine and methionine. In any given protein, typically about 20% of all amino acid residues are alanine, valine, leucine, isoleucine, threonine or methionine and these residues are normally well-distributed throughout the core and across the surface of the protein. Methyl groups also have favourable relaxation properties and have a good distribution across the protein core and surface. Each of these factors allows good spectral quality, resolution and coverage to be obtained. For such reasons, the use of $^{13}C$-$^1H$ or $^1H$-$^{13}C$ resonances is particularly preferred when the target molecule is a large protein.

$^{13}C$-labelling of the methyl side chains in amino acid residues in a protein permits $^{13}C$-$^1H$ resonances to be observed and therefore allows a methyl "fingerprint" of the protein to be acquired where such resonances are used to generate a 2D NMR spectrum, i.e. a spectrum with $^1H$ resonances represented on a first axis and $^{13}C$ resonances represented on a second axis, for example, acquired using a technique selected from among 2D $^{13}C$-$^1H$ HMQC, 2D $^{13}C$-$^1H$ HSQC or 2D $^{13}C$-$^1H$ HMBC. Such techniques can also be applied to non-protein molecules, e.g. macromolecules, provided that a methyl fingerprint of the molecule can be acquired based on $^{13}C$-$^1H$ resonances.

Most commonly, $^{13}C$ labelling will be performed on one or more group of residues selected from among the isoleucine δ, valine γ and/or leucine δ methyl groups. However, any combination of the alanine β, threonine γ and/or methionine ε methyl groups may also be labelled in addition to, or instead of, any combination of the isoleucine, valine and/or leucine methyl groups if desired. Labelling of more types of label leads to better results due to a decrease in the ambiguity of peak assignments, therefore in preferred embodiments $^{13}C$ labelling is performed on the methyl groups of two or more groups of residues selected from among isoleucine, valine and leucine, particularly preferably in combination with the methyl groups of one or more further groups of residues selected from among alanine, methionine and threonine.

Thus in certain preferred embodiments $^{13}C$ labelling is performed on any of the following combinations of methyl groups in amino acid residues:
  isoleucine δ and valine γ methyl groups;
  isoleucine δ and leucine δ methyl groups;
  isoleucine δ and valine γ methyl groups;
  valine γ and leucine δ methyl groups;
  isoleucine δ, valine γ and leucine δ methyl groups;
  isoleucine δ, valine γ, leucine δ and alanine β methyl groups;
  isoleucine δ, valine γ, leucine δ, alanine β and methionine ε methyl groups; or isoleucine δ, valine γ, leucine δ, alanine β, methionine ε and threonine γ methyl groups.

The isoleucine γ methyl group may also be labelled instead of, or in addition to, the isoleucine δ methyl group in any of the embodiments described herein.

Where $^{13}C$-labelling of amino acid methyl side chains is performed, e.g. according to any of the $^{13}C$-labelling embodiments described above, the magnetic resonance data graph $G_1$ should be labelled with an appropriate labelling function $\alpha_1$ such that the vertices $V_1$ of $G_1$ are labelled according to the appropriate residue type. Similarly, the structure graph $G_2$ should be labelled with an appropriate labelling function $\alpha_2$ such that the vertices $V_2$ of $G_2$ are labelled according to residue type. Self-evidently, for the purposes of graph-matching, the labels applied by $\alpha_1$ to $G_1$ and by $\alpha_2$ to $G_2$ should be consistent.

In certain embodiments, the first set of resonances represented by datapoints ij in step (i) of the method of the invention are resonances arising from $^1H$-$^{13}C$ or $^{13}C$-$^1H$ through-bond interactions, and are preferably 2D $^{13}C$-$^1H$ or $^1H$-$^{13}C$ HMQC, 2D or $^1H$-$^{13}C$ HSQC or 2D or $^1H$-$^{13}C$ HMBC resonances. In such embodiments the resonances preferably correspond to $^{13}C$-labelled alanine, valine, leucine, isoleucine, threonine and/or methionine methyl side-chains, particularly valine γ, isoleucine δ or leucine δ side-chains. $^{13}C$-$^1H$ resonances are preferred such that nuclei i are $^{13}C$ and nuclei j are $^1H$.

The nuclear magnetic resonance dataset $D_1$ further comprises a second set of datapoints jj representing homonuclear nuclear Overhauser effect (NOE) interactions between individual nuclei j wherein the nuclei of type j in the second set of datapoints are of the same type as nuclei of type j in the first set of datapoints. Thus j can be any NMR-active nucleus, although $^{13}C$, $^1H$ and $^{15}N$ are the most commonly-observed nuclei in protein NMR experiments and therefore j is preferably selected from among these. In particular, it is preferred that nuclei of type j are $^1H$ nuclei as $^1H$-$^1H$ NOE interactions are ubiquitous in large proteins and because $^1H$ is the most sensitive available probe in NMR due to its favourable gyromagnetic ratio. If nuclei i are $^{13}C$ and nuclei j are $^1H$, the datapoints ij represent resonances arising from individual methyl groups (as discussed above) while the datapoints jj represent NOE interactions between nuclei j associated with two separate such methyl groups.

In a preferred embodiment the first set of datapoints ij therefore represent resonances which arise from heteronuclear $^{13}C$-$^1H$ through-bond interactions and the second set of datapoints jj represent homonuclear $^1H$-$^1H$ NOE interactions. Preferably the $^{13}C$ and/or $^1H$ nuclei are methyl group nuclei.

In a preferred embodiment of the invention, step (i) of the methods described herein therefore comprises providing a nuclear magnetic resonance dataset $D_1$ and a molecular structure dataset $D_2$ wherein:
  the nuclear magnetic resonance dataset $D_1$ comprises a first set of datapoints ij representing resonance peaks arising from heteronuclear J-couplings between nuclei i and nuclei j wherein i and j are independently selected from $^1H$ and $^{13}C$, and a second set of datapoints jj representing homonuclear Nuclear Overhauser Effect (NOE) interactions between individual nuclei j.

In a particularly preferred embodiment of the invention, step (i) of the methods described herein therefore comprises providing a nuclear magnetic resonance dataset $D_1$ and a molecular structure dataset $D_2$ wherein:
  the nuclear magnetic resonance dataset $D_1$ comprises a first set of datapoints ij representing resonance peaks arising from heteronuclear J-couplings between nuclei i and nuclei j wherein i are $^{13}C$ nuclei and j are $^1H$ nuclei, and a second set of datapoints jj representing homonuclear Nuclear Overhauser Effect (NOE) interactions between individual $^1H$ nuclei j.

Preferably the $^{13}C$ and/or $^1H$ nuclei in such embodiments are methyl group nuclei, i.e. nuclei belonging to atoms in a methyl group. Particularly preferably, such methyl groups are independently methyl groups which are isoleucine δ, valine γ leucine δ, alanine β, threonine γ and/or methionine ε methyl groups.

In a further preferred embodiment of the invention, step (i) of the methods described herein therefore comprises providing a nuclear magnetic resonance dataset $D_1$ and a molecular structure dataset $D_2$ wherein:

the nuclear magnetic resonance dataset $D_1$ comprises a first set of datapoints ij representing resonance peaks arising from 2D $^{13}C$-$^1H$ HMQC interactions, and a second set of datapoints jj representing homonuclear NOE interactions between $^1H$ nuclei directly bonded to $^{13}C$ nuclei.

In a further preferred embodiment of the invention, step (i) of the methods described herein comprises providing a nuclear magnetic resonance dataset $D_1$ and a molecular structure dataset $D_2$ wherein:

the nuclear magnetic resonance dataset $D_1$ comprises a first set of datapoints ij representing resonance peaks arising from 2D $^{13}C$-$^1H$ HMQC interactions between $^{13}C$ and $^1H$ nuclei in individual $^{13}C$-labelled methyl groups of alanine, valine, leucine and/or isoleucine residues in a biomolecule (e.g. a protein or enzyme), and a second set of datapoints jj representing homonuclear NOE interactions between $^1H$ nuclei in separate such $^{13}C$-labelled alanine, valine, leucine and/or isoleucine residues.

For example, when performing a methyl-TROSY-based study, a protein sample is prepared with uniform deuteration and $^{13}CH_3$ labelled methyl residues, typically isoleucine δ, valine γ, and leucine δ; however, isoleucine γ, alanine β, threonine γ and methionine ε methyl labeling methods are also possible. Preferred embodiments of labelling patterns are described above; of these, a combination of isoleucine, valine and leucine labelling is typically employed, optionally in combination with alanine, although it is particularly preferable that isoleucine, valine, leucine, alanine, threonine and methionine are all labelled as this will lead to the best results. The next step is to obtain a 2D $^1H$-$^{13}C$ HMQC spectrum, which acts as a fingerprint of the molecule. In the simplest case, one resonance is expected per methyl group (FIG. 3a), including one for each of the pro-R and pro-S valine and leucine methyl groups in the absence of stereospecific labelling. It is then possible to record a NOESY spectrum that specifically reveals methyl groups that are close together in space (FIG. 3a). The methyl-methyl NOE data can be readily used to define a graph, where each $^1H$-$^{13}C$ correlation is a vertex, and each NOE connecting the vertices is an edge (FIG. 3 b, c).

The molecular structure dataset $D_2$ may be based on an experimental crystal structure (such as those available from the RCSB Protein Data Bank (PDB) at http://www.rcsb.org/pdb/home/home.do). Alternatively, for example if no crystal structure is available, the molecular structure dataset $D_2$ may be based on a predicted structure such as a homology model. For example, if the primary sequence of a first protein is known and has a high degree of sequence homology (such as >50%, preferably >75% sequence homology) with a second protein, a three-dimensional structure for the first protein can be predicted based on a known structure for the second protein. Such structural predictions can be made using conventional protein homology modelling software or protein threading/fold recognition software. Suitable software for such predictions is known to those skilled in the art.

In some cases more than one molecular structure may be available for a given molecule. For example, multiple different crystal structures may have been reported for a particular protein, with differences between each reported structure. In such cases any of the known structures may be used as the basis for molecular structure dataset $D_2$ and the methods of the invention may be employed to generate NMR peak assignments for each known structure so that these can be compared. Any assignments which are consistent across different structures can be regarded with confidence, and any which are inconsistent can be regarded as ambiguous. Any inconsistent confident assignments can form the basis for further experimental studies that aim at determining the structural form of the protein dominantly present during the NMR measurement. Ambiguous assignments may then form suitable targets for further experimental studies with alternative techniques.

Providing the molecular structure dataset $D_2$ may thus be achieved by obtaining from a source a molecular structure dataset $D_2$. With reference to the non-limiting illustration in FIG. 2, obtaining a molecular structure dataset $D_1$ is illustrated at step 202. As described above, therefore, in certain embodiments obtaining the molecular structure dataset $D_2$ may comprise obtaining a structure from a database. In alternative embodiments obtaining the molecular structure dataset $D_2$ may comprise performing homology modelling.

It will be self-evident from the description herein and from the non-limiting Figures and Examples that in all embodiments of the invention the nuclear magnetic resonance dataset $D_1$ and the molecular structure dataset $D_2$ should relate to the same molecule.

Step (iii) of the methods of the invention comprises defining a magnetic resonance data graph $G_1=(V_1, E_1)$ and a structure graph $G_2=(V_2, E_2)$ as described above. With reference to the non-limiting illustration in FIG. 2, the step of defining graphs $G_1$ and $G_2$ is shown at step 203. As the structure graph $G_2$ may be derived from an experimental crystal structure available from the Protein Data Bank, this may sometimes also be referred to as a "PDB graph", though as used herein this should be understood to be interchangeable with the more general phrase "structure graph" and not to imply that the structure graph is actually derived from PDB data. Any suitable source of structural information allowing the construction of a structure graph may be employed, as described above. However, structure graphs derived from PDB data are also self-evidently contemplated as structure graphs in certain embodiments of the invention. Defining the magnetic resonance data graph and/or structure graph may preferably be performed by executing code in a computer which defines the magnetic resonance data graph and/or the structure graph as described herein.

All definitions of i and j discussed above in relation to step (i) (including definitions in respect of the first set of resonances and the second set of resonances) apply equally to (ii).

In order to define a magnetic resonance data graph $G_1$ it may be necessary, before defining the graph, to filter the data points in dataset $D_1$, in particular the second set of data points in order to optimise the data for graph-matching. For example $D_1$ may be filtered to select data corresponding to well-defined, reciprocated signals (preferably NOE signals represented by the second set of data points jj) in the spectrum in order to remove any noise and uncertainties associated with experimental data, thereby giving rise to an improved probability of confident assignments. If the data points jj represent NOE information then the magnetic resonance data graph $G_1$ may be referred to as an "NOE graph". Filtering of the data points in dataset $D_1$ may preferably be performed by executing code in a computer which filters the data points as described herein.

In a multidimensional NMR spectrum that contains through space connectivity information any "cross peak" arising from magnetisation transfer between a first nucleus and a second nucleus will often be expected to have a reciprocal cross peak arising from the equivalent magnetisation transfer between the second nucleus and the first nucleus. If a reciprocal cross peak is missing this can be indicative of an experimental artefact or other error, if the experiment is of the type that expects this, such as an NOE spectrum. In the methods of the invention it is therefore desirable to remove ("filter out") any datapoints jj which represent NOE interactions which do not give rise to reciprocal cross-peaks. Preferably filtering the dataset $D_1$ therefore comprises a step of identifying and eliminating datapoints jj which represent NOE interactions which do not give rise to reciprocal cross-peaks.

In order to improve the confidence of any peak assignment it is also preferable that resonances are only employed if their NMR cross-peaks are similar in intensity to their reciprocal cross-peaks. Thus, filtering the dataset $D_1$ preferably comprises a step of identifying datapoints jj which represent NOE interactions having <90% normalised intensity compared to their reciprocal cross-peaks, and eliminating said datapoints and the datapoints representing the corresponding reciprocal cross-peaks.

For any two nuclei $j^1$ and $j^2$ giving rise to a pair of cross-peaks $j^1j^2$ and $j^2j^1$ and having diagonal peaks (auto peaks) $j^1$ and $j^2$, normalised cross-peak intensities may be calculated as $$\frac{\text{data } height_{cross}^{j1,j2}}{\sqrt{\text{data } height_{diagonal}^{j1} \times \text{data } height_{diagonal}^{j2}}}$$

The confidence of any cross-peak assignment can further be improved if the signal-to-noise ratio of the resonances employed is 2 or greater. Therefore, filtering the dataset $D_1$ preferably comprises a step of identifying resonances jj which have a signal-to-noise ratio <2 and eliminating said resonances and their reciprocal cross-peaks.

For any diagonal peak corresponding to a nucleus $j^1$ or $j^2$, or any cross-peak $j^1j^2$ or $j^2j^1$, the signal to noise ratio may be calculated as $$\frac{\text{data } height_{cross \text{ or } diagonal}^{j1,j2}}{\text{noise threshold}},$$

where data heights and noise threshold can be determined by conventional NMR spectral analysis software such as the "Sparky" software available from http://www.nmr-fam.wisc.edu/nmrfam-sparky-distribution.htm or https://www.cgl.ucsfedu/home/sparky/. Conventional NMR analysis software such as Sparky may also be employed for the identification of non-reciprocal cross peaks, and for the determination of normalised cross-peak intensities.

In some cases, measured data heights (peak intensities) or calculated normalised peak intensities may be missing and therefore in such cases it may be preferable to apply only the filtering step of identifying and eliminating datapoints representing cross-peaks which lack reciprocal cross-peaks.

In other embodiments filtering the dataset $D_1$ comprises at least two, and preferably all three, of the steps of:

identifying and eliminating datapoints jj which represent NOE interactions lacking reciprocal cross-peaks;

identifying datapoints jj which represent NOE interactions having a <90% normalised intensity compared to their respective reciprocal cross-peaks and eliminating said datapoints and the datapoints representing their respective reciprocal cross-peaks; and/or identifying datapoints jj which have a signal-to-noise ratio <2 and eliminating said datapoints and the datapoints representing their respective reciprocal cross-peaks.

A further preferred filtering step, which may be employed in combination with any or all of the filtering steps described above, includes identifying and eliminating any data points ij which are not associated with any data points jj (e.g. eliminating $^{13}$C-$^1$H HMQC resonances from methyl groups which do not give rise to any methyl-methyl $^1$H-$^1$H NOE interactions).

To define the magnetic resonance data graph, an adjacency matrix is constructed based on the first set of datapoints and the second set of datapoints. Preferably the adjacency matrix is constructed after filtering the dataset $D_1$ as described above. Vertices corresponding to datapoints ij are regarded as adjacent to one another if any of the nuclei j giving rise to the corresponding resonances also interact via a NOE interaction which can be represented by a datapoint jj. For instance, methyl groups in two separate amino acid residues in a protein may each individually give rise to their own 2D $^{13}$C-$^1$H HMQC resonances. If the methyl groups of these two residues interact via an NOE, then a cross-peak (at their resonances in a multidimensional NOESY spectrum) corresponding to the NOE interaction between these two residues will also be observed. In this case, the vertex $V_1^{ij}$ corresponding to the 2D $^{13}$C-$^1$H HMQC resonance of the first amino acid residue will be regarded as adjacent to the vertex $V_1^{ij}$ corresponding to the 2D $^{13}$C-$^1$H HMQC resonance of the second amino acid residue. In embodiments of the invention where a code is executed in a computer to define the magnetic resonance data graph, the adjacency matrix may be constructed by executing the code.

Thus, in certain embodiments, if the first set of datapoints ij corresponds to a 2D $^{13}$C-$^1$H HMQC spectrum and the second set of datapoints jj corresponds to $^1$H-$^1$H NOE interactions, any two vertices corresponding to a first 2D $^{13}$C-$^1$H HMQC resonance and a second 2D $^{13}$C-$^1$H HMQC resonance are regarded as being adjacent if any of the individual nuclei giving rise to the first 2D $^{13}$C-$^1$H HMQC resonance interact via the NOE with any of the individual nuclei giving rise to the second 2D $^{13}$C-$^1$H HMQC resonance, thus generating an NOE cross-peak.

Preferably the vertices are labelled, for example according to amino acid type. For example, if 2D $^{13}$C-$^1$H HMQC spectral peaks corresponding to amino acid methyl groups can be assigned to particular types of amino acid residue, for instance by inspection of chemical shift values or by preparing appropriate chemical or isotopic labels which allow discrimination of different types of amino acid residue, then vertices in the magnetic resonance data graph can be labelled as corresponding to individual amino acid residues. In some cases (e.g. where the isotopic labelling pattern adopted does not unambiguously allow discrimination between peaks originating from certain types of residue) there may be more than one possible type of residue which could plausibly give rise to the same peak. In such cases a common label can be assigned to those resonances, where such label does not distinguish between those candidates but still distinguishes them from other types of amino acid residues. For example, it can be difficult to distinguish Leu and Val resonances, and therefore in some embodiments it may be appropriate to label certain resonances as "Leu/Val", which distinguishes these from (e.g.) Ala resonances.

In one embodiment, if the assignments for the two methyl groups (pro-R and pro-S) within a given Leu or Val residue are known, then a single Leu or Val residue may be used to join the methyl-methyl NOEs from both methyl peaks, thereby creating a single vertex in the magnetic resonance data graph. The residue types may be added as being known a priori, a requirement that can be accomplished through inspection of the chemical shifts (e.g. discriminating Ile resonances from Leu resonances), or by preparing specifically labeled samples (e.g. to discriminate Leu from Val resonances). When the resonances of Leu and Val types cannot be distinguished, the methods of the invention support giving the same label for Leu/Val $^1$H-$^{13}$C resonances, albeit with higher ambiguity (reduced confidence) in any resulting assignments as a result of the collapse of two labels into one.

To define the structure graph, the spatial coordinates of atoms of type i are located in the structural model $D_2$ wherein atoms of type i have nuclei of type i. The coordinates of those atoms are represented by vertices $V_2^i$ in the structure graph $G_2$. It is particularly preferred that i denotes $^{13}$C, since $^{13}$C coordinates can readily be identified in a three-dimensional structural model, particularly if the $^{13}$C coordinates are coordinates of $^{13}$C nuclei in methyl side chains. Defining the structure graph may preferably be performed by executing code in a computer which defines the structure graph as described herein.

In some cases the atom i may be a pseudo-atom with coordinates obtained by averaging the coordinates of two or more individual nuclei. For example a Leu pseudo-δ $^{13}$C pseudo-atom may be defined having coordinates which are the average of the coordinates of the two separate Leu methyl carbon atoms. Similarly a Val pseudo-γ $^{13}$C pseudo-atom may be defined having coordinates which are the average of the coordinates of the two separate Val methyl carbon atoms. In an embodiment the atoms of type a may be one or more $^{13}$C and/or $^1$H atom associated with one or more of a Leu $\delta_1$, Leu $\delta_2$, Val $\gamma_1$, Val $\gamma_2$, Ile-$\delta_1$, alanine β, threonine γ, methionine ε, Leu pseudo-δ and/or Val pseudo-γ methyl.

The nuclear Overhauser effect (NOE, interchangeably referred to as the nuclear Overhauser enhancement, with the same abbreviation) is the name given to the transfer of nuclear spin polarisation between nuclei via nuclear dipole-dipole interactions in the solution-state due to the cross correlated relaxation between the two spins. This is a through-space interaction scaling (to a first approximation) as $1/r^6$ where r is the internuclear distance. If the molecule is not deuterated, NOEs are typically observed over distances of about 5 Å and below. In deuterated proteins in which the only protons are those in methyl groups, $^1$H-$^1$H NOEs can be observed over distances up to about 10 Å. In very rare cases NOEs with a range of >10 Å may be observed. An experiment in which cross-peaks arise from NOEs therefore provides information about nuclei which are in close spatial proximity to one another even if they are not directly bonded to one another. NOEs are therefore capable of revealing information about the three-dimensional structure of macromolecules such as proteins, for example by demonstrating that two residues which are far apart in a primary amino acid sequence are close to one another in space and therefore revealing information about the folding of the protein.

In the case where a high-resolution structure of the protein under study is available, a structure graph $G_2$ can be defined in which the edges of the graph comprise all connections between nuclei i or j of interest (such as carbon atoms of methyl groups) within a certain distance threshold r. FIG. 3d illustrates this with reference to a Methyl-TROSY implementation.

Taking into account the distance-dependence of the nuclear Overhauser effect, therefore, in order to reduce the complexity of the graph-matching problem the predefined distance r employed in defining the edges $E_2$ of structure graph $G_2$ should be chosen such as to optimise the structure graph for matching to the magnetic resonance data graph $G_1$. An optimal distance threshold needs to be set for every protein for the method to be successful. The distance threshold defines the edges of the structure graph. Testing against a benchmark has revealed a heuristic to calculate this value for each inputted problem, thus removing this decision from the user. This heuristic is described in further detail herein. Typically a value of r in the range of r=5-20 Å, particularly in the range of 9-11 Å, such as 7-11 Å and in particular r=10 Å, is a suitable distance r which optimises computational time, number of edges matched, and maximised certainty of assignments overall. Preferably r is no smaller than 5 Å and no larger than 12 Å. r can, if desired, be optimised by running the method of the invention at a range of different distance thresholds r (e.g. from 5 to 12 Å) and monitoring the change in number of peak assignments generated, the size of the MCES and/or the incidence of subgraph isomorphism. The optimal r threshold for the detailed calculation will be the value above which one or more of these features reaches a plateau, i.e. above which further increases in r result in no further improvement.

It is evident that the accuracy of the available protein structure and determination of the correct distance threshold are important factors. From a computational complexity point of view, both subgraph isomorphism (SI) and MCES identification are NP-complete problems that in the worst case require exponential time to be solved exactly. The larger in size the graphs that are being compared, the longer the time needed for the comparison, where size of the graph is defined by the total number of its edges. Thus, when it comes to the determining the distance threshold r, it should not be extended beyond necessary limits in order to avoid extremely long calculations. Moreover, the methods of the invention do not weight graph edges. Setting the threshold to be very large artificially increases the ambiguity in the final result. Setting the distance threshold too low might leave out of mapping the NOEs that are crucial determinants of the correct assignment and might lead to errors. Therefore, the most appropriate threshold takes into account both the experimental reality, and the computational complexity of the graph matching problem.

From experimental NOE data, it is evident that the majority of NOEs fall below ~10 Å (FIG. 6). Through running the methods of the invention on real and simulated data and comparing all the results in the benchmark as described in the Examples herein the inventors have identified a rule that has not been seen to produce an incorrect assignment. The distance r is therefore preferably the lower of the value where NOEs would be ~40% sparse, or 10 Å±1 Å. Alternatively the threshold r should be chosen so that at least 85% of NOEs can be assigned. In practice the distance threshold r is therefore often 10 Å, although for small (<40 kDa) proteins such as ubiquitin this may be below 10 Å, such as 6.5 and 7.59 Å (FIG. 6). Thus in certain embodiments r is between 5 and 12, preferably between 7 and 11, particularly preferably ~10 Å. In the case of the benchmark tests described in the Examples, 10 Å was employed successfully for all tested proteins other than small protein ubiquitin.

With regard to ubiquitin, in one embodiment (shown in the Examples) a 7 Å±0.5 Å threshold was used (where 6.5 Å was found to work particularly well in the solution state and 7.5 Å in the solid state). The small size of the protein resulted in SI of NOE graph to structure graph at 7 Å±0.5 Å.

The set of confident assignments decreased at higher distance thresholds. Nonetheless, the set of assignments that remained confident across the thresholds was consistent, providing additional confidence for using this lower distance threshold. Thus in the case of small proteins such as small protein ubiquitin, a suitable distance threshold r may be about 7 Å, such as 6.5 Å to 7.5 Å.

Changing the distance threshold r significantly above or below the optimal threshold for each protein can affect the assignment outcome, thus the empirical rule of using r=7, 8, 9, 10 or 11 Å is preferred, particularly 9, 10 or 11 Å.

After carrying out step (iii), and prior to carrying out step (iv) (if present, or prior to carrying out step (v), if step (iv) is absent), the connectivity of G1 is preferably assessed to check whether the graph G1 is disconnected. If G1 is disconnected it is decomposed into non-intersecting connected subgraphs ("connected subgraphs") and their cardinality (number of vertices) is determined. Each connected subgraph is then preferably treated independently in what follows. The connected subgraphs G1 are ordered according to their cardinality (from highest to lowest) and thereafter steps (iii) onwards are performed separately on each connected subgraph. Any references to G1 in the following discussion therefore apply equally to connected subgraphs of G1 which have been obtained by decomposing the disconnected graph G1 into its connected subgraphs. An exception to the preference for treating connected subgraphs separately may apply in the case where the overall graph G1 is small (with a total number of edges of about 50 or below). In this case, if G1 is disconnected, it may be beneficial not to treat its connected subgraphs separately as the small size of the connected subgraphs may lead to an increase in ambiguity of assignments. In certain embodiments, the method of the invention makes this decision automatically, such that when a small graph (with about 50 or fewer edges) is encountered, the algorithm treats its connected subgraphs collectively without the need for the user to intervene.

Where step (iv) is present, every connected subgraph is subject to a test to determine whether to compare the subgraph of G1 to G2 to identify subgraph isomorphism or whether instead to compare the subgraph of G1 to G2 to identify at least one MCES as described in step (v). Both steps (iv) and (v) are performed algorithmically as described in further detail herein. Step (iv) may be performed by executing a code in a computer which compares $G_1$ and $G_2$ to identify subgraph isomorphism from $G_1$ to $G_2$ and generates all possible mappings of edges $E_1^{ij}$ to edges $E_2^{ii}$ and of vertices $V_1^{ij}$ to vertices $V_2^{ii}$ which are consistent with said subgraph isomorphism.

In step (iv) of the method, $G_1$ and $G_2$ are compared to identify subgraph isomorphism from G1 to G2. Step (iv) is optional, but it is highly preferred that it is present, as this improves the confidence of any assignments and reduces the search space required for MCES identification. With reference to the non-limiting illustration in FIG. 2, the comparison of $G_1$ and $G_2$ in this manner is shown (as "comparing $G_1$ and $G_2$ to identify subgraph isomorphism") as a component of step 204.

The NMR resonance peak assignment process requires the two graphs G1 and G2 to be compared. The most likely assignment will be obtained from a set of solutions for which the graph G1 of NOEs and the structure graph G2 are maximally overlapped.

The problem of comparing graphs to determine their similarity is generally referred to as a 'graph-matching' problem, where the objective is to find a mapping from the vertices of one graph to the vertices of the other graph subject to the restrictions relevant to the matching problem in question. In the context of the NOE data and the protein structure, the objective is to find such mapping (from vertices of the NOE graph to vertices of the structure graph) that results in the highest overlap of edges. In addition, the search for all such mappings is required to provide a complete set of assignment solutions that all explain the maximum number of methyl-methyl NOEs.

In principle, if there were no time restriction, it would be possible to evaluate the total number of explained NOEs for all possible resonances to nucleus (e.g. methyl carbons of labelled residues) assignment combinations by brute force (FIG. 4). The number of combinations that would have to be tested, assuming N labelled residues of a single residue type, is given by N!. FIG. 4 illustrates that, while problems involving 10 nuclei (methyls, in the case of FIG. 4) could be evaluated in reasonable computation time by brute force, a problem with more than 21 nuclei (methyls, in the case of FIG. 4) would far exceed the acceptable time, even if the fastest possible calculation speed is assumed. Therefore, a more efficient sampling strategy is necessary in order to solve the assignment problem exactly.

The method according to the invention utilizes an exact graph matching algorithm to solve for subgraph isomorphism (where step (iv) is present). The method according to the invention also utilizes an exact graph matching algorithm to solve for MCES (in step (v)). Both algorithms may operate on undirected, labelled graphs. The steps of solving for subgraph isomorphism and MCES are shown together as step 204 in the non-limiting illustration in FIG. 2.

Where the graphs are labelled, the labels on vertices of the graphs reflect different methyl residue types, and this labelling accounts for a significant reduction in the search space for both algorithms. When a set of nodes can be classified according to a specific residue type, the possible solution space takes on a 'block diagonal' form which further the number of possible solutions is reduced by a factor of $$\frac{(n+m)!}{n!m!}$$

where n and m are the numbers of the two types of residue. For instance, in the case of 10 isoleucines and 10 valines, this factor is on the order of $10^5$. In the case where a residue has two methyl-labelled groups, frequently the case with leucine δ and valine γ, it is beneficial to join the two methyl groups into a single pseudo-atom. When joining methyl groups into a single pseudo-atom this is typically done by a factor according to the above formula where n=m. For example, if there are 10 leucine groups (and thus 20 methyl groups), and these are regarded as 10 leucine "pseudoatoms", the number of solutions is reduced by a factor of $10^5$. In general, the more diverse the vertex labels, the more the solution can be turned into block diagonal form, and the smaller in size the graph, the faster the search. In addition, more diversity in labels accounts for less ambiguity in the assignments provided by the final set of SI, or MCES solutions (FIG. 5c).

If G1 (or a connected subgraph thereof) is subgraph-isomorphic to G2 it is then mapped to G2 in order to generate all possible mappings of edges $E_1^{ij}$ to edges $E_2^{ii}$ and of vertices $V_1^{ij}$ to vertices $V_2^{ii}$ which are consistent with said subgraph isomorphism. This mapping may be performed using techniques known to those skilled in the art. Preferably the so-called vf2 (equivalently named VF2) algorithm may be employed. This algorithm is known to those skilled in the art and is described in Cordella et al., *IEEE Transactions on Pattern Analysis and Machine Intelligence*, vol. 26, no. 10, pp. 1367-1372, October 2004 (the contents of which are incorporated herein by reference, in particular with reference to sections 2 to 2.4 thereof). Optionally the VF2 algorithm may be employed in its so-called "VF2 Plus" form as described by Carletti et al. in "Graph-Based Representations in Pattern Recognition", Springer (2015), ISBN 978-3-319-18224-7 at pages 168-177 (the contents of which are incorporated herein by reference). References to VF2 herein may be taken to refer equally to VF2 Plus.

The VF2 algorithm entails determining a mapping M which associates vertices of G1 with vertices of G2 and vice versa according to predefined constraints. The mapping M is expressed as the set of pairs (n, m) representing the mapping of a node n of G1 to a node m of G2. A mapping is said to be an isomorphism if and only if M is a bijective function that preserves the branch structure of the two graphs. A mapping M is said to be a graph-subgraph isomorphism if and only if M is an isomorphism between G2 and a subgraph of G1.

A high-level representation of the VF2 algorithm is as follows:

```
PROCEDURE Match (s)
INPUT: an intermediate state s; the initial state s0 has M(s0)=0
OUTPUT: the mappings between the two graphs
IF M(s) covers all the nodes of G₂ THEN
    OUTPUT M(s)
ELSE
    Compute the set P(s) of the pairs candidate for inclusion in M(s)
    FOREACH p in P(s)
        IF the feasibility rules succeed for the inclusion of p in M(s)
        THEN
            Compute the state s' obtained by adding p to M(s)
            CALL Match (s')
        END IF
    END FOREACH
    Restore data structures
END IF
END PROCEDURE Match
```

Here the definitions of states s and $s_0$, the mapping $M(s_0)$, the set P(s), and the feasibility rules employed, are all as defined in and as described in detail in, respectively, sections 2, 2.1 and 2.2 of Cordella et al., *IEEE Transactions on Pattern Analysis and Machine Intelligence*, vol. 26, no. 10, pp. 1367-1372, October 2004 (the contents of which sections are incorporated herein by reference). Those definitions are adopted herein.

Any non-subgraph isomorphic graphs (or subgraphs thereof) are analysed in order to identify at least one MCES according to step (v) of the method of the invention. Where more than one MCES exists, all such MCES are identified. Thus, it is explicitly contemplated in all embodiments of the invention that in step (v) references to "identifying at least one MCES" may be understood to refer to "identifying all MCES". Similarly, in step (vi), references to "generating all possible mappings of edges $E_1^{ij}$ to edges $E_2^{ii}$ and of vertices $V_1^{ij}$ to vertices $V_2^{i}$ which are consistent with said at least one MCES" should also be understood to refer to the case where more than one MCES is identified, and thus in step (vi) all possible mappings are generated for each MCES. Step (v) may be performed by executing a code in a computer which compares $G_1$ and $G_2$ to identify at least one maximal common edge subgraph (MCES) as described herein. Step (vi) may be performed by executing a code in a computer which generates all possible mappings of edges $E_1^{ij}$ to edges $E_2^{ii}$ and of vertices $V_1^{ij}$ to vertices $V_2^{i}$ which are consistent with said at least one MCES.

In step (v), $G_1$ and $G_2$ are compared to identify at least one maximal common edge subgraph (MCES). With reference to the non-limiting illustration in FIG. 2, the comparison of $G_1$ and $G_2$ in this way is shown (as "comparing $G_1$ and $G_2$ to identify at least one MCES") as a component of step 204. This comparison can be performed using an exact MCES algorithm. The exact MCES algorithm as described herein may be performed by executing a code in a computer. The exact MCES algorithm constructs the search tree starting from a vertex in G1 or in a connected subgraph thereof. From a given starting point (root), the order of traversal of vertices during the search will significantly impact the starting scores of the exact MCES search. In order to determine the most optimal starting point a single iteration of the MCES search is performed from every vertex and the obtained scores (size of first found MCES) are used to determine the best starting vertex. The highest scoring, first found MCES comprises the optimal starting point. The order of the rest of the vertices from the root is determined through breadth-first tree search.

Prior to searching for the at least one MCES, any non-subgraph isomorphic graph G1 (or subgraphs thereof) are preferably passed through a protocol that determines 1. an optimal matching order (vertices of G1 or a subgraph thereof to vertices of G2) and 2. an optimal order of traversal of the vertices in any such subgraph. Determining the optimal orders 1. and 2. allows high starting scores in any exact MCES search to be obtained, and also results in significant reduction of the search space of the exact search by eliminating completion of any partial assignment that would lead to lower scores. Together, optimising 1. and 2. allows efficient pruning of the search tree and faster convergence of the exact MCES search.

The MCES algorithm starts by making a tentative assignment decision for a vertex from graph G1 to one of its possible matches in G2 (root of the search tree). Every time a vertex of G1 is tentatively assigned to a vertex in G2, the algorithm keeps track of the theoretical maximum of number of common edges on the basis of such a partial (incomplete) assignment (i.e. the set of vertex assignments which have been achieved so far). The algorithm keeps track of the current 'best' graph match in terms of the number of common edges (number of NOEs the current assignment explains). It continues through the search tree by assigning as-yet-unassigned vertices, and scores as it goes to determine whether searching further down the current branch can, in principle, produce an assignment better than or as good as the current 'best'. If this is not the case, it excludes the branch from further consideration. In this way it is able to reliably exclude vast regions of sample space and hugely increase the speed of the search.

The basic rules that govern how the algorithm creates the tree search are adapted from those described by McGregor in *Software—Practice and Experience*, Vol. 12, 23-34 (1982), the entire contents of which are incorporated herein by reference. The adaptions to this algorithm to allow it to run in a reasonable time on real data are extensive and stem primarily from precisely how the search tree is structured.

Although the branch exclusion of McGregor speeds up the search, if the 'correct' solution is far down in the search list, it will take a long time for it to be reached. To avoid this, the order in which each vertex of G1 (which may be an NOE graph) will consider being assigned to a vertex of G2 (which may be a protein structure graph, e.g. a PDB graph generated using a protein structural model from the Protein Databank)

is sorted by the outcome of the Hungarian method and Jaccard similarity index (as described in further detail herein below). This generates an optimal matching order 1. for each vertex of G1 or a subgraph thereof to vertices of G2. An optimal order of traversal 2. of the vertices of G1 is then generated, which amounts to the algorithm preferentially trying to place adjacent vertices of the G1 graph follow one another in order of traversal. The search order ensures that adjacent vertices of G1 are placed in a manner termed 'breadth first tree search' from the root vertex (determined as described above step (v) and below here). This amounts to NOE vertices that are adjacent to in the graph being placed adjacent in the traversal order and with a higher priority to others.

The biggest determinant to the rate at which assignment solutions are considered in the search tree is the choice of which G1 vertex (e.g. an NOE vertex) is assigned to a G2 vertex (e.g. a PDB vertex) first (root of the search tree). To intelligently determine this, a trial is first run placing each G1 vertex as a root of the search tree by assigning it to a vertex of G2, and determining the number of the common edges of such first solutions. This rapid exercise is then used to determine the optimal starting G1 vertex and the order of the rest of the vertices to be matched to their respective G2 vertices follows a breadth-first tree search from a determined root.

Finally, once the best traversal order of the G1 vertices has been determined, an incomplete MCES search is performed to generate a number of solutions (optimally typically determined between 10 and 50, with 10 being sufficient in many cases, such as in the benchmark tests described in the Examples herein) that are used to re-order the matching priorities of G1 vertices (optimal matching order 1.)

Finally, the algorithm receives further enhancement through dynamically re-ordering the priorities of matching during the calculation and based on the current best partial assignment solution held in memory.

The operation of optimal matching order 1. and optimal traversal order 2. is now described in further mathematical detail.

The optimal matching order 1. refers to ordering a set of vertices of structure graph associated with each vertex of G1 or a subgraph thereof. The set comprises possible assignment options for a particular vertex (e.g. every assignment option for a particular $^1H$-$^{13}C$ resonance). The sorting and assignment of all such options is performed using a combination of the so-called Munkres or "Hungarian" algorithm (as described in, e.g., Chapter 2 ("The Hungarian Method for the Assignment Problem", by Harold W. Kuhn) of 50 *years of Integer Programming* 1958-2008, Springer-Verlag, Berlin/Heidelberg, 2010, eds. M Jünger et al., the entire contents of which chapter are incorporated herein by reference) and Jaccard similarity coefficient.

First an intersection is computed between the neighborhoods (N) of every vertex of G1 (n) and every vertex of a G2 ($s_i$), with N ($n_i$)∩N ($s_i$). Vertex labels are taken into account such that only the neighborhoods of vertices of the same type are compared. The direct neighborhood of a vertex comprises all vertices directly connected to it (i.e. all adjacent vertices). The intersection comprises vertex types common to both neighborhoods.

For example, if a vertex of type Ile (from G1) is adjacent to three vertices of type Ile, Val, Leu, its neighborhood is N1={Ile, Val, Leu}. Given a vertex of type Ile in structure graph that is directly adjacent to five vertices of type Ile, Ile, Val, Val, Leu, its neighborhood is N2={Ile, Ile, Val, Val, Leu}. If the Ile vertex from G1 is compared to the Ile from G2, the intersection of their neighborhoods is N1∩N2={Ile, Val, Leu} in which the number of elements in the intersection is three.

The intersection is computed between every pair of vertices ($m_i$, $s_i$) of the same type, and the sizes of the intersections are given in a matrix, where rows correspond to vertices of G1 and columns correspond to vertices of a G2. An example of a matrix of neighborhood intersections for G1 with four Ile vertices {1-Ile, 2-Ile, 3-Ile, 4-Ile} and G2 with four Ile vertices {1'-Ile, 2'-Ile, 3'-Ile, 4'-Ile}, i.e. the assignment options for vertices of G1, is shown by way of example:

|  | 1'-Ile | 2'-Ile | 3'-Ile | 4'-Ile |
| --- | --- | --- | --- | --- |
| 1-Ile | 3 | 4 | 1 | 3 |
| 2-Ile | 1 | 1 | 2 | 2 |
| 3-Ile | 2 | 5 | 4 | 4 |
| 4-Ile | 4 | 5 | 1 | 1 |

The shaded boxes indicate an outcome of the Munkres (Hungarian) algorithm. The result is an assignment solution for each of the G1 vertices, which accounts for a maximum of the neighborhood intersections (here 14). Note that this one maximum is not necessarily the only (or the best) solution for complete graph matching. For instance, the same maximum (14) can be obtained by an alternative assignment, as shown below:

|  | 1'-Ile | 2'-Ile | 3'-Ile | 4'-Ile |
| --- | --- | --- | --- | --- |
| 1-Ile | 3 | 4 | 1 | 3 |
| 2-Ile | 1 | 1 | 2 | 2 |
| 3-Ile | 2 | 5 | 4 | 4 |
| 4-Ile | 4 | 5 | 1 | 1 |

Nonetheless, using the Munkres (Hungarian) algorithm as a heuristic for sorting the sets is highly beneficial and provides a good starting point for the MCES search. For every vertex of G1, the first assignment option is set to the one determined by this variant of the Hungarian method. Since this returns only one assignment possibility for every G1 vertex, the order for the rest of the assignment options is determined by decreasing Jaccard coefficients. This coefficient takes into account the number of elements in the intersection of the two finite, non-empty sets, here the neighborhoods of a G1 vertex and G2 vertex and the size of the union of the two sets.

$$\text{Jaccard} = \frac{|N(ni) \cap N(si)|}{|N(ni) \cup N(si)|}$$

The Jaccard coefficient can be interpreted as a measure of probability that an element in at least one of the sets is an element of both sets, and this coefficient has been shown to be a good metric for measuring overlap.

Combination of the variant of the Hungarian (Munkres) method described herein with Jaccard coefficients results in an ordering of matching options that takes into account local graph similarities (Jaccard) and maximum neighborhood intersections (Hungarian). It should be noted that once an exact MCES search starts, the assignment from G1 vertices to vertices of G2 will not simply follow this determined order. Rather, during the exact MCES search, every time a tentative assignment decision is made, the matching priorities of all vertices in the direct neighborhood of the assigned vertex are updated (reordered).

After determining the matching order and graph traversal order, an incomplete, short MCES run may be performed prior to execution of the exact MCES run. The goal of this short search is to collect a number of high scoring MCES solutions that are used to update the initially determined matching orders. The highest scoring solutions (max (|MCES|) of the short MCES search are inserted to the front of the set of the assignment options for every vertex.

The initially determined matching order (given by the Munkres (Hungarian) algorithm and Jaccard coefficients) comes after the new order established by the short MCES runs. The optimal number of high scoring MCES solutions to collect for the update of matching orders is 10-50, as described above, and in many cases 10 will be sufficient in the methods described herein.

After these preparatory steps, the exact MCES algorithm is run. This MCES algorithm is based on a depth-first tree search with backtracking and has been shown to be optimal on sparse labelled graphs, which are similar to the methyl-methyl NOE graphs encountered in this application.

Thus, the MCES algorithm as employed in the present invention may be portrayed in a high-level algorithmic overview as follows, based on that described by McGregor at page 30 thereof and modified as required by the present invention:

1. Set MARCS to contain all 1's; arcsleft : = q l ; bestarcsleft : = 0;
2. i : = 1; mark all nodes of Gz as untried for node 1;
3. repeat
4. if there are any untried nodes in G, to which node i of GI may correspond then
5. begin
6. xi : = one of these nodes; mark node xi as tried for node i;
7. refine MARCS on the basis of this tentative correspondence for node i;
7a. refine the order of priority of matching for all x > xi;
7b. store the refined orders of priority matching to the workspace associated with nodes x > xi;
8. if arcsleft ≥ bestarcsleft then
9. if i = p , then
10. begin take note of x1, x2, ..., x p , , MARCS; bestarcsleft : = arcsleft end
11. else
12. begin
13. store a copy of MARCS, arcsleft in the workspace associated with node i
14. i := i + 1 ;
15. mark all nodes of G, as untried for node i;
16. end
17. end
18. else
19. begin
20. i := i − 1
21. restore MARCS, arcsleft from the workspace associated with node i
22. end
23. until i = 0 where, in the above algorithmic overview:

if G1 has p1 nodes and q1 arcs and G2 has p2 nodes and q2 arcs, MARCS is a q1×q2 mapping matrix which contains a bit in position (r, s) indicating whether or not arc r in G1 is permitted to map to arc s in G2;

arcsleft is a variable which keeps track of the number of arcs which could still correspond in a node correspondence based on the current partial correspondence; whenever refinement of MARCS results in a row being set to zero (when two adjacent nodes in G1 have been mapped tentatively to two non-adjacent nodes in G2) arcsleft is decremented by 1 and whenever backtracking takes place arcsleft is restored to its previous value;

bestarcsleft is the best value of arcsleft currently obtained.

It should be noted that the final result of the exact MCES algorithm is not affected by the described heuristics for determining best starting point for the search and the best matching orders. However, these considerations are important determinants of the speed of convergence to the final set of solutions.

The VF2 and/or MCES algorithms are repeated as often as necessary to produce all possible mappings of G1 (or all connected subgraphs thereof) to G2 consistent with subgraph isomorphism and/or MCES (shown as step 205 with reference to the non-limiting illustration in FIG. 2) in order to then generate an output comprising all possible peak assignments, where a resonance peak is said to be "assigned" if at least one mapping can be generated which associates a vertex $V_1^{ij}$ with a vertex $V_2^{i}$ such that the resonance peak represented by $V_1^{ij}$ is attributable to an atom having a nucleus i which is represented by $V_2^{i}$. In some cases the assignments may be "ambiguous", i.e. the mapping of G1 and G2 does not converge upon a single solution but instead generates two or more possible assignments for at least one resonance peak represented by a vertex $V_1^{ij}$ such that $V_1^{ij}$ may be attributed equally plausibly to two or more vertices $V_2^{i}$ such that it cannot be determined unambiguously which specific individual nucleus i gave rise to the resonance peak represented by $V_1^{ij}$. The method of the invention generates an output comprising all possible peak assignments, including ambiguous assignments (i.e. all possible assignments for all peaks are given). Thus in step (vii) of the methods of the invention, for each possible mapping of a vertex $V_1^{ij}$ to a vertex $V_2^{ii}$ obtained in steps (iv) and (vi), a peak assignment is generated, wherein generating said peak assignment comprises attributing a resonance represented by said vertex $V_1^{ij}$ to an atom having a nucleus i which is represented by said vertex $V_2^{i}$. With reference to the non-limiting illustration in FIG. 2, this is shown at 206. Step (vii) may be performed by executing a code in a computer which generates the peak assignments as described herein. An assignment for any peak represented by a vertex $V_1^{ij}$ is said to be "confident" if there is only one possible mapping of $V_1^{ij}$ to $V_2^{i}$. Where multiple assignment options are found (i.e. where an ambiguous assignment exists) a score may be given to each peak, which is defined as the reciprocal of the total number of possible assignments for that peak. Therefore, for a confident assignment, where there is only one possibility, the score is one; for an ambiguous assignment with two possibilities, the score is 0.5; for an ambiguous assignment with three possibilities, the score is 0.33; and so on.

At the end, all of the maximum scoring assignment solutions generated by either of the two algorithms are collected, and an output for the user is provided (shown with reference to the non-limiting illustration in FIG. 2 at step 207). In the case where one peak (e.g. a $^1H$-$^{13}C$ correlation) is assigned to one atom, a confident assignment is obtained. Otherwise, each assignment possibility is given a score equal to the reciprocal of the number of assignment possibilities. Thus step (viii) of the methods of the invention comprises generating an output comprising all possible assignments from step (vii) of resonance peaks in the NMR spectrum to atomic nuclei in the molecule. Step (viii) may be performed by executing a code in a computer which generates said output as described herein.

Both the VF2 and the adapted MCES algorithm are exact and deterministic, i.e. they return a complete list of all assignment possibilities that account for subgraph isomorphism/MCES, and given the same input, return the same result every time they are executed. The output to the user is not one assignment, but all possible assignments for each peak that explain the maximum number of NOEs, which reveals where ambiguities exist in the assignments.

The MCES algorithm is slower than VF2, but it can find similarities yet remain tolerant to errors in both graphs involved in the matching. As such, the MCES algorithm is highly appropriate for the analysis of experimental NMR data.

The output generated in step (viii) is preferably generated by allocating a "Peak ID" to each resonance peak for which a peak assignment has been generated, and an "Atom ID" to each atom to which one or more peaks has been assigned. A 2D plot is then generated with "Peak ID" on a first axis (e.g. the y-axis) and "Atom ID" on a second axis orthogonal to the first axis (e.g. the x-axis). An example of such a system is shown in FIGS. 5b and 5d. For each peak assignment, a marker is shown at a coordinate in the axis system so defined (e.g. an xy coordinate), with the coordinate indicating the correspondence between Peak ID and Atom ID. Where a particular Peak ID has been assigned to more than one Atom ID, then two or more markers sharing the same Peak ID coordinate but having different Atom ID coordinates may be shown, as illustrated in FIG. 5d(ii) and (iii). Where more than one Peak ID has been allocated to a particular Atom ID, then two or more markers sharing the same Atom ID coordinate but having different Peak ID coordinates may be shown, as illustrated in FIG. 5d(ii) and (iii). In a preferred embodiment, the markers may be colour-coded or shaded with variations of a single colour or gradations between two colours (e.g. grayscale) with the colour-coding indicating the confidence of the assignment. The output may be displayed on an electronic display screen (e.g. a computer monitor, smartphone screen, tablet computer screen, e-reader device, or television screen) and/or displayed as a printout on paper.

Other automated NMR peak assignment methods known in the art, such as FLAMEnGO2.0 and MAP-XSII do not rely on graph-theoretical approaches and instead employ approximate Metropolis Monte Carlo optimization algorithms. However, such methods are approximate and can generate different outcomes and/or different levels of confidence for a given assignment. The methods of the present invention are advantageous due to their application of an intelligent graph-matching approach which generates all possible assignments on the basis of available resonance and structural data, including all possible ambiguous assignments. In this way the degree of confidence of any given assignment can be readily determined and further experimental research can be effectively targeted. For example, by tailoring site-directed mutagenesis to specific sites within a protein which are associated with ambiguous assignments by the methods of the present invention, the confidence of the assignment can be increased by comparing the assignment generated by the mutated protein with the assignment generated by the non-mutated protein. Such an approach represents a significant saving in time, experimental complexity, and cost compared to the laborious and frequently inaccurate single-site site-directed mutagenesis and/or divide-and-conquer approaches which are conventionally employed.

In a further aspect the present invention therefore provides the use of a maximal common edge subgraph matching algorithm in the assignment of resonance peaks in a nuclear magnetic resonance spectrum of a molecule.

The complexity of the methods of the invention, and the size of the search spaces generated for a large molecule, is such that the methods cannot accurately be performed purely manually or mentally. Computational assistance is therefore required and so in a preferred embodiment the method is a computer implemented method, e.g. the steps of the method are performed by processing circuitry. In an embodiment the processing circuitry comprises one or more computer processor(s).

As described elsewhere herein, each of steps (iii), (iv), (v), (vi), (vii) and (viii) may be performed by executing code in a computer. In certain preferred embodiments the code may, when executed, perform a plurality of such steps and preferably all of such steps, such that only a single command from a user is required to execute a plurality or all of such steps.

Thus, in certain embodiments, the invention provides a method of processing nuclear magnetic resonance (NMR) spectroscopic data, wherein a molecule of interest is subject to NMR and a nuclear magnetic resonance dataset $D_1$ is obtained in the form of an NMR spectrum of the molecule of interest, to assign resonance peaks in the NMR spectrum of the molecule of interest to atomic nuclei in said molecule of interest, comprising:

(i) obtaining said nuclear magnetic resonance dataset $D_1$ comprising a first set of data points ij representing resonance peaks arising from heteronuclear J-couplings between nuclei i and nuclei j, and a second set of data points jj representing through-space proximity correlations between individual nuclei j associated with the first set of data points ij;

(ii) obtaining a molecular structure dataset $D_2$ comprising data points representing a three-dimensional spatial arrangement of atoms in the molecule;

(iii) executing code in a computer which defines a magnetic resonance data graph $G_1=(V_1, E_1)$ and a structure graph $G_2=(V_2, E_2)$ wherein:

the set of vertices $V_1$ of $G_1$ comprises individual vertices $V_1^{ij}$ such that each individual vertex $V_1^{ij}$ represents an individual data point ij selected from the first set of data points;

the set of edges $E_1$ of $G_1$ comprises individual edges $E_1^{ij}$ such that each individual edge $E_1^{ij}$ represents a data point jj selected from the second set of data points and wherein each individual edge $E_1^{ij}$ connects two individual vertices $V_1^{ij}$ if nuclei j associated with the data points represented by those two vertices interact via a through-space proximity correlation;

the set of vertices $V_2$ of $G_2$ comprises individual vertices $V_2^i$ such that each individual vertex $V_2^i$ represents an atom in the molecular structure represented by dataset $D_2$, said atom having a nucleus i and said being bound to at least one atom having a nucleus j;

the set of edges $E_2$ of $G_2$ comprises individual edges $E_2^{ii}$ such that each individual edge $E_2^{ii}$ connects two individual vertices $V_2^i$ to one another if the atoms represented by said vertices are within a predetermined distance r relative to one another in the molecular structure represented by dataset $D_2$;

(iv) optionally executing code in a computer which compares $G_1$ and $G_2$ to identify subgraph isomorphism from $G_1$ to $G_2$ and generates all possible mappings of edges $E_1^{ij}$ to edges $E_2^{ii}$ and of vertices $V_1^{ij}$ to vertices $V_2^i$ which are consistent with said subgraph isomorphism;

(v) executing code in a computer which compares $G_1$ and $G_2$ to identify at least one maximal common edge subgraph (MCES);

(vi) executing code in a computer which generates all possible mappings of edges $E_1^{ij}$ to edges $E_2^{ii}$ and of vertices $V_1^{ij}$ to vertices $V_2^{i}$ which are consistent with said at least one MCES;

(vii) executing code in a computer which, for each possible mapping of a vertex $V_1^{ij}$ to a vertex $V_2^{ii}$ obtained in steps (iv) and (vi), generates a peak assignment, wherein generating said peak assignment comprises attributing a resonance represented by said vertex $V_1^{ij}$ to an atom having a nucleus i which is represented by said vertex $V_2^{i}$;

(viii) executing code in a computer which generates an output comprising all possible assignments from step (vii) of resonance peaks in the NMR spectrum to atomic nuclei in the molecule.

The methods in accordance with the present invention may be implemented at least partially using software e.g. computer programs. It will thus be seen that when viewed from further embodiments the present invention provides computer software specifically adapted to carry out the methods herein described when installed on a data processor, a computer program element comprising computer software code portions for performing the methods herein described when the program element is run on a data processor, and a computer program comprising code adapted to perform all the steps of a method or of the methods herein described when the program is run on a data processing system.

The present invention also extends to a computer software carrier comprising such software arranged to carry out the steps of the methods of the present invention. Such a computer software carrier could be a physical storage medium such as a ROM chip, CD ROM, RAM, flash memory, or disk, or could be a signal such as an electronic signal over wires, an optical signal or a radio signal such as to a satellite or the like.

It will further be appreciated that not all steps of the methods of the present invention need be carried out by computer software and thus from a further broad embodiment the present invention provides computer software and such software installed on a computer software carrier for carrying out at least one of the steps of the methods set out herein.

The present invention may accordingly suitably be embodied as a computer program product for use with a computer system. Such an implementation may comprise a series of computer readable instructions either fixed on a tangible, non-transitory medium, such as a computer readable medium, for example, diskette, CD ROM, ROM, RAM, flash memory, or hard disk. It could also comprise a series of computer readable instructions transmittable to a computer system, via a modem or other interface device, over either a tangible medium, including but not limited to optical or analogue communications lines, or intangibly using wireless techniques, including but not limited to microwave, infrared or other transmission techniques. The series of computer readable instructions embodies all or part of the functionality previously described herein.

Those skilled in the art will appreciate that such computer readable instructions can be written in a number of programming languages for use with many computer architectures or operating systems. Further, such instructions may be stored using any memory technology, present or future, including but not limited to, semiconductor, magnetic, or optical, or transmitted using any communications technology, present or future, including but not limited to optical, infrared, or microwave. It is contemplated that such a computer program product may be distributed as a removable medium with accompanying printed or electronic documentation, for example, shrink wrapped software, preloaded with a computer system, for example, on a system ROM or fixed disk, or distributed from a server or electronic bulletin board over a network, for example, the Internet or World Wide Web.

In an embodiment the present invention therefore provides a computer program product embodied on a computer readable storage medium for processing nuclear magnetic resonance (NMR) spectroscopic data of a molecule to assign resonance peaks in said NMR spectroscopic data to atomic nuclei in said molecule, said computer program product comprising:

(i) computer code for defining a magnetic resonance data graph $G_1=(V_1, E_1)$ from a nuclear magnetic resonance dataset $D_1$, wherein nuclear magnetic resonance dataset $D_1$ comprises a first set of data points ij representing resonance peaks arising from heteronuclear J-couplings between nuclei i and nuclei j in said molecule, and a second set of data points jj representing through-space proximity correlations between individual nuclei j in said molecule associated with the first set of data points ij, and wherein the set of vertices $V_1$ of $G_1$ comprises individual vertices $V_1^{ij}$ such that each individual vertex $V_1^{ij}$ represents an individual data point ij selected from the first set of data points; and wherein the set of edges $E_1$ of $G_1$ comprises individual edges $E_1^{ij}$ such that each individual edge $E_1^{ij}$ represents a data point jj selected from the second set of data points and wherein each individual edge $E_1^{ij}$ connects two individual vertices $V_1^{ij}$ if nuclei j associated with the data points represented by those two vertices interact via a through-space proximity correlation;

(ii) computer code for defining a structure graph $G_2=(V_2, E_2)$ from a molecular structure dataset $D_2$, wherein molecular structure dataset $D_2$ comprises data points representing a three-dimensional spatial arrangement of atoms in said molecule, and wherein the set of vertices $V_2$ of $G_2$ comprises individual vertices $V_2^{i}$ such that each individual vertex $V_2^{i}$ represents an atom in the molecular structure represented by dataset $D_2$, said atom having a nucleus i and said being bound to at least one atom having a nucleus j; and wherein the set of edges $E_2$ of $G_2$ comprises individual edges $E_2^{ii}$ such that each individual edge $E_2^{ii}$ connects two individual vertices $V_2^{i}$ to one another if the atoms represented by said vertices are within a predetermined distance r relative to one another in the molecular structure represented by dataset $D_2$;

(iii) optionally, computer code for comparing $G_1$ and $G_2$ to identify subgraph isomorphism from $G_1$ to $G_2$ and generating all possible mappings of edges $E_1^{ij}$ to edges $E_2^{ii}$ and of vertices $V_1^{ij}$ to vertices $V_2^{i}$ which are consistent with said subgraph isomorphism;

(iv) computer code for comparing $G_1$ and $G_2$ to identify at least one maximal common edge subgraph (MCES);

(v) computer code for generating all possible mappings of edges $E_1^{ij}$ to edges $E_2^{ii}$ and of vertices $V_1^{ij}$ to vertices $V_2^{i}$ which are consistent with said at least one MCES;

(vi) computer code for generating a peak assignment for each possible mapping of a vertex $V_1^{ij}$ to a vertex $V_2^{ii}$ obtained in steps (iv) and (vi), wherein generating said peak assignment comprises attributing a resonance represented by said vertex $V_1^{ij}$ to an atom having a nucleus i which is represented by said vertex $V_2^{i}$;

(vii) computer code for generating an output comprising all possible peak assignments of resonance peaks in the NMR spectrum to atomic nuclei in the molecule.

In a further aspect the present invention provides a computer program for configuring a computer to perform a method as herein described when said computer program is executed.

In the context of the present invention, a computer program for configuring a computer to perform a method as herein described comprises a set of computer-readable instructions which, when executed on one or more processors, cause the one or more processors to perform the steps of the method according to the invention.

In the context of the present invention the term "computer" may equally refer to a desktop computer, tablet computer, smartphone, laptop computer, supercomputer, or distributed computing system.

It could be beneficial to include as much NMR data in the processing method as possible; chemical shifts and paramagnetic relaxation enhancement are two commonly determined data sets. Methyl chemical shifts have a particularly low range of values in both the proton and carbon dimensions, which are frequently close to the statistical prediction accuracy of prediction algorithms. However, the inventors found that, when re-scoring assignments based on $^{13}CH_3$ chemical shift values predicted on the basis of protein structure using different protocols, even in highly conservative fashion (see FIG. 13), generally resulted in assignments which were confident but incorrect. Thus, it is preferable not to include chemical shift information.

Discrimination between different methyl residue types is accessible through producing protein samples with different labelling schemes and recording multiple HMQC spectra. For example, this can be obtained experimentally on wild-type proteins by preparing the sample with various available labelling schemes and comparing their spectra. One might expect residues whose proton chemical shift has been substantially shifted by local ring currents. In the benchmark tests, this did not appear to be the case. Merging the NOEs arising from two methyl groups of Leu and Val residues is, however, highly recommended (FIG. 5) and can be accomplished either by looking for intra-residue NOEs (via NOESY experiments with short mixing times) or, if using "divide and conquer", through a TOCSY experiment on uniformly $^{13}C$ labelled sample. PRE data can be highly valuable for providing assignments.

The invention will now be described in further detail with reference to the following non-limiting Examples and the Figures, in which.

Figure 3:
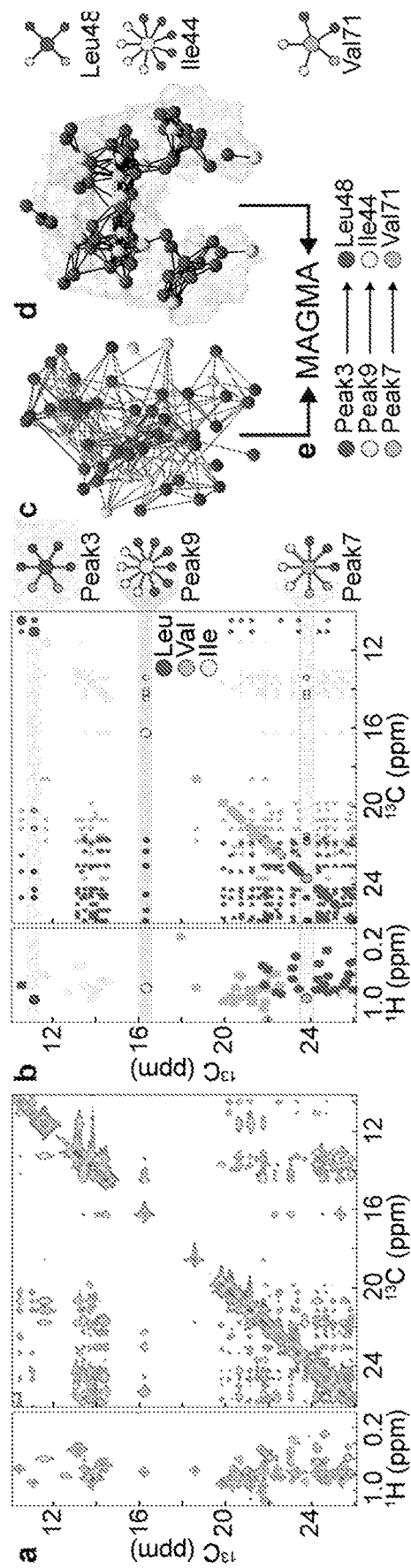

FIG. 3 illustrates an example of automated methyl resonance assignment using MAGMA (MAGMA is the name given by the inventors to an algorithmic implementation of a method of processing NMR data in accordance with the invention). (a): $^1H$-$^{13}C$ TROSY-HMQC spectrum and a 2D $^{13}C$-$^{13}C$ projection of a CCH-HMQC-NOESY spectrum from ATCase, recorded from a sample with [$^{13}CH_3$]-labelled methyl groups of Ile, Leu and Val residues in a highly deuterated background. In the case of Leu and Val, only one methyl group of the two is labeled for any one residue. The diagonal peaks in the NOESY spectrum correspond to the methyl peaks from the TROSY spectrum. Off-diagonal peaks reveal which methyl residues undergo significant cross-relaxation during the mixing time, where shorter range distances are expected to give higher intensity correlations (NOEs). (b): interpretation of a methyl-TROSY spectrum and a 3D $^{13}C$-HMQC-NOESY spectrum by MAGMA. Methyl resonances from different residue types are shown in different colours. Extraction of strips in the 3D or 4D NOESY spectrum (b, shaded) for each auto peak allows a network to be constructed showing which peaks have connection to which others. (c): The information from each resonance can be combined into a graph. (d): Similarly, methyl-methyl connections from the protein structure model can be derived, within a MAGMA-determined distance cut-off, and turned into a graph. (e): MAGMA applies the graph matching method of the invention to produce assignments.

Figure 4:
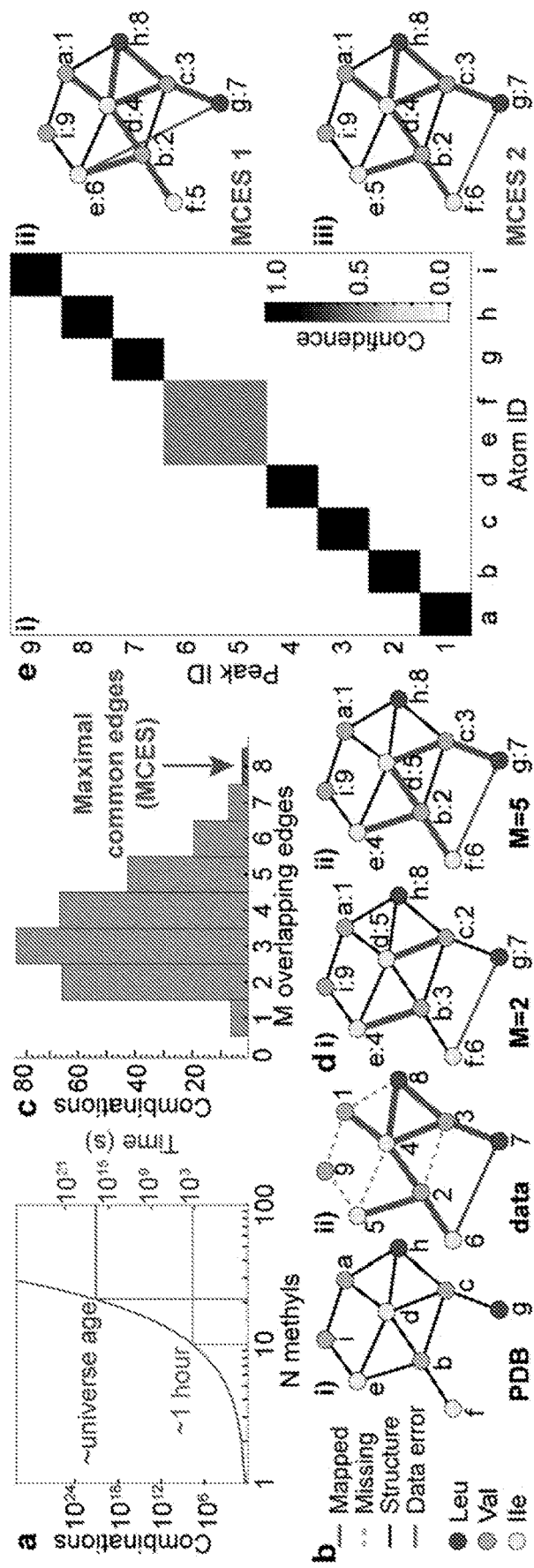

FIG. 4 illustrates the combinatorial nature of graph matching. (a): Each assignment takes $10^{-3}$ seconds to evaluate. In a problem involving only one type of residue, the combinations are given by N! and the total calculation time in seconds is given by (N!)×$10^{-3}$. The assignment of 10 residues by brute force would take 1 hour whereas if the number of residues exceed 21, the evaluation time exceeds the age of the universe (~$10^{17}$ seconds). (b): graph representation of an example of the assignment problem. (i) A structure (PDB) graph. (ii) a methyl-methyl NOE graph. The NOE graph is sparser in methyl-methyl connectivity (dotted lines) and contains an erroneous NOE that does not exist in the structure graph. The "correct" solution is shown, with NOEs shown corresponding to specific regions of the structure. (c): there are a total of 288 solutions, which can be sorted by the number of overlapping edges. The higher the number, the more NOEs are explained by the assignment. (d): Two example solutions are shown with M=2 (i) and M=5 (ii). (e): there are two maximum common edge graphs for this problem (i, ii) where M=8. These two solutions are shown where 7 residues are unambiguously assigned (darker shading), and two positions are ambiguous as they are structurally identical (lighter shading).

Figure 5:
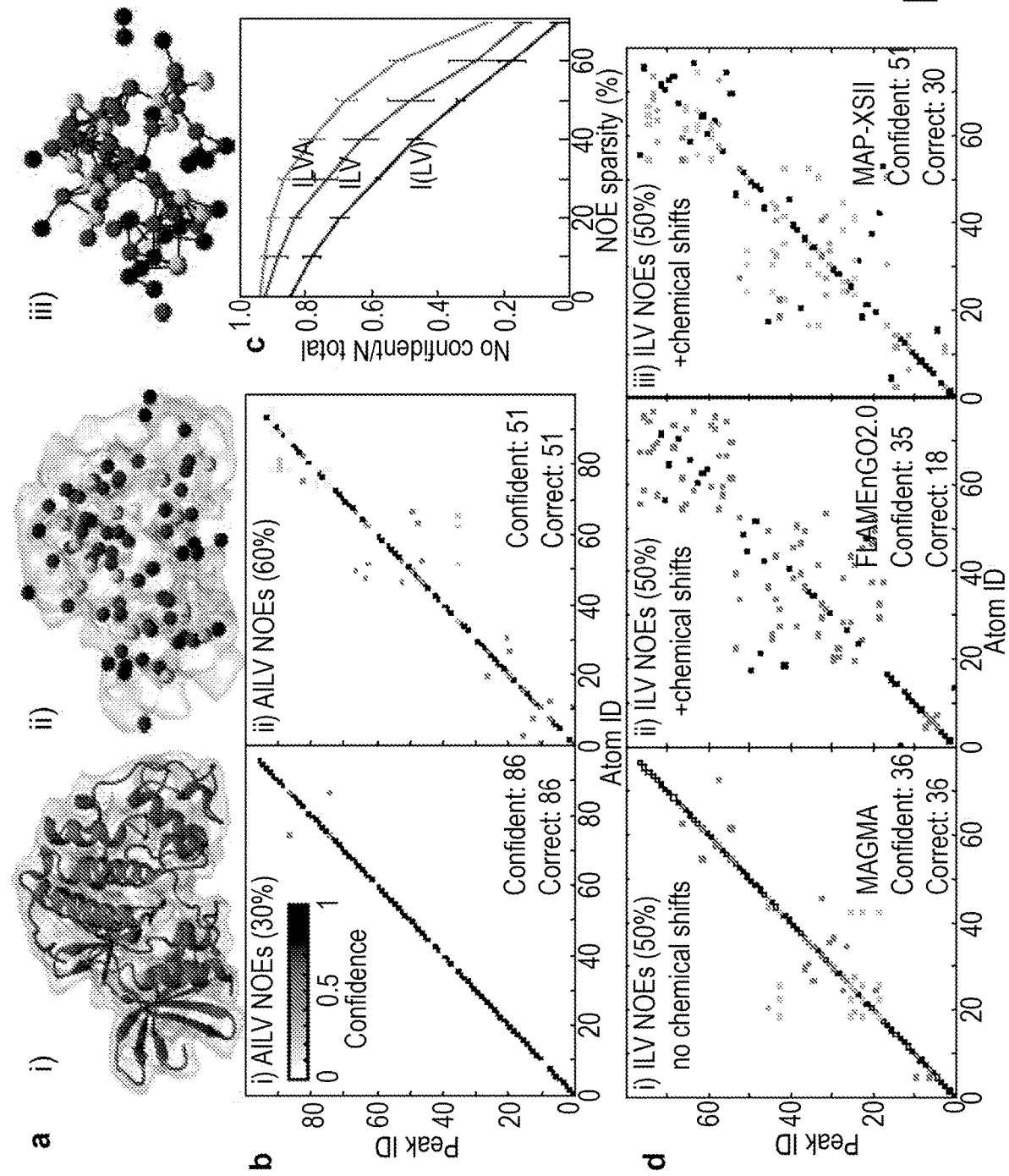

FIG. 5 illustrates the performance of MAGMA on synthetic data. (a): (i) secondary structure of CDK2. (ii) locations of Ile-δ1, Leu-δ1/δ2, and Val;-γ1/γ2 $^{13}C$ atoms are shown as spheres. iii) Atoms from ii) within 8 Å distance are connected by edges revealing a structure graph. (b) Ala, Ile, Leu and Val synthetic inter-methyl NOE graphs were generated from structure graph by removal of 30% and 60% of inter-methyl edges for i) and ii), respectively (methods), with Ala, Leu, Val and Ile methyl groups labelled (AILV). The corresponding performance of MAGMA is shown, where the correct assignment lies on the diagonal. (c) A comparison of the performance of MAGMA on a number of randomly-simulated synthetic datasets with different labelling strategies AILV and ILV) and different sparsity. I, L, V and A denote Ile, Leu, Val and Ala labelling. (LV) denote that the L and V residues are not distinguished. Even with highly sparse data, a number of confident assignments are expected. Increasing the number of different types of labels increases the success of MAGMA. (d) Performance comparison of MAGMA (i) to FLAMEnGO2.0 (ii) and MAP-XSII (iii) on a single representative 50% sparse ILV inter-methyl NOE data graph. In general, MAGMA gives more confident assignments than the other programs and all assignments were correct.

Figure 6:
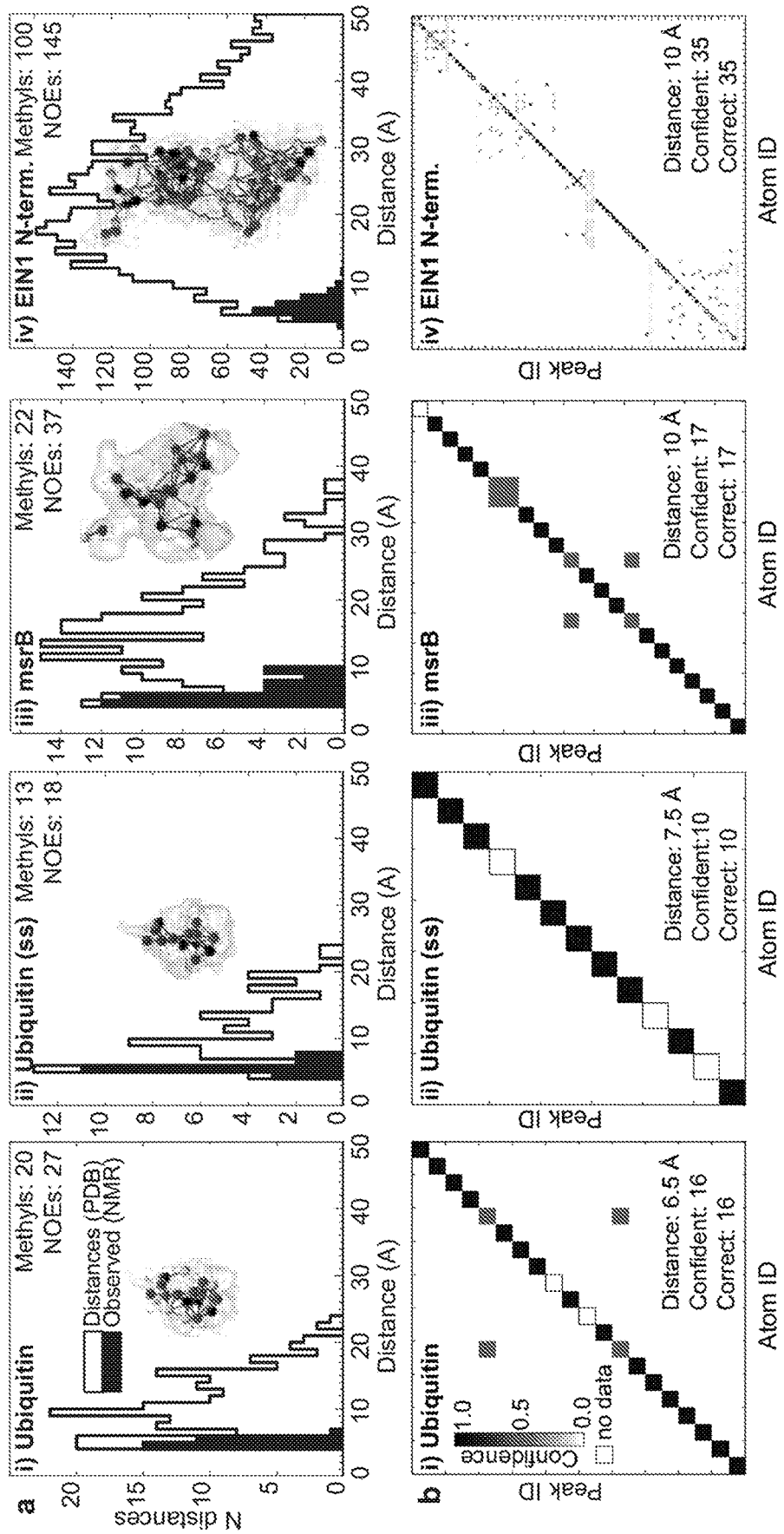
Figure 6:
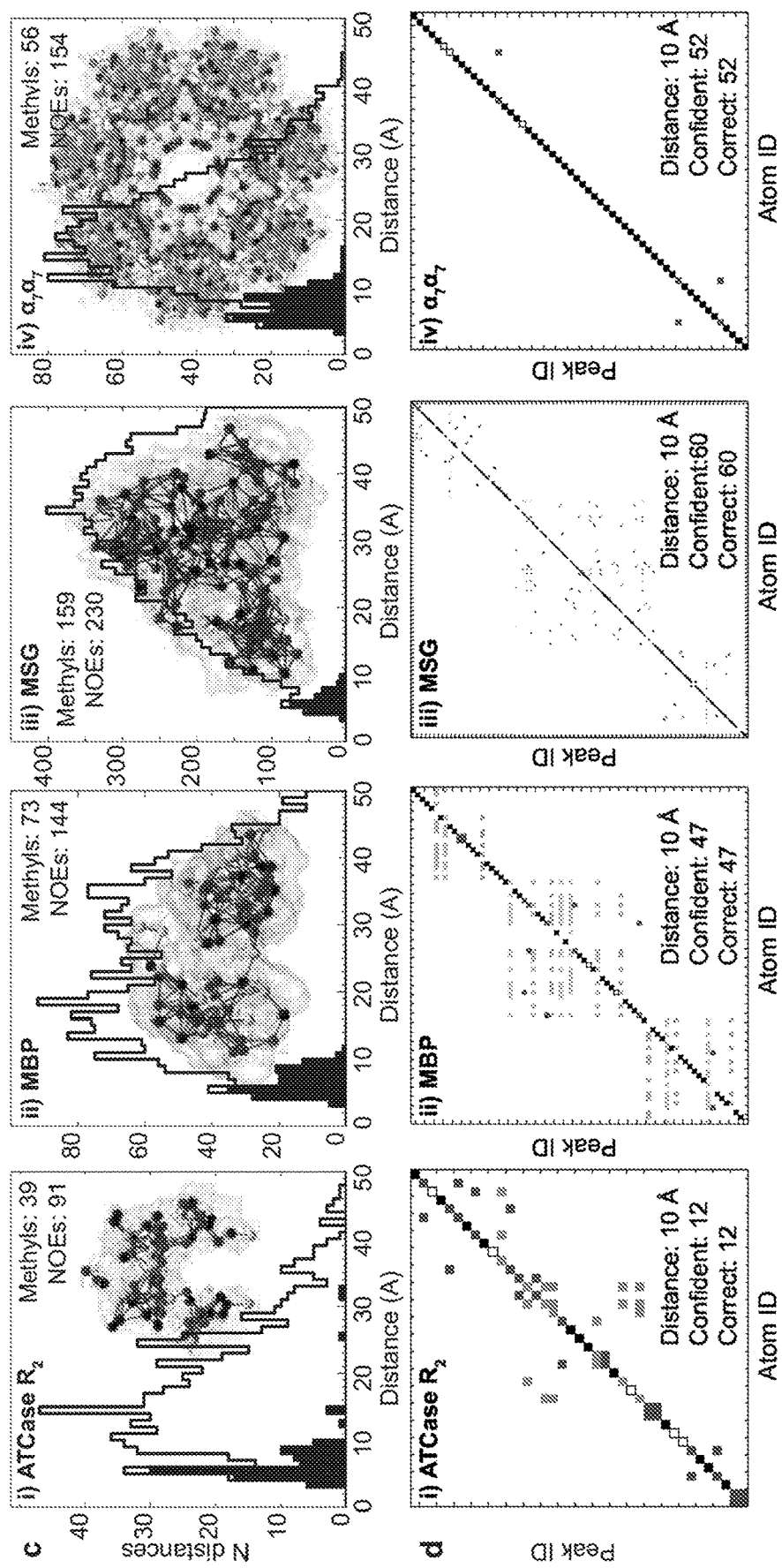

FIG. 6 illustrates the performance of MAGMA on experimental data (a/c) Histograms of inter-carbon distances (white bars) are calculated from crystal structures of the indicated proteins together with those experimentally observed (black bars). Structures of each protein are shown with the Ile, Leu, and Val groups indicated. (b/d) Assignment results from MAGMA. Methyl resonances are on the y-axis (Peak ID), whereas methyl-containing residues (Atom ID) are on the x-axis. A heat scale indicates the confidence in assignments, where confidently assigned methyl resonances are in black. Experimentally obtained methyl assignments lay along the diagonal. The total number of confidently assigned methyl groups is indicated, alongside the number of correctly assigned resonances. MAGMA performance was faultless. Where ambiguous assignments are possible, the 'correct' result was always one of the options.

Figure 7:
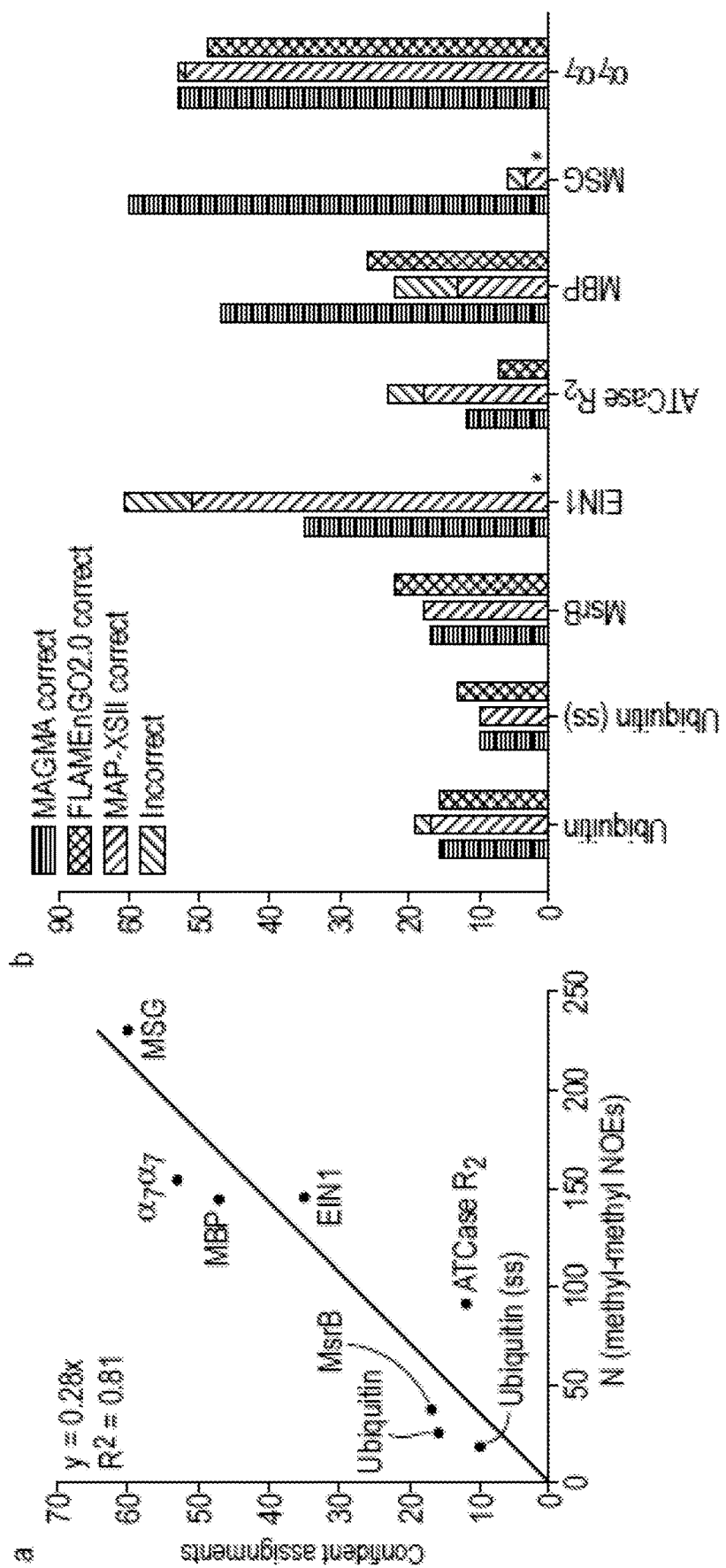

FIG. 7 illustrates the performance of MAGMA compared to alternative protocols. (a) The number of confident assignments from MAGMA in our benchmark versus the total number of inter-methyl distance restraints used in the calculation. Performance depends on the data sparsity, the labelling scheme and the specific fold of each protein. On average over the benchmark, 3.6 restraints were required for each confident assignment. The gradient of the line and R2 correlation coefficient are indicated. (b) Performance comparison of MAGMA to alternative automated methyl assignment protocols. For each protein in the benchmark, the total number of assigned methyl resonances is shown for MAGMA (black), FLAMEnGO2.0 (dark grey), and MAP-XSII (light grey). The confident assignments that were incorrect are indicated. FLAMEnGO2.0 returned no confident assignments for EIN1 and MSG (*). MAGMA tends to both obtain more confident assignments especially on large targets (MBP, MSG, $\alpha_7\alpha_7$), and provides perfect accuracy on this benchmark.

Figure 8:
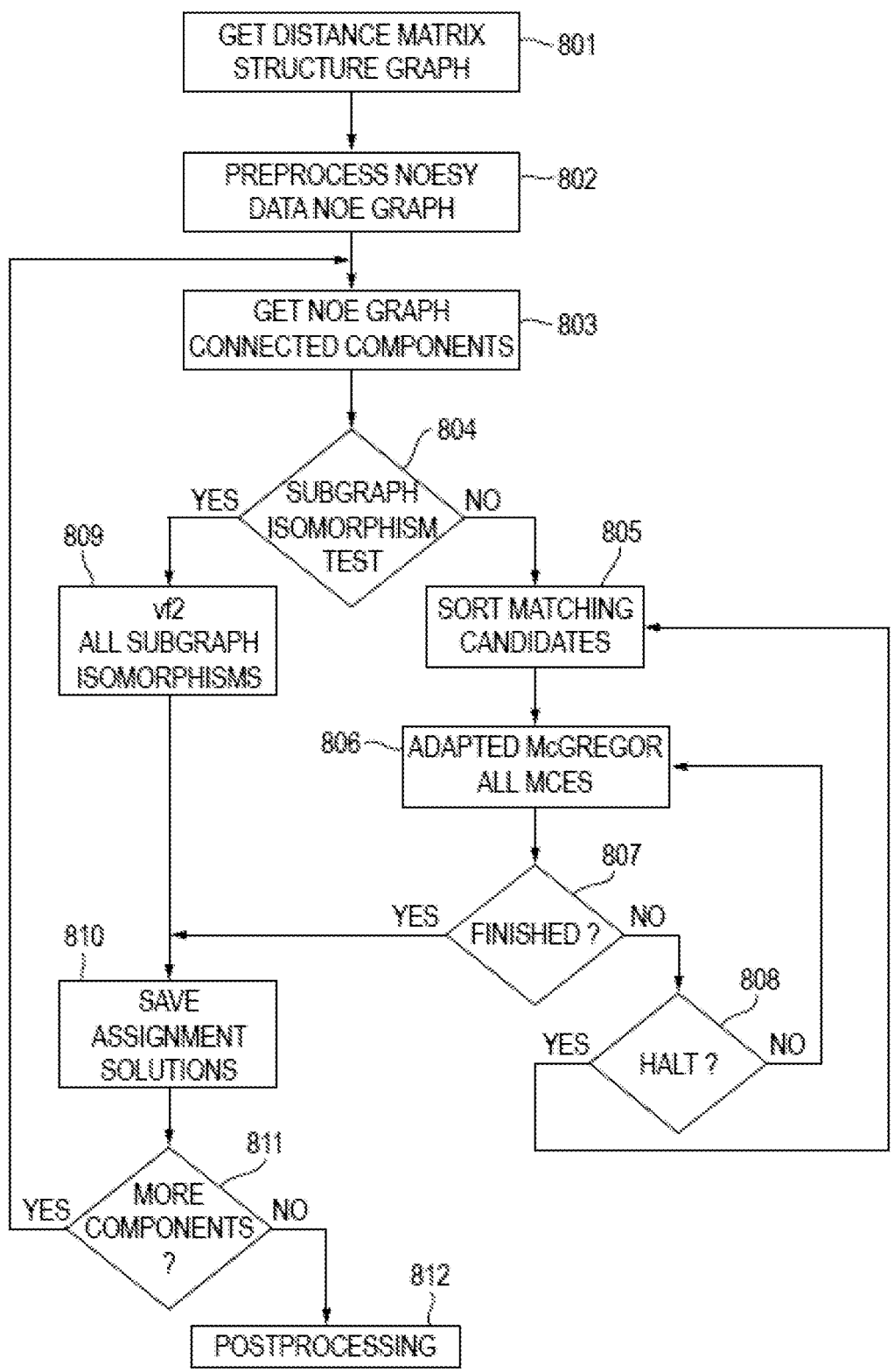

FIG. 8 illustrates the MAGMA workflow, as explained further in Example 2.

Figure 9:
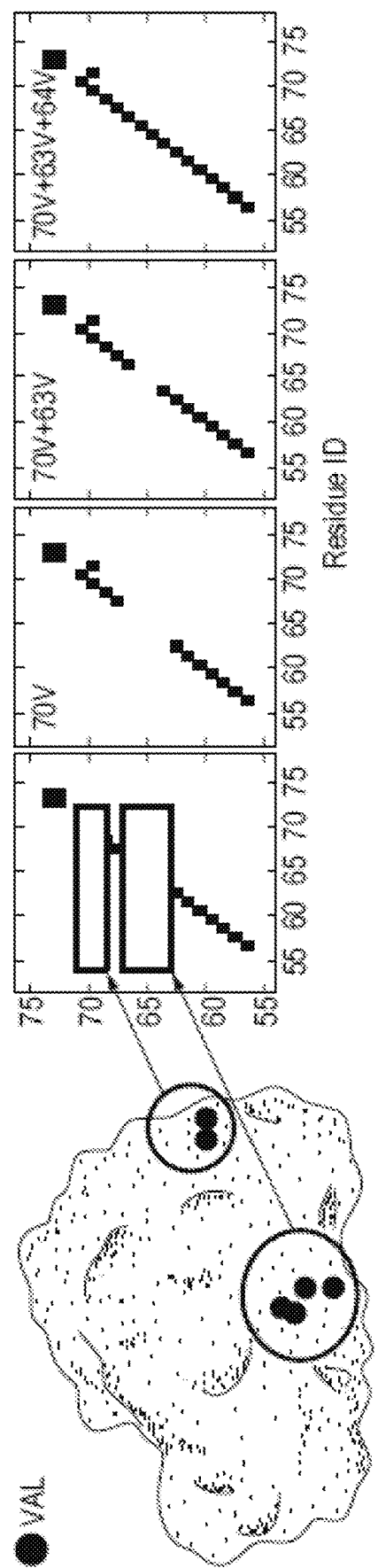

FIG. 9 illustrates using MAGMA to target specific residues for site-directed mutagenesis, to refine an ambiguous assignment. Where ambiguity is detected in assignments, it is desirable to obtain additional experimental data to further refine the assignment. In the case of a 50% sparse ILV inter-methyl data set (FIG. 5d), a cluster of six residues, 63, 64, 65, 66, 69 and 70 were identified by MAGMA to be interchangeable. Consecutive point mutations of the three most ambiguous residues (70V, 63V, 64V) provides 5 further confident assignments.

Figure 10:
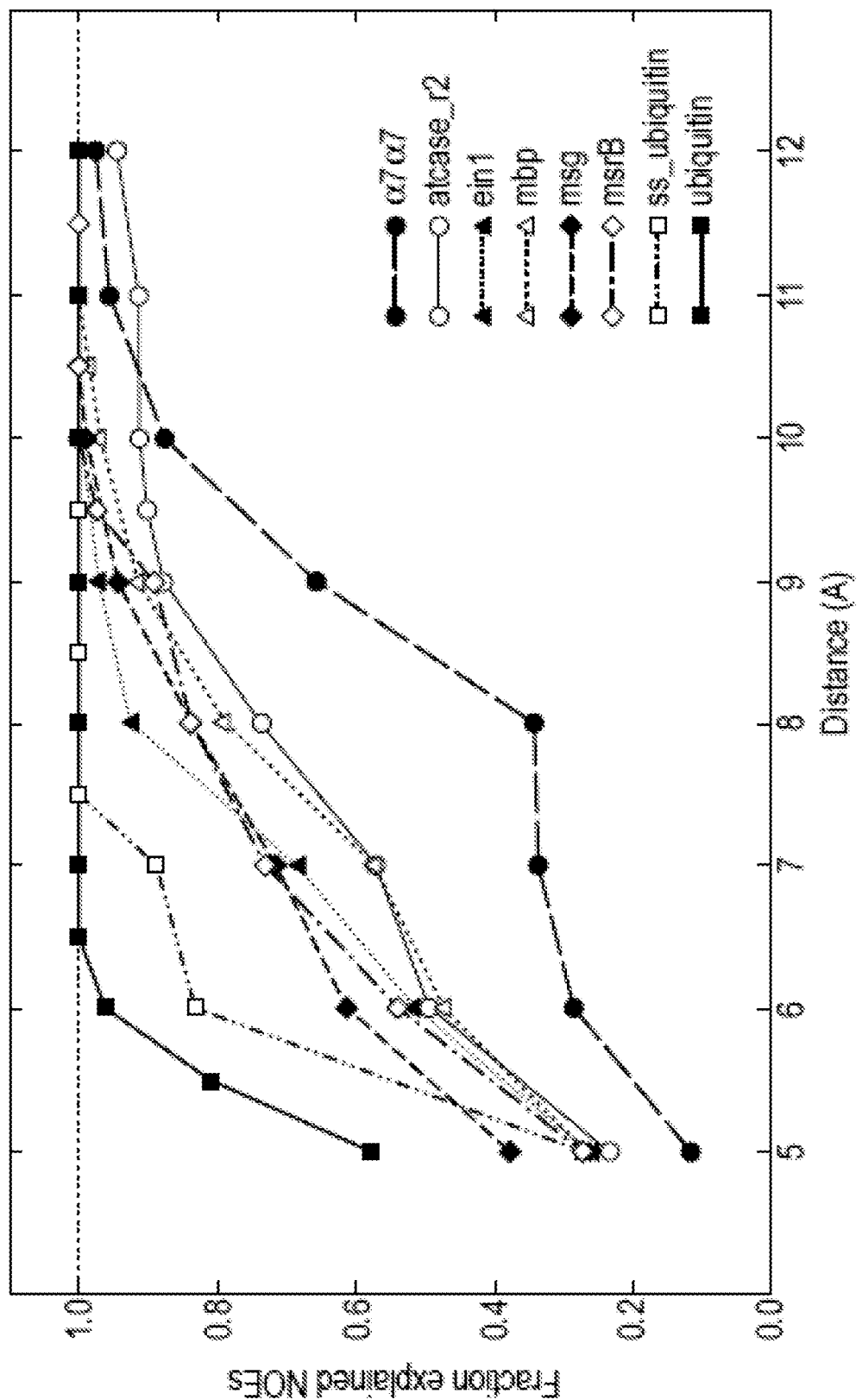

FIG. 10 illustrates the determination of the appropriate distance threshold for the calculation. The plots in FIG. 10 showing how the fraction of restraints MAGMA uses (methyl-methyl NOEs) i increasing as a function of the distance threshold used in the calculation. This figure shows that in many cases a 10 Å distance threshold is suitable to explain a high fraction of NOEs. If all NOEs are explained at 10 Å, the user can consider lowering the threshold and checking whether all NOEs are still explained. If that is the case the lowest distance at which all NOEs are explained is used (as with ss-ubiquitin and ubiquitin). Otherwise, the calculation is simply run at 10 Å (as with the remaining benchmarks).

Figure 11:
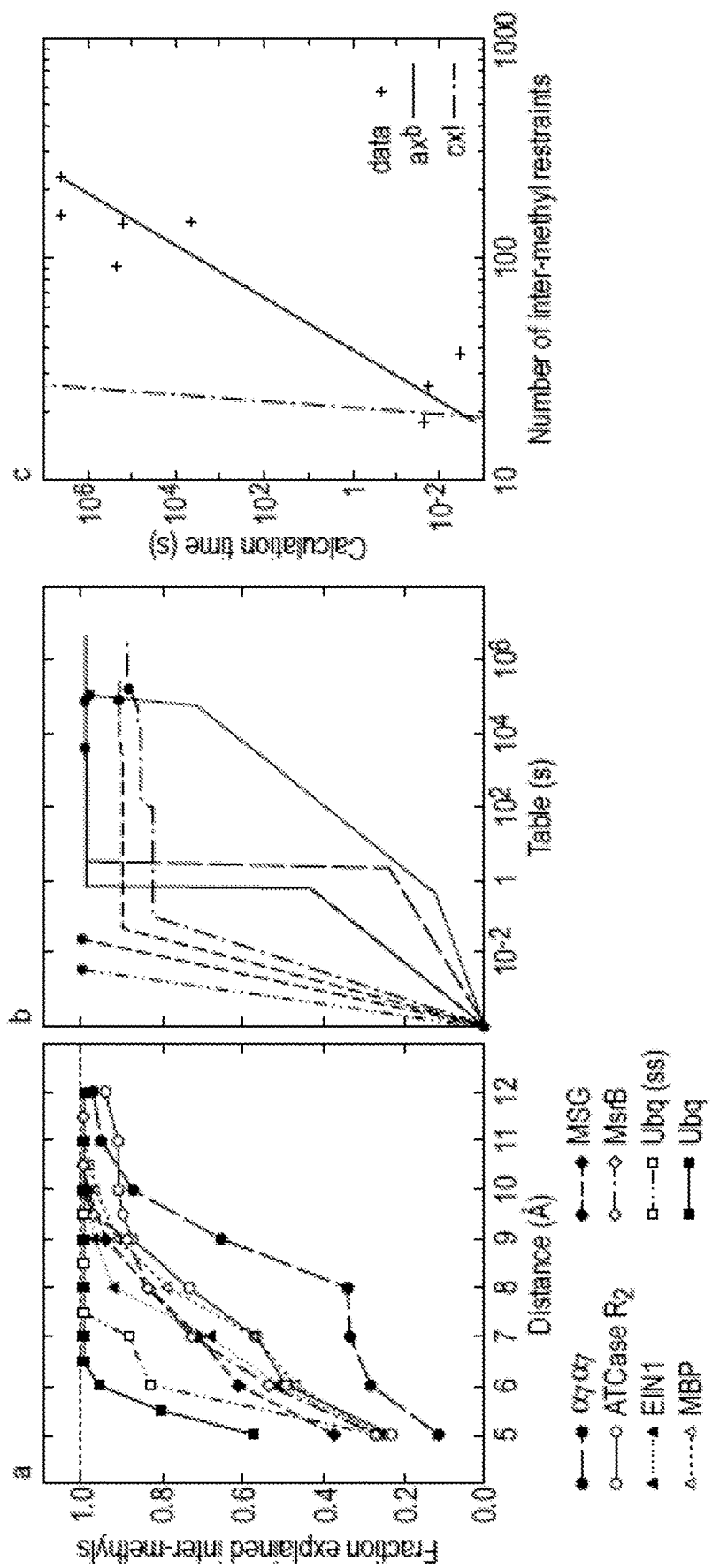

FIG. 11(a): Shown are the results of short runs of MAGMA that determine the size of the MCES acquired early in the calculation with different distance thresholds. The distance chosen by the program is the shorter of either the size required for the MCES to match 100% of the inter-methyl restraints, or 10 Å. The empirical rule implemented in MAGMA provides 100% accuracy in our benchmark without introducing unnecessary additional heterogeneity. (b) The total time taken for the calculation (Table 1). The circle indicates the point at which no further change was found in the final assignment outputs, including a complete ambiguity description. This took a maximum of 2 days $(\alpha_7\alpha_7)$. (c) MAGMA execution times in our benchmark scaled with $3.2\times10^{-14}N^{8.5}$ (black line), where N is the total number of inter-methyl restraints. For comparison, the theoretical worst-case scenario, N! is also indicated (grey line.)

Figure 12:
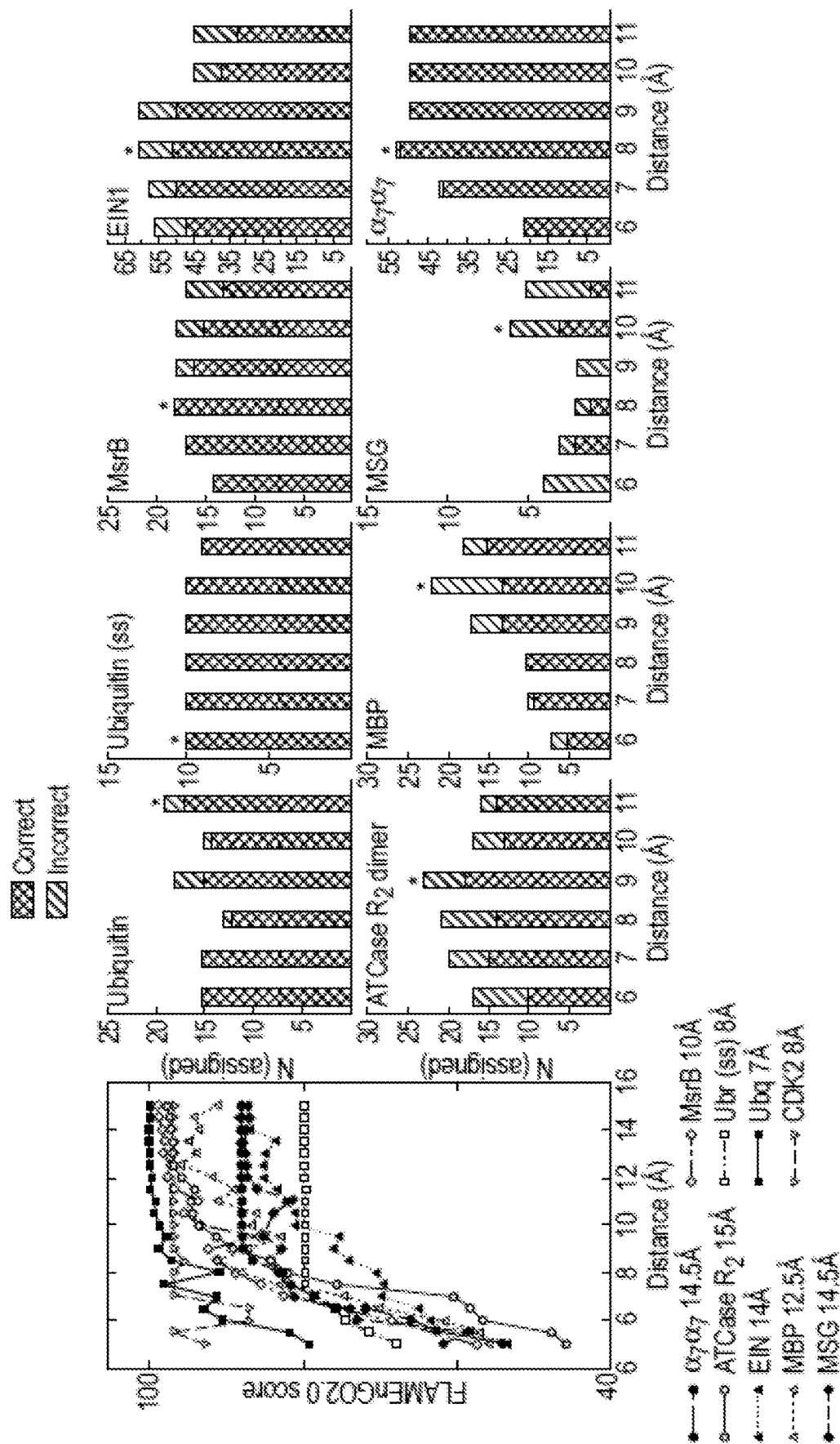

FIG. 12: Determination of the optimal distance for calculation when using FLAMEnGO2.0 (b) and MAP-XSII (a) . . . (a) For FLAMEnGO2.0, the
score provided was followed as a function of distance threshold. The recommended distance is that where the curve starts to reach a plateau. The calculation is then repeated 100 times at this optimal distance in order to obtain a final result. The final distances for each protein are specified in the legend. (b) MAP-XSII requires that the program is run at a number of distance thresholds, and the distance that provides the most confident assignments is taken as the final value. Results are shown here for the benchmark, indicating the distance reported with an asterisk. The number of incorrect assignments at each distance threshold is indicated.

Figure 13:
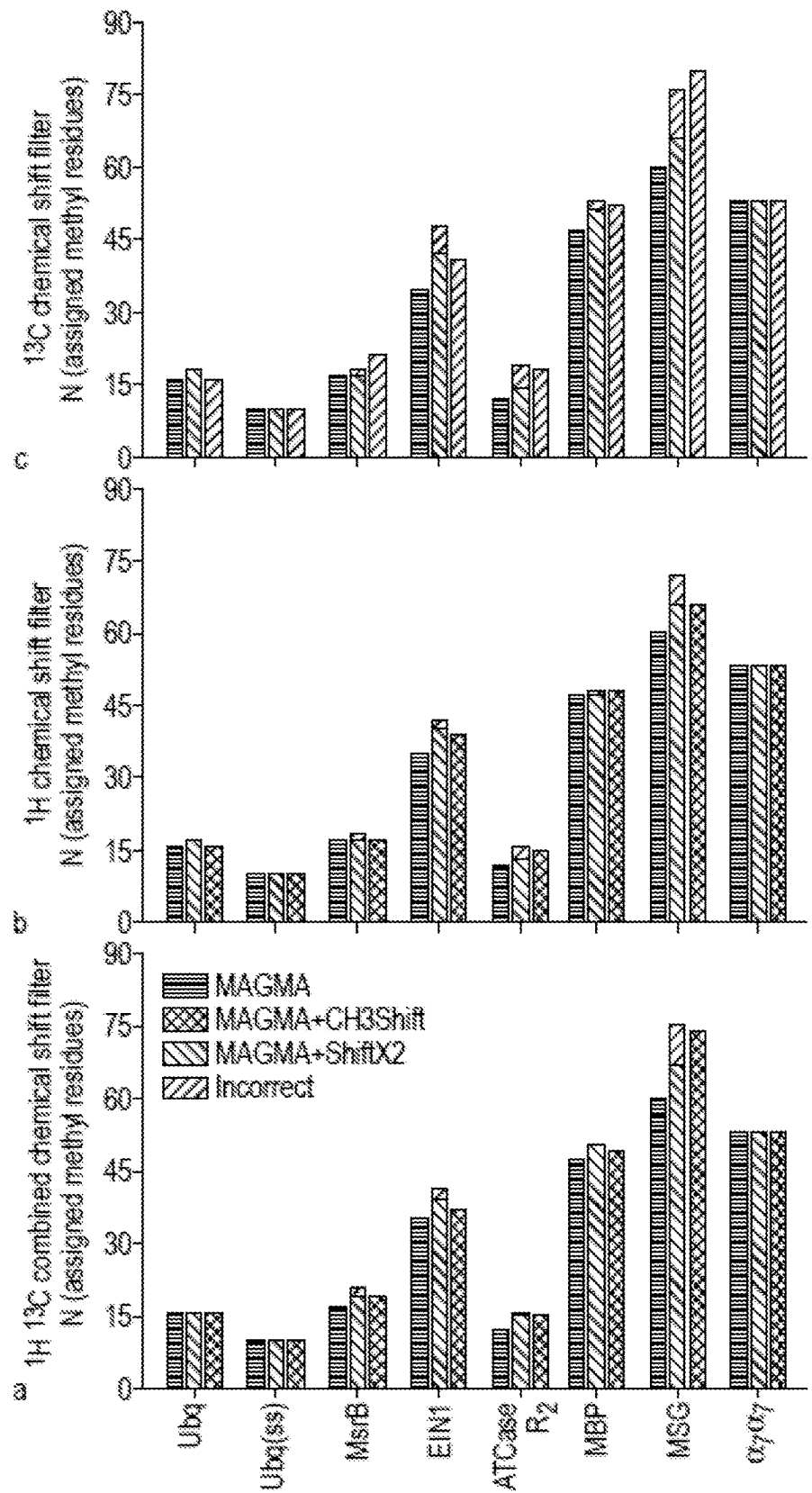

FIG. 13 The inclusion of chemical shift information to refine MAGMA assignments. Assignment results obtained by MAGMA were rescored based on $^1H$-$^{13}C$ chemical shifts predicted from the structure using ShiftX2 and $CH_3$Shift. Scoring was applied conservatively (Supplementary S.4). Where one member of the ambiguous set was found to have a chemical shift within the statistical prediction accuracy for the predictor, and the others possibilities were outside of this, the one identified assignment choice was taken to be a new confident assignment. This generally increased the number of confident assignments, extending to resonances that do not generate inter-methyl restraints, but at a significant cost of accuracy. In all cases other than ubiquitin, a protein used to train the chemical shift prediction algorithms, the new confident assignments were as likely to be correct as incorrect. This was the case if we used either $^1H$ (a) or $^{13}C$ (b) chemical shifts, or the two combined (c). The narrow range of chemical shifts obtained from methyl groups makes them challenging to predict accurately.

Figure 14:
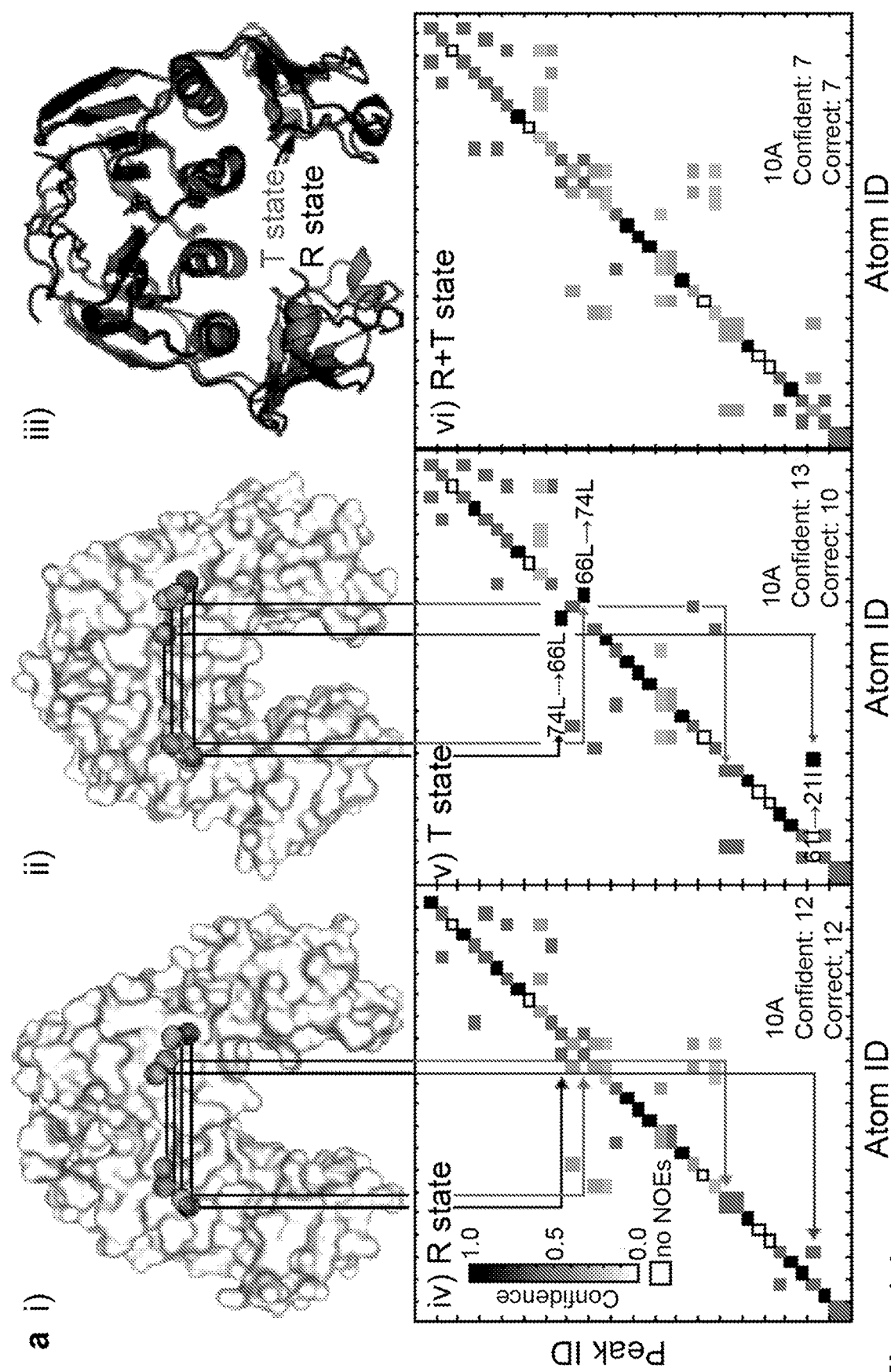
Figure 14:
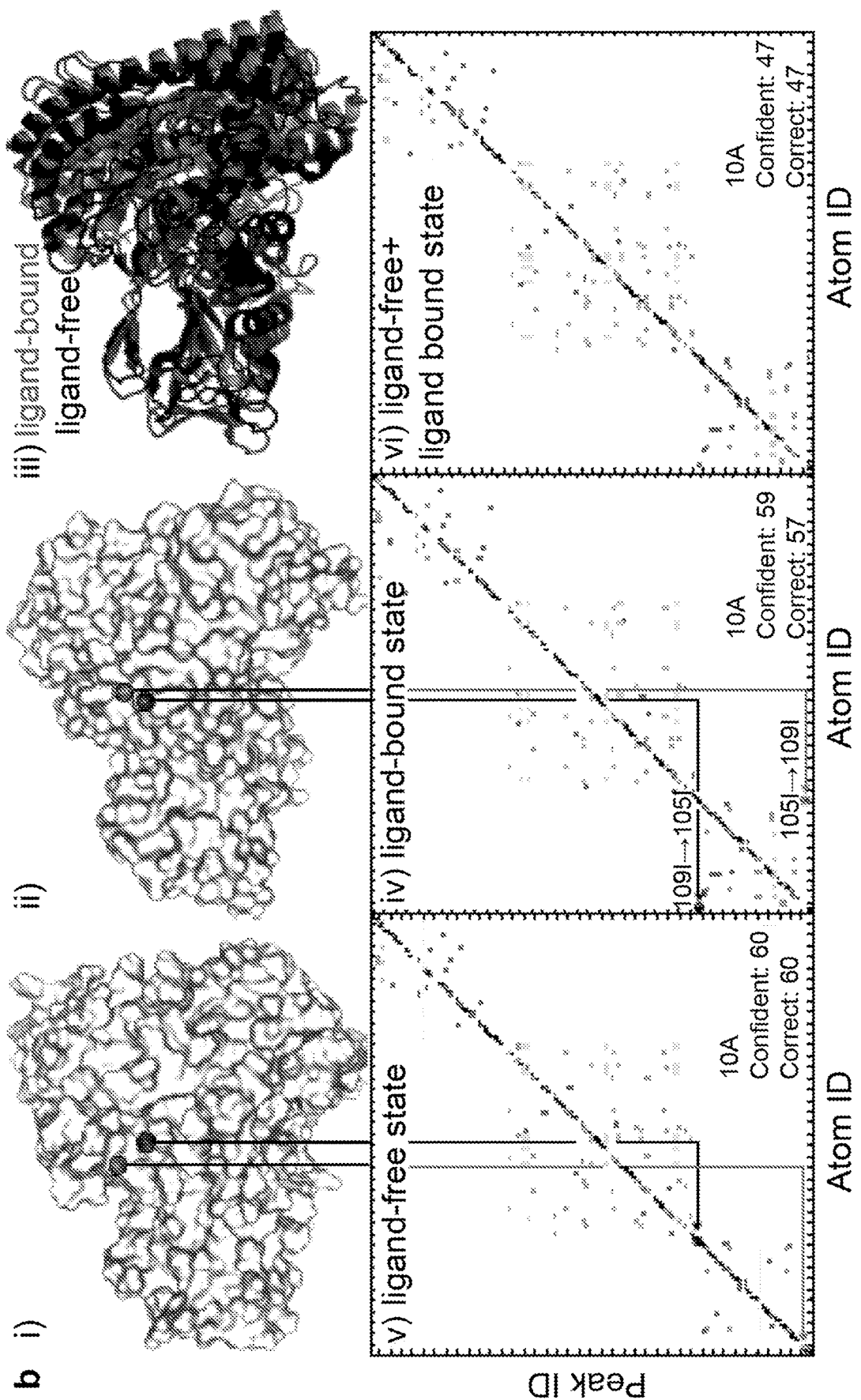

FIG. 14 Application of MAGMA to discriminate between two possible structures. For successful operation of MAGMA, the structure used must reflect that present during the NMR measurements. In the case of ATCase R2 dimer (a) MSG (b) and HSP90 (c), two classes of structure are available in the PDB (i). MAGMA gives each of these slightly different confident assignment results (ii). In a conservative case, we recommend pooling these results, which lowers the number of confident assignments (ii). Notably, 4 sites in ATCase and 2 sites in MSG are revealed with confident, but different assignments between the two structures. Performing a single point mutagenesis of one of these sites allows a user to completely distinguish the two structures. This reveals that the R state of the ATCase R2 dimer, the ligand-free form of MSG and the open conformation of Hsp90 were analysed.

EXAMPLE 1

Figure 1:
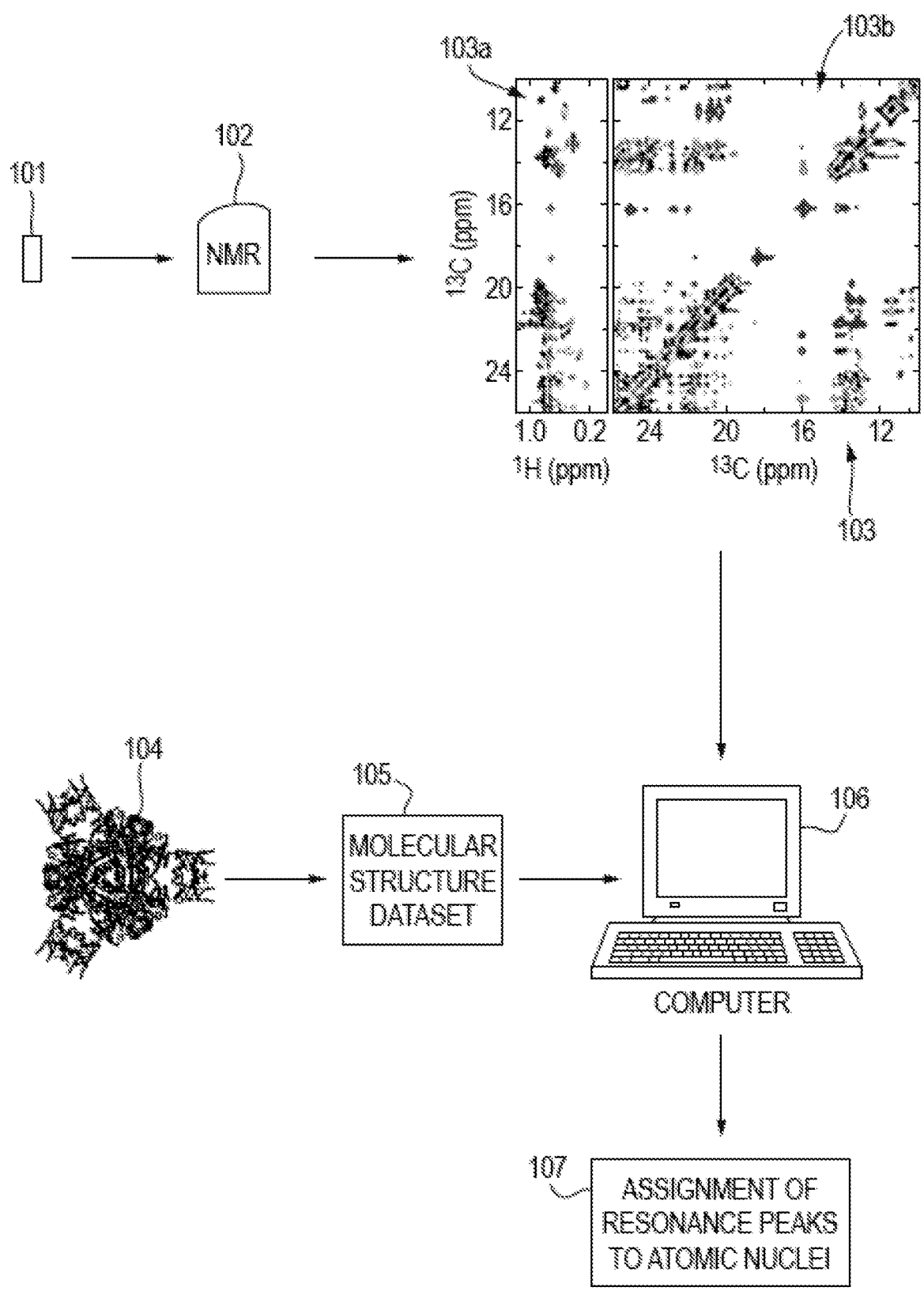
FIG. 1 is a schematic of an exemplary method of processing NMR data to assign resonance peaks in accordance with the methods of the present invention.
Figure 2:
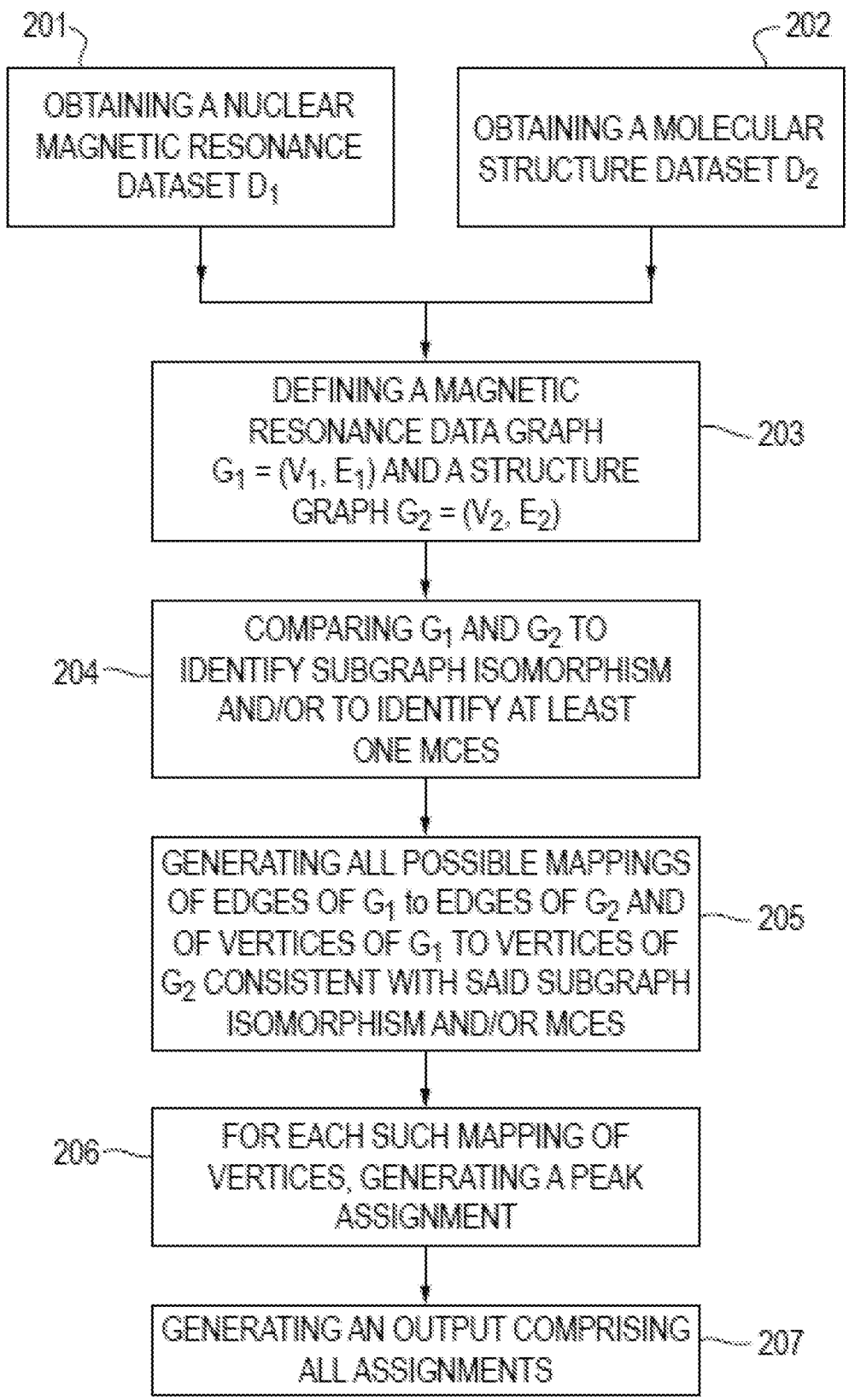
FIG. 2 is a block diagram of an exemplary workflow for processing NMR data to assign resonance peaks in accordance with the methods of the present invention.

With reference to FIGS. 1 and 2, exemplary methods of processing NMR data in accordance with the invention will now be described.

FIG. 1 is a schematic of an exemplary method of processing NMR data to assign resonance peaks in accordance with the methods of the present invention.

Sample 101 is subjected to NMR testing 102 and an NMR dataset $D_1$ 103 is thereby obtained. In FIG. 1 an illustrative and non-limiting example of such a dataset 103 is represented in graphical form. It will be appreciated by one of ordinary skill in the art that this is simply a conventional visual way of presenting NMR data, employed in this Example merely for ease of understanding. The skilled person would appreciate in light of the present disclosure that the underlying data may be employed in the inventive methods described herein without the need to generate such a visual representation.

In the illustrative dataset 103 shown in FIG. 1, the dataset arises from an NMR experiment in which a $^1$H-$^{13}$C TROSY-HMQC spectrum 103a and a $^{13}$C-$^{13}$C CCH-HMQC-NOESY spectrum 103b were recorded for the enzyme aspartate carbamoyltransferase (ATCase).

However, other NMR experiments and pulse sequences, other molecules of interest, and other combinations of NMR-active nuclei, may be employed as described elsewhere in the present disclosure. The data presented in visual form as 103a are an example of a first set of data points ij representing resonance peaks arising from heteronuclear J-couplings between nuclei i and nuclei j. The data presented in visual form as 103b are an example of a second set of data points jj representing through-space proximity correlations (here: nuclear Overhauser interactions) between nuclei j associated with the first set of data points ij.

Molecular structure dataset $D_2$ 105 is obtained, representing the three-dimensional spatial arrangement of atoms in a molecule 104 (for illustrative purposes, a structural formula for ATCase is shown for consistency with the data presented as 103). This may be obtained by homology modeling or by acquiring a predetermined crystal structure from a database such as the PDB, for example. Where homology modeling is performed this may be done in computer 106 or separately.

Code executed in computer 106 defines magnetic resonance data graph $G_1$ on the basis of NMR dataset 103 and structure graph $G_2$ on the basis of molecular structure dataset 105 employing a graph-matching algorithm as described elsewhere herein which compares $G_1$ and $G_2$ to generate all possible mappings of edges and vertices in $G_1$ to edges and vertices in $G_2$ which are consistent with subgraph isomorphism and/or at least one MCES (where only one MCES exists, all such mappings for such MCES are generated; where more than one MCES exists, all such mappings for each such MCES are generated). For each possible mapping, the code then generates a peak assignment such that resonances in molecular structure dataset $D_1$ 103 are attributed to nuclei of atoms in molecular structure dataset $D_2$ 105.

Once all possible mappings and assignments have been generated, an output 107 is generated which indicates all possible assignments.

The code executed in computer 106 in order to generate mappings, assignments, and output 107, will be configured to perform a graph-matching method as described herein. An algorithm such as "MAGMA", which is described in further detail in subsequent Example 2, may be employed and thus the code executed in computer 106 may be written to perform such an algorithm when executed.

FIG. 2 is a block diagram of an exemplary workflow for processing NMR data to assign resonance peaks in accordance with the methods of the present invention. This illustrates in further detail the steps of the graph-matching algorithms employed in the methods of the invention, such as those which may be executed by computer 106.

In step 201, a nuclear magnetic resonance dataset $D_1$ (such as dataset 103 shown in FIG. 1) is obtained, corresponding to an embodiment of step (i) of the methods described herein. As described in further detail elsewhere herein, this may be obtained by performing an NMR experiment on a molecule for the express purposes of generating the assignment, or may be a pre-recorded NMR dataset. In step 202, a molecular structure dataset $D_2$ (such as dataset 105 shown in FIG. 1) is obtained, for example from a database such as the PDB or via homology modeling as described herein. This corresponds to an embodiment of step (ii) of the methods described herein.

Steps 203 to 207 are then performed to process the NMR data and generate peak assignments. Such steps may be performed according to any of the embodiments as described herein, and may for example be performed in a computer (e.g. computer 106 in FIG. 1) by executing a suitable code. At step 203 a magnetic resonance data graph $G_1$ and a structure graph $G_2$ are defined, each comprising vertices and edges which correspond to features in the relevant datasets as described in further detail elsewhere in the present disclosure. This corresponds to an embodiment of step (iii) of the methods described herein. At step 204 $G_1$ and $G_2$ are compared to identify subgraph isomorphism (corresponding to an embodiment of optional step (iv) of the methods described herein) and/or at least one MCES (corresponding to an embodiment of step (v) of the methods described herein). At step 205, corresponding to an embodiment of step (vi) of the methods described herein, all possible mappings are generated which are consistent with the at least one MCES identified in 204 (where subgraph isomorphism was identified in step 204 all possible mappings consistent with said subgraph isomorphism are also generated, and so in this respect 205 may also correspond to an embodiment of step (iv) of the methods described herein). At step 206, corresponding to an embodiment of step (vii) of the methods described herein, the mappings generated at step 205 are used to generate peak assignments, and in step 207 (corresponding to an embodiment of step (viii) of the methods described herein) an output is generated comprising all assignments from step 206.

The steps 203 to 206 and optionally 207 may if desired be performed in a computer programmed with code which, when executed, processes the datasets accordingly. An algorithm named "MAGMA" has been devised by the inventors which performs such steps and therefore a computer may be employed to implement the MAGMA algorithm. This is explored in further detail in Example 2.

EXAMPLE 2: "MAGMA"

MAGMA is an algorithmic method of processing NMR data in accordance with the methods of the invention. The flowchart for "MAGMA" is shown in FIG. 8. This is the implementation of the methods of the invention which was used to generate the data in the remaining Examples.

In this illustrative and non-limiting Example, as input, MAGMA takes a set of side-chain atoms from a protein structure (corresponding to a molecular structure dataset $D_2$ as described herein) to create an input structure graph (FIG. 3d) (corresponding to a structure graph $G_2$ as described herein) and a set of methyl-methyl NOEs, extracted from 3D or 4D NOESY spectra (thus corresponding to a nuclear magnetic resonance dataset $D_1$ as described herein) that have been filtered based on criteria for reciprocity, intensity, and signal-to-noise to define a magnetic resonance data (NOE) graph (FIG. 3d) (corresponding to a magnetic resonance data graph $G_1$ as described herein).

The core of MAGMA consists of two exact and deterministic graph matching algorithms: the VF2 subgraph isomorphism algorithm (this is an illustrative implementation of optional step (iv) of the methods of the invention) and a maximal common subgraph algorithm (this is an illustrative implementation of step (v) of the methods of the invention) adapted from the backtracking algorithm described by McGregor. The implementation of the VF2 algorithm was accessed via a Python interface to the igraph high performance graph library python-igraph0.765. Using Python, we designed and implemented an adapted MCES algorithm based on that of McGregor, as described above and illustrated in FIG. 8. MAGMA determines the set of graph matching solutions that comprise the MCES. This allows MAGMA to generate all combinations of methyl assignments that satisfy the maximal number of the methyl-methyl NOE restraints (an illustrative implementation of steps (vi) and (vii) of the methods of the invention), which therefore highlights assignment ambiguities. Analyses and plotting of graphs were supported by the Python package networkx-1.966 and the Mayavi application.

MAGMA functions as follows, described with reference to the numerals in the flowchart of FIG. 8:

Structure Graph Generation (Flowchart Reference 801):

This corresponds to an illustrative implementation of defining a structure graph $G_2$ in accordance with step (iii) of the methods of the invention.

In the following Examples herein, unless indicated differently, pseudo-atoms were created by averaging the coordinates of the two methyl carbon atoms for both Leu δ and Val γ groups to create a pseudo-atom. The matrix of all Euclidean distances between Ile-$δ_1$, Leu-pseudo δ, Val-pseudo γ, and when applicable, alanine β, threonine γ and methionine ε, was computed from protein coordinates (provided in a PDB file). If more than a single distance was measured for any of the methyl-methyl pairs, the matrix was reduced to the set of shortest distances between any two carbon atoms. Next, the distance heuristic was applied and only the distances smaller or equal to the defined distance threshold were kept. This final set of distances defined a set of non-weighted edges for the structure graph, in which the methyl carbon atoms were used to define a set of vertices. Each vertex was assigned a label according to its amino acid type. In calculations in which discrimination between Leu and Val was not assumed (FIG. 5c), the same label was assigned to methyls of both Leu and Val residue types.

Preprocessing of NOESY Data (Flowchart Reference 802):

This embodies one illustrative example of the optional step of filtering the magnetic resonance dataset $D_1$ prior to defining graph $G_1$. Such filtering steps are described in further detail elsewhere in the present disclosure.

Processed 3D- and 4D-HMQC NOESY spectra were analyzed using Sparky for the r2 dimer of ATCase and the N-terminal domain of EIN, respectively. For other proteins in the benchmark, the spectral analyses were performed by others and the resultant NOE peak lists were provided. The following rules were applied to obtain confident methyl-methyl NOE assignments:

1) NOE reciprocity, i.e. mutual cross-peaks existed between two auto-peaks
2) Similar normalized cross-peak intensity (90%) and signal-to-noise ratio Normalized cross-peak intensity and signal-to-noise ratio were calculated in accordance with the detailed description of the invention.

Data heights and noise threshold were determined by Sparky software for analysis of NMR spectra. In the obtained NOE lists for which data heights (or calculated peak intensities) were missing, solely the NOE reciprocity rule was applied to filter methyl-methyl NOEs. The $^1H$-$^{13}C$ frequencies from methyl-TROSY HMQC spectra and the filtered NOE lists were used to define the set of vertices and the set of edges of the methyl-methyl NOE graph.

NOE Graph Generation (Flowchart Reference 802):

This corresponds to an illustrative implementation of defining a magnetic resonance data graph $G_1$ in accordance with step (iii) of the methods of the invention.

Within MAGMA, $^1H$-$^{13}C$ frequencies from methyl-TROSY HMQC spectra and the filtered methyl-methyl NOEs were converted to an adjacency matrix of an NOE graph. The vertices of the graph were labelled according to the amino acid type. If the assignments for the two methyl groups (pro-R and pro-S) within a given Leu or Val residue were known, then a single Leu or Val residue was used to join the methyl-methyl NOEs from both methyl peaks, thereby creating a single vertex in NOE graph. The residue types were added as being known a priori, a requirement that can be accomplished through inspection of the chemical shifts (e.g. discriminating Ile resonances from Leu resonances), or by preparing specifically labeled samples (e.g. to discriminate Leu from Val resonances). When the resonances of Leu and Val types cannot be distinguished, MAGMA supports giving the same label for Leu/Val $^1H$-$^{13}C$ resonances, albeit with higher ambiguity from the collapse of two labels into one.

NOE Graph Analysis (Flowchart Reference 803):

This corresponds to an illustrative implementation of the optional feature of decomposing $G_1$ into non-intersecting connected subgraphs prior to steps (iv)/(v) of the method of the invention, as described in further detail elsewhere herein.

MAGMA analysed connectivity of every NOE graph to check if the graph was disconnected. Disconnected NOE graphs were decomposed into their connected components (connected NOE subgraphs) and their cardinality (number of vertices) was determined. The connected NOE subgraphs were ordered according to their cardinality (from the highest to the lowest) and were henceforth treated separately.

Subgraph Isomorphism Testing (Flowchart References 804, 809):

This corresponds to an illustrative implementation of optional step (iv) of the methods of the invention.

Subsequently to the steps described above (structure graph generation, preprocessing of NOESY data, NOE graph generation, and NOE graph analysis), the SI test was iteratively performed on each of the connected NOE subgraphs according to the aforementioned order.

If a subgraph passed the SI test, it was then matched to a structure graph by the VF2 algorithm, which returns all mapping solutions that result in SI. Those subgraphs that did not pass the SI test are consequently collected for graph matching by the adapted MCES algorithm (see below).

Before the exact MCES search was executed, each of the subgraphs that did not result in SI (or, if no subgraphs were present, the entire NOE graph) was passed through a protocol that determined:

1. Optimal matching order (vertices of an NOE graph to vertices of a structure graph)
2. Optimal order of the traversal of vertices in an NOE (sub)graph Determining the optimal orders for 1. and 2. is critical for obtaining a high starting scores in an exact MCES search. Moreover, optimal ordering results in significant reduction of the search space of the exact search, as the high initial MCES scores eliminate completion of any partial assignment that would lead to lower scores. Together, the optimal matching and traversing account for efficient pruning of the search tree and faster convergence of the exact MCES search.

Sorting Matching Options Prior to MCES Search (Flowchart References 804,805) and Ordering the Visits of Nodes in NOE (Sub)Graphs and Iterative Protocol for the Improvement of the Initial MCES Score (Flowchart References 805, 806, 807, 808):

These are preliminary stages of one illustrative implementation of step (v) of the methods of the invention.

Optimal matching order refers to ordering a set of vertices of structure graph associated with each vertex of an NOE sub(graph). The set comprised all possible assignment options for a particular NOE vertex, i.e. every assignment option for a particular $^1$H-$^{13}$C resonance in a methyl-TROSY spectrum. The adapted MCES algorithm of the invention supported associating the ordered list of assignment options to each vertex of an NOE (sub)graph. The order of the vertices in the set was the order in which different assignment options should be tried. In MAGMA, sorting of the sets was determined by a variation of the Hungarian method for the assignment problem (Munkres algorithm), combined with a Jaccard similarity coefficient, as described in the detailed description of the invention.

The exact MCES algorithm constructed the search tree starting from a vertex in an NOE (sub)graph. From a given starting point (root), the order of traversal of vertices of an NOE graph during the search was found to significantly impact the starting scores of the exact MCES search. In order to determine the most optimal starting point (vertex of an NOE graph) a single iteration of the MCES search was performed from every vertex of an NOE (sub)graph, and the obtained scores (size of first found MCES) were used to determine the best starting vertex. The highest scoring, first found MCES comprised the optimal starting point for MAGMA. The order of the rest of the vertices from the root was determined through breadth-first tree search.

After determining the matching order and NOE graph traversal order, MAGMA performed an incomplete, short MCES run prior to execution of the exact MCES run. The goal of this short search was to collect a number of high scoring MCES solutions that are used to update the initially determined matching orders. The highest scoring solutions (max (|MCES|)) of the short MCES search were inserted to the front of the set of the assignment options for every NOE vertex. The initially determined matching order (given by Munkres (Hungarian) algorithm and Jaccard coefficients) came after the new order established by the short MCES runs. We determined that the optimal number of high scoring MCES solutions to collect for the update of matching orders was 10.

It should be noted that the final result of the exact MCES algorithm was not affected by the described heuristics for determining best starting point for the search and the best matching orders. However, these considerations were important determinants of the speed of convergence to the final set of solutions.

Exact MCES Search (Flowchart References 806, 807, 808):

This is a further stage in the illustrative implementation of step (v) of the methods of the invention. Once the order of the matching priorities and optimal traversal of NOE graph had been determined as described above, the exact MCES algorithm was applied.

MAGMA Scoring (Flowchart References 809, 810, 806, 807):

This corresponds to an illustrative implementation of steps (vi) and (vii) of the methods of the invention.

At the end of its protocol, MAGMA joined all assignment solutions that comprised subgraph isomorphisms (in the case of VF2) and/or MCES (adapted McGregor), and thereby associated each methyl (vertex in the methyl-methyl NOE graph) to a set of atoms (vertices in the structure graph) to which it was uniquely assigned over a set of all solutions. For each peak, the set of all possible structure graph (PDB) assignments were then found. If multiple assignment options were found, the score given to each peak was defined as the reciprocal of the total number of possible assignments for that peak (FIGS. 5, 6). Therefore, for a confident assignment, where there is only one possibility, the score was 1. The score therefore provided an indication of the degree of ambiguity or confidence of the assignment of any given peak.

EXAMPLE 3: A SIMPLIFIED PROBLEM

To illustrate how graph matching solves the assignment problem, all solutions were obtained to a relatively simple problem with nine methyl-labelled residues as a function of the number of common edges (i.e. explained NOEs, FIG. 4*c*). The data graph contained fewer edges than the structure graph, and a deliberate error was introduced. Due to the inclusion of the erroneous restraint, the data graph was not subgraph isomorphic to the structure graph and so the VF2 algorithm could not be applied. Out of the 288 possible assignments, only two, which comprise the MCES, had the maximum possible number of edges (NOEs) that are common to both graphs (FIGS. 4*c* and *e*). This provided 7 confident assignments and 2 that could be interchanged as they were structurally identical.

EXAMPLE 4: PROOF-OF-PRINCIPLE

To demonstrate the effectiveness of MAGMA, a series of proof-of-principle calculations using simulated data were performed to examine how different levels of inter-methyl NOE sparsity and amino acid labelling schemes influenced the accuracy and ambiguity of methyl assignments (FIG. 5).

The 34 kDa human Cyclin-dependent kinase 2 (CDK2) (PDB:2C60)(FIG. 5*a*) was chosen as an investigative target, and the maximum distance threshold r for simulated NOEs was set to 8 Å. Several common methyl labelling schemes were employed, as described in the figure caption.

Different methyl-methyl NOE sparsity levels were simulated by removal of a subset of edges from the CDK2 structure graph. Here, 0% sparsity corresponds to the case where all distances below the specified threshold were included in the calculation (i.e. the maximum number of edges). The ratio of the number of NOEs removed to the total possible number of NOEs then defines the sparsity. Edges were removed by random sampling according to the following distribution: the probability of removing an edge was given by:

$$\frac{r_i^6}{\sum r_i^6}$$

where $r_i$ is the distance of any given edge (i). Hence, the edges corresponding to longer distances are removed with a higher probability. As the precise result from MAGMA depends on exactly which NOEs have been inputted, for each amino acid labelling scheme and the NOE sparsity percentage, MAGMA was run on three different subsets of edges, generated by changing the seed of the random number generator. This enabled calculation of the mean and the standard deviation of the number of confidently assigned methyls for a given NOE sparsity (FIG. 5c).

NOE data with varying sparsity levels were simulated such that shorter-distance NOEs were retained with a greater probability than long range NOEs. The results show that the correct assignment solution was always sampled within the set of solutions generated by MAGMA (FIG. 5b, d). In addition, MAGMA did not produce a confident assignment that was incorrect.

As expected, an increase in NOE sparsity resulted in an increase in the number of methyls that have multiple assignment possibilities (FIG. 5b, c, d). Different NOE restraints and amino acid labelling schemes were tested in order to determine if these parameters influenced the number of confident (non-ambiguous) assignments (FIG. 5c). The results showed that the largest percentage of confident assignments were generated when Ile, Leu, Val, and Ala residues were methyl-labelled and when the assignments of the two pro-R and pro-S methyl groups from a particular Leu or Val residue were known (FIG. 5c, ILVA). As implied above, having more restraints between as many different types of residue was beneficial for assignment.

EXAMPLE 5: COMPARISON TO OTHER APPROACHES

We compared the performance of MAGMA to two other freely available automated assignment approaches, FLAMEnGO2.014 and MAP-XSII15 (FIG. 5d). Unlike MAGMA, these additionally utilise chemical shift data, which MAGMA does not use. For a performance comparison, predicted chemical shifts were supplied using either ShiftX2 or CH3Shift, with each method yielding similar results. The results from a challenging data graph simulated at 50% sparsity with Ile-δ, Leu-δ, and Val-γ methyl labelling provide a representative performance comparison of the three algorithms. The number of correct/incorrect assignments was 36/0 in the case of MAGMA. FLAMEnGO2.0 and MAP-XSII provided 18/17 and 30/21 correct/incorrect assignments, respectively (FIG. 5, FIG. 12). These results demonstrate that MAGMA can provide accurate and reliable methyl assignments.

EXAMPLE 6: APPLICATION TO AMBIGUOUS ASSIGNMENTS

For a subset of the methyls that have ambiguous assignments, the ambiguity arises from structural equality of vertices in the NOE graph, where two nodes can be exchanged but the number of satisfied NOEs does not change. Nevertheless, the ability of MAGMA to reveal ambiguity in the assignment of some methyls is valuable for an NMR spectroscopist, as it highlights the protein residues/regions for which more experimental information is required, for example, by targeted SDM (site-directed mutagenesis).

Where an assignment provided by MAGMA reveals multiple possibilities, vertices can be exchanged and still explain the maximum number of inter-methyl distance restraints. This is valuable information that highlights regions within the protein where additional data should be sought. To illustrate how this information can be used, we show that in a 50% sparse ILV dataset, three single point mutations of the most ambiguous residues provides five new confident assignments (FIG. 9). MAGMA allows any known assignments to be specified, which reduces potential ambiguity of unknown assignments and can lead to a significant increase in the final number of confident assignments.

EXAMPLE 7: TESTING OF MAGMA ON EXPERIMENTAL NOE DATA

MAGMA was tested against a benchmark of data obtained from 3D or 4D NOESY spectra of methyl-labelled proteins, where methyl-TROSY assignments had been previously determined and cross-validated with other techniques (FIG. 6, Table 1). The benchmark proteins were: Ubiquitin (Ubq), methionine-R-sulfoxide reductase B protein (MsrB), the N-terminal domain of $E.$ $coli$ Enzyme I (EIN1), a dimer of regulatory chains of aspartate transcarbamoylase from $E.$ $coli$ (ATCase r2), maltose binding protein (MSB), malate synthase G (MSG) and the double-α7-ring of the 20S proteasome core particle ($\alpha_7\alpha_7$).

This benchmark was, to the best of the inventors' knowledge, the largest assembled benchmark for testing automatic methyl assignment programs. The benchmark proteins display diversity in molecular mass, shape, amino acid labelling, and data sparsity.

The distribution of NOEs as a function of distance is shown with the total distances possible within the molecule (FIG. 6a), together with the results from MAGMA (FIG. 6b). As expected, the majority of short ranges NOEs were observed, while in general few NOEs were observed corresponding to distances greater than ~10 Å.

The number of confident assignments obtained varied with the details of the specific experimental dataset, but coarsely scaled with the number of NOEs in the dataset. On average over the whole benchmark, five methyl-methyl NOEs were needed for each confident assignment (FIG. 7a). Most notably, one of the larger proteins under study, the α7α7 proteasome double-ring resulted in 95% confidently assigned methyls. The exceptional performance on the α7α7 proteasome could be attributed to the quality of the NMR data, which yielded low sparsity (80%) and high local graph connectivity (with graph vertex degrees ~6 on average). The NOE data resulted in a single graph with only three methyls without any methyl-methyl NOEs for which therefore the assignment could not be obtained. Overall, the number of assignments obtained depended on the shape and size of the problem under consideration, in addition to the quality of experimental data.

An interesting case is the comparison of the isolated r2ATCase dimer (34 kDa) and the r2ATCase dimer in the context of the holoenzyme. The former was produced as it could be assigned using traditional backbone experiments. Fewer NOE peaks were observed in spectra from the dimer over the holoenzyme. Moreover, crystal structures of the holoenzyme exist, whereas to make progress with the dimer, the structure has to be assumed to be equivalent. The known assignment predicts some unexpected very long range NOEs in the isolated dimer, which might suggest that the structure of the dimer is not the same. Remarkably, 16 confident assignments were obtained from the holoenzyme despite sparser NOE data (FIG. 6 $a$, $b$ $ii$), $iii$)).

Another interesting case was EIN. The assignment strategy based primarily on PRE data, with the NOE data being used only for cross validation used this protein as benchmark. Here, it was shown that 35% of the methyl assignments can be obtained using NOE data alone.

In general, MAGMA will provide more confident assignments when there are more NOEs, and the reference structure is the closest possible match with what is present in solution.

TABLE 1

Methyl-methyl NOE benchmark data

|  | $M_w$ (kDa) | PDB code | Labelling scheme | Methyl groups | Methyl containing residues | Data type | Total inter-methyl | Data Subgraphs | Assignable resonances (i) |
|---|---|---|---|---|---|---|---|---|---|
| Ubiquitin | 8.6 | 1ubq | I, L, V | 33 | 20 | NOE | 25 | 3 | 18 |
| Ubiquitin | 8.6 | 1ubq | L, V | 26 | 13 | DREAM | 18 | 1 | 10 |
| MsrB | 16.6 | 3e0o | I, L, V | 39 | 22 | NOE | 37 | 2 | 21 |
| EIN | 27 | 1eza | I, L, V, A | 146 | 100 | NOE | 145 | 6 | 84 |
| ATCase $R_2$ | 30 | 1d09 | I, L, V | 66 | 39 | NOE | 91 | 1 | 34 |
| MBP | 43.4 | 1ez9 | I, L, V | 123 | 73 | NOE | 144 | 4 | 70 |
| MSG | 81.4 | 1y8b | I, L, V | 274 | 159 | NOE | 230 | 12 | 141 |
| $\alpha_7\alpha_7$ | 360 | 1yau | I, L, V | 96 | 56 | NOE | 154 | 1 | 53 |

|  | Mean vertex degree (ii) | Distance threshold (Å) (iii) | Sparsity (iv) | Confident assignments (v) | Assigned fraction (vi) | Time to converge (s) (vii) | Total time (s) (viii) |
|---|---|---|---|---|---|---|---|
| Ubiquitin | 2.89 | 6.5 | 0.56 | 16 | 0.80 | $2 \times 10^{-2}$ | $2 \times 10^{-2}$ |
| Ubiquitin | 3.6 | 7.5 | 0.78 | 10 | 0.77 | $2 \times 10^{-2}$ | $2 \times 10^{-2}$ |
| MsrB | 3.52 | 10 | 0.62 | 17 | 0.77 | $4 \times 10^{-3}$ | $4 \times 10^{-3}$ |
| EIN | 3.45 | 10 | 0.37 | 39 | 0.35 | $4 \times 10^{3}$ | $5 \times 10^{3}$ |
| ATCase $R_2$ | 5.35 | 10 | 0.58 | 12 | 0.31 | $7 \times 10^{4}$ | $2 \times 10^{5}$ |
| MBP | 4.11 | 10 | 0.56 | 47 | 0.64 | $7 \times 10^{4}$ | $2 \times 10^{5}$ |
| MSG | 3.26 | 10 | 0.47 | 60 | 0.38 | $7 \times 10^{4}$ | $4 \times 10^{6}$ |
| $\alpha_7\alpha_7$ | 5.81 | 10 | 0.80 | 52 | 0.93 | $2 \times 10^{5}$ | — |

EXAMPLE 8: PERFORMANCE COMPARISON

The performance of MAGMA was compared to that of the two alternative automatic methyl assignment programs (FLAMEnGO2.0 and MAP-XSII) on the protein benchmark described in Example 6 (FIG. 7a). In the case of MAGMA, residue type and NOESY data were used as restraints, all of which are available from data on differentially labelled samples. On average, MAGMA provided more confident assignments than alternative programs but most crucially, confident assignments identified by MAGMA were always correct, which was not generally the case for the other two methods. In the case where MAGMA identified an ambiguous assignment, the experimentally determined answer was sampled as one of the possibilities.

EXAMPLE 9: USE OF MAGMA IN STRUCTURE DETERMINATION

The ATCase R2 dimer is known to exist in "R" and "T" conformations. MSG adopts a different structure when bound to certain ligands. When the different structures were provided as input for MAGMA, different sets of confident assignments are returned (see FIG. 14). If the fold of the protein is not known, we recommend pooling the assignment results from all available structures, as shown in FIG. 14. In these two cases, a single point mutant in the location where two confident assignments differed was sufficient to distinguish between the two alternative structural forms. We determined ATCase R2 dimer to be in its "R" state and MSG to be in its "free" form. In these two instances, the structural assignment was also supported by the observed $^1H$-$^{13}C$ chemical shifts.

EXAMPLE 10: CHEMICAL SHIFT FILTERING

We assessed if chemical shift scoring could be used to reduce ambiguity in assignment solutions generated by MAGMA. Both SHIFTX2 and CH3Shift were used to predict methyl $^1H$ and $^{13}C$ chemical shifts from a structure, with each giving similar results in the final assignment. For each resonance where MAGMA returned an ambiguous assignment, we calculated a score as $S=|\delta_{calc}-\delta_{data}|/\sigma$ where $\delta$ gives the chemical shift and $\sigma$, the prediction accuracy of the specific chemical shift under consideration as defined by the relevant programs. A combined $^1H$-$^{13}C$ chemical shift score was obtained from the individual $^1H$ and $^{13}C$ scores from $(S_H^2+S_C^2)^{1/2}$. In the case where two stereospecific methyl groups are possible, chemical shift differences that correspond to all 4 possible combinations of stereo-specific assignment were computed, and the lowest score was taken as being most likely to be correct.

The score S was calculated for each possibility of an ambiguous assignment. A new assignment was considered 'confident' if exactly one of the options had a score that was less than or equal to 1. Otherwise, the restraint was not applied (FIG. 13). Even with this conservative application of chemical shift information, new confident assignments resulted in a roughly equal probability of correct and incorrect assignments. This is likely due to a combination of challenges associated with calculating methyl chemical shifts, and variations between methyl orientations and their dynamics in solution and in crystallographic forms. Other than identifying residue types, and perhaps protons that are in immediate proximity to aromatic rings, we recommend caution when using methyl chemical shifts for assignment purposes.

EXAMPLE 11: USING MAGMA FOR LIGAND STRUCTURE DETERMINATION

In addition to using protein-protein distance restraints, NOEs from ligands can be included with the calculation. By providing MAGMA with different ligand/protein complexes, it becomes possible to determine where the ligand is bound. The example shown is Hsp90. Without ligand, the protein adopts a 'closed' conformation. With ligand, the protein adopts an 'open' conformation, and the binding site of the ligand is determined.

What is claimed is:

1. A method for processing nuclear magnetic resonance (NMR) spectroscopic data to assign resonance peaks in an NMR spectrum of a molecule to atomic nuclei in said molecule, comprising:
   (i) obtaining from a source a nuclear magnetic resonance dataset $D_1$ comprising a first set of data points ij representing resonance peaks arising from heteronuclear J-couplings between nuclei i and nuclei j, and a second set of data points jj representing through-space proximity correlations between individual nuclei j associated with the first set of data points ij;
   (ii) obtaining from a source a molecular structure dataset $D_2$ comprising data points representing a three-dimensional spatial arrangement of atoms in the molecule;
   (iii) defining a magnetic resonance data graph $G_1=(V_1, E_1)$ and a structure graph $G_2=(V_2, E_2)$ wherein:
   the set of vertices $V_1$ of $G_1$ comprises individual vertices $V_1^{ij}$ such that each individual vertex $V_1^{ij}$ represents an individual data point ij selected from the first set of data points;
   the set of edges $E_1$ of $G_1$ comprises individual edges $E_1^{ij}$ such that each individual edge $E_1^{ij}$ represents a data point jj selected from the second set of data points and wherein each individual edge $E_1^{ij}$ connects two individual vertices $V_1^{ij}$ if nuclei j associated with the data points represented by those two vertices interact via a through-space proximity correlation;
   the set of vertices $V_2$ of $G_2$ comprises individual vertices $V_2^i$ such that each individual vertex $V_2^i$ represents an atom in the molecular structure represented by dataset $D_2$, said atom having a nucleus i and said being bound to at least one atom having a nucleus j;
   the set of edges $E_2$ of $G_2$ comprises individual edges $E_2^{ii}$ such that each individual edge $E_2^{ii}$ connects two individual vertices $V_2^i$ to one another if the atoms represented by said vertices are within a predetermined distance r relative to one another in the molecular structure represented by dataset $D_2$;
   (iv) comparing $G_1$ and $G_2$ to identify at least one maximal common edge subgraph (MCES);
   (v) generating all possible mappings of edges $E_1^{ij}$ to edges $E_2^{ii}$ and of vertices $V_1^{ij}$ to vertices $V_2^i$ which are consistent with said at least one MCES;
   (vi) for each possible mapping of a vertex $V_1^{ij}$ to a vertex $V_2^i$ obtained in step (v), generating a peak assignment, wherein generating said peak assignment comprises attributing a resonance represented by said vertex $V_1^{ij}$ to an atom having a nucleus i which is represented by said vertex $V_2^i$; and
   (vii) generating an output comprising all possible assignments from step (vi) of resonance peaks in the NMR spectrum to atomic nuclei in the molecule.

2. A method according to claim 1, wherein the through-space proximity correlations are nuclear Overhauser effect (NOE) interactions.

3. A method according to claim 1, wherein the magnetic resonance data graph $G_1$ is a graph $G_1=(V_1, E_1, \alpha_1)$ and wherein the structure graph $G_2$ is a graph $G_2=(V_2, E_2, \alpha_2)$, wherein al is a labelling function which labels the vertices $V_1$ and $\alpha_2$ is a labelling function which labels the vertices $V_2$.

4. A method according to claim 1, wherein nuclei i and j are independently selected from among $^{13}C$, $^1H$ and $^{15}N$, with the proviso that nuclei i and nuclei j are different types of nucleus to one another.

5. A method according to claim 1 wherein nuclei i are $^{13}C$ nuclei and nuclei j are $^1H$ nuclei.

6. A method according to claim 1 wherein nuclei i are $^{13}C$ nuclei and nuclei j are $^1H$ nuclei and further wherein said nuclei j are each individually bound to a nucleus i.

7. A method according to claim 6 wherein nuclei i and j are nuclei in $^{13}C$-labelled methyl groups.

8. A method according to claim 7 wherein said $^{13}C$-labelled methyl groups are $^{13}C$-labelled isoleucine δ, valine γ and/or leucine δ methyl groups.

9. A method according to claim 1 wherein datapoints ij represent 2D $^{13}C$-$^1H$ heteronuclear multiple quantum coherence (HMQC) resonance peaks.

10. A method according to claim 1 wherein datapoints jj represent $^1H$-$^1H$ nuclear Overhauser effect interactions.

11. A method according to claim 1 wherein datapoints ij individually represent 2D $^{13}C$-$^1H$ heteronuclear multiple quantum coherence (HMQC) resonance peaks arising from separate $^{13}C$-labelled methyl groups and datapoints jj represent $^1H$-$^1H$ nuclear Overhauser effect interactions between $^1H$ nuclei associated with said separate $^{13}C$-labelled methyl groups.

12. A method according to claim 1 wherein said NMR spectrum is a methyl-transversed relation optimized spectroscopy (TROSY) spectrum.

13. A method according to claim 1 wherein datapoints ij represent resonance peaks arising from 2D $^{13}C$-$^1H$ heteronuclear multiple quantum coherence (HMQC) interactions between $^{13}C$ and $^1H$ nuclei in individual $^{13}C$-labelled methyl groups of alanine, valine, leucine and/or isoleucine residues in a biomolecule, and datapoints jj represent homonuclear nuclear Overhauser effects (NOE) interactions between $^1H$ nuclei in separate such $^{13}$-labelled alanine, valine, leucine and/or isoleucine residues.

14. A method according to claim 1 wherein the molecule represented by $D_2$ is a protein or enzyme.

15. A method according to claim 1 wherein $D_2$ is derived from a crystal structure.

16. A method according to claim 15 wherein said crystal structure is a crystal structure available in the Protein Databank (PDB).

17. A method according to claim 1 wherein $D_2$ is derived from homology modelling.

18. A method according to claim 1 wherein, prior to step (iii), $D_1$ is filtered.

19. A method according to claim 1 wherein, in step (iii), r is 5-20 Å.

20. A method according to claim 1 wherein, following step (iii) and prior to step (iv), $G_1$ is decomposed into non-intersecting connected subgraphs.

21. A method according to claim 1 wherein step (iv) comprises determining an optimal matching order of the vertices of G1 to G2 and/or an optimal order of traversal of vertices of G1.

22. A method according to claim 1 wherein step (iv) is repeated as often as necessary to generate all possible mappings of G1 to G2 consistent with subgraph isomorphism and/or MCES.

23. A method according to claim 1 wherein the output of step (vii) is displayed on an electronic display screen.

24. A non-transitory computer readable storage medium storing computer software code which when executing on a data processing system performs a method as claimed in claim 1.

25. A method according to claim 1 comprising, between steps (iii) and (iv), performing a step (iiiA) of comparing $G_1$ and $G_2$ to identify subgraph isomorphism from $G_1$ to $G_2$ and generating all possible mappings of edges $E_1^{ij}$ to edges $E_2^{ii}$ and of vertices $V_1^{ij}$ to vertices $V_2^i$ which are consistent with said subgraph isomorphism.

26. A method according to claim 25 wherein, following step (iii) and prior to step (iiiA), $G_1$ is decomposed into non-intersecting connected subgraphs.

27. A method according to claim 25 wherein step (iiiA) is performed using the VF2 algorithm.

28. A method according to claim 1 wherein nuclear magnetic resonance dataset $D_1$ is obtained by conducting an NMR experiment on a sample comprising a molecule of interest and the dataset $D_1$ thus generated is in the form of an NMR spectrum of the molecule of interest.

29. A method according to claim 1 wherein steps (iii)-(vii) are performed by executing code in a computer.

30. A method of processing nuclear magnetic resonance (NMR) spectroscopic data, wherein a molecule of interest is subject to NMR and a nuclear magnetic resonance dataset $D_1$ is obtained in the form of an NMR spectrum of the molecule of interest, to assign resonance peaks in the NMR spectrum of the molecule of interest to atomic nuclei in said molecule of interest, comprising:

(i) obtaining said nuclear magnetic resonance dataset $D_1$ comprising a first set of data points ij representing resonance peaks arising from heteronuclear J-couplings between nuclei i and nuclei j, and a second set of data points jj representing through-space proximity correlations between individual nuclei j associated with the first set of data points ij;

(ii) obtaining a molecular structure dataset $D_2$ comprising data points representing a three-dimensional spatial arrangement of atoms in the molecule;

(iii) defining a magnetic resonance data graph $G_1=(V_1, E_1)$ and a structure graph $G_2=(V_2, E_2)$ wherein:
the set of vertices $V_1$ of $G_1$ comprises individual vertices $V_1^{ij}$ such that each individual vertex $V_1^{ij}$ represents an individual data point ij selected from the first set of data points;
the set of edges $E_1$ of $G_1$ comprises individual edges $E_1^{jj}$ such that each individual edge $E_1^{jj}$ represents a data point jj selected from the second set of data points and wherein each individual edge $E_1^{jj}$ connects two individual vertices $V_1^{ij}$ if nuclei j associated with the data points represented by those two vertices interact via a through-space proximity correlation;
the set of vertices $V_2$ of $G_2$ comprises individual vertices $V_2^i$ such that each individual vertex $V_2^i$ represents an atom in the molecular structure represented by dataset $D_2$, said atom having a nucleus i and said being bound to at least one atom having a nucleus j;
the set of edges $E_2$ of $G_2$ comprises individual edges $E_2^{ii}$ such that each individual edge $E_2^{ii}$ connects two individual vertices $V_2^i$ to one another if the atoms represented by said vertices are within a predetermined distance r relative to one another in the molecular structure represented by dataset $D_2$;

(iv) optionally comparing $G_1$ and $G_2$ to identify subgraph isomorphism from $G_1$ to $G_2$ and generating all possible mappings of edges $E_1^{jj}$ to edges $E_2^{ii}$ and of vertices $V_1^{ij}$ to vertices $V_2^i$ which are consistent with said subgraph isomorphism;

(v) comparing $G_1$ and $G_2$ to identify at least one maximal common edge subgraph (MCES);

(vi) generating all possible mappings of edges $E_1^{jj}$ to edges $E_2^{ii}$ and of vertices $V_1^{ij}$ to vertices $V_2^i$ which are consistent with said at least one MCES;

(vii) for each possible mapping of a vertex $V_1^{ij}$ to a vertex $V_2^i$ obtained in steps (iv) and (vi), generating a peak assignment, wherein generating said peak assignment comprises attributing a resonance represented by said vertex $V_1^{ij}$ to an atom having a nucleus i which is represented by said vertex $V_2^i$;

(viii) generating an output comprising all possible assignments from step (vii) of resonance peaks in the NMR spectrum to atomic nuclei in the molecule.

31. A non-transitory computer program product embodied on a computer readable storage medium for processing nuclear magnetic resonance (NMR) spectroscopic data of a molecule to assign resonance peaks in said NMR spectroscopic data to atomic nuclei in said molecule, said computer program product comprising:

(i) computer code for defining a magnetic resonance data graph $G_1=(V_1, E_1)$ from a nuclear magnetic resonance dataset $D_1$, wherein nuclear magnetic resonance dataset $D_1$ comprises a first set of data points ij representing resonance peaks arising from heteronuclear J-couplings between nuclei i and nuclei j in said molecule, and a second set of data points jj representing through-space proximity correlations between individual nuclei j in said molecule associated with the first set of data points ij, and wherein the set of vertices $V_1$ of $G_1$ comprises individual vertices $V_1^{ij}$ such that each individual vertex $V_1^{ij}$ represents an individual data point ij selected from the first set of data points; and wherein the set of edges $E_1$ of $G_1$ comprises individual edges $E_1^{jj}$ such that each individual edge $E_1^{jj}$ represents a data point jj selected from the second set of data points and wherein each individual edge $E_1^{jj}$ connects two individual vertices $V_1^{ij}$ if nuclei j associated with the data points represented by those two vertices interact via a through-space proximity correlation;

(ii) computer code for defining a structure graph $G_2=(V_2, E_2)$ from a molecular structure dataset $D_2$, wherein molecular structure dataset $D_2$ comprises data points representing a three-dimensional spatial arrangement of atoms in said molecule, and wherein the set of vertices $V_2$ of $G_2$ comprises individual vertices $V_2^i$ such that each individual vertex $V_2^i$ represents an atom in the molecular structure represented by dataset $D_2$, said atom having a nucleus i and said being bound to at least one atom having a nucleus j; and wherein the set of edges $E_2$ of $G_2$ comprises individual edges $E_2^{ii}$ such that each individual edge $E_2^{ii}$ connects two individual vertices $V_2^i$ to one another if the atoms represented by said vertices are within a predetermined distance r relative to one another in the molecular structure represented by dataset $D_2$;

(iii) optionally, computer code for comparing $G_1$ and $G_2$ to identify subgraph isomorphism from $G_1$ to $G_2$ and generating all possible mappings of edges $E_1^{jj}$ to edges $E_2^{ii}$ and of vertices $V_1^{ij}$ to vertices $V_2^i$ which are consistent with said subgraph isomorphism;

(iv) computer code for comparing $G_1$ and $G_2$ to identify at least one maximal common edge subgraph (MCES);

(v) computer code for generating all possible mappings of edges $E_1^{jj}$ to edges $E_2^{ii}$ and of vertices $V_1^{ij}$ to vertices $V_2^i$ which are consistent with said at least one MCES;

(vi) computer code for generating a peak assignment for each possible mapping of a vertex $V_1^{ij}$ to a vertex $V_2^i$ obtained in steps (iv) and (vi), wherein generating said peak assignment comprises attributing a resonance represented by said vertex $V_1^{ij}$ to an atom having a nucleus i which is represented by said vertex $V_2^i$;

(vii) computer code for generating an output comprising all possible peak assignments of resonance peaks in the NMR spectrum to atomic nuclei in the molecule.

\* \* \* \* \*